(12) United States Patent
Kamimura

(10) Patent No.: US 10,942,455 B2
(45) Date of Patent: Mar. 9, 2021

(54) MANUFACTURING METHOD OF SEMICONDUCTOR CHIP, AND KIT

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/370,279

(22) Filed: Mar. 29, 2019

(65) Prior Publication Data

US 2019/0227440 A1 Jul. 25, 2019

Related U.S. Application Data

(63) Continuation of application No. PCT/JP2017/035438, filed on Sep. 29, 2017.

(30) Foreign Application Priority Data

Sep. 30, 2016 (JP) .............................. JP2016-193257

(51) Int. Cl.
*H01L 21/00* (2006.01)
*G03F 7/32* (2006.01)
(Continued)

(52) U.S. Cl.
CPC .............. *G03F 7/327* (2013.01); *B24B 37/00* (2013.01); *G03F 7/038* (2013.01); *G03F 7/039* (2013.01);
(Continued)

(58) Field of Classification Search
None
See application file for complete search history.

(56) References Cited

U.S. PATENT DOCUMENTS 6,114,235 A * 9/2000 Foote .................. H01L 21/0276
                                                438/636
6,147,010 A * 11/2000 Whitman .............. H01L 21/312
                                                438/782
(Continued)

FOREIGN PATENT DOCUMENTS

JP    2000-150519 A    5/2000
JP    2001-144003 A    5/2001
(Continued)

OTHER PUBLICATIONS

International Search Report dated Jan. 9, 2018 from the International Searching Authority in counterpart International Application No. PCT/JP2017/035438.
(Continued)

*Primary Examiner* — Reema Patel
(74) *Attorney, Agent, or Firm* — Sughrue Mion, PLLC

(57) ABSTRACT

The present invention provides a manufacturing method of a semiconductor chip, in which the manufacturing yield is excellent, and a kit. According to the present invention, a manufacturing method of a semiconductor chip includes Process 1 of forming an insulating layer on a base material, Process 2 of forming a patterned resist film on the insulating layer, Process 3 of forming the insulating layer having an opening portion by etching the insulating layer with the patterned resist film as a mask, Process 4 of removing the patterned resist film, Process 5 of filling the opening portion of the insulating layer with metal, and Process 6 of performing chemical-mechanical polishing on the insulating layer filled with metal. In at least one process of Process 1 to Process 6, a chemical liquid which includes an organic solvent and metal impurities including at least one metal atom selected from the group consisting of a Fe atom, a Cr
(Continued)

atom, a Ni atom, and a Pb atom, and in which the total content of the metal atom is 0.001 to 100 mass ppt is used.

23 Claims, 4 Drawing Sheets

(51) Int. Cl.
| | |
|---|---|
| H01L 21/027 | (2006.01) |
| G03F 7/20 | (2006.01) |
| G03F 7/038 | (2006.01) |
| G03F 7/039 | (2006.01) |
| H01L 21/768 | (2006.01) |
| H01L 21/311 | (2006.01) |
| H01L 21/32 | (2006.01) |
| H01L 21/321 | (2006.01) |
| G03F 7/16 | (2006.01) |
| H01L 21/3205 | (2006.01) |
| G03F 7/075 | (2006.01) |
| H01L 21/28 | (2006.01) |
| G03F 7/40 | (2006.01) |
| B24B 37/00 | (2012.01) |
| H01L 21/304 | (2006.01) |
| H01L 21/3065 | (2006.01) |

(52) U.S. Cl.
CPC .......... *G03F 7/0392* (2013.01); *G03F 7/0397* (2013.01); *G03F 7/0752* (2013.01); *G03F 7/0758* (2013.01); *G03F 7/16* (2013.01); *G03F 7/167* (2013.01); *G03F 7/2004* (2013.01); *G03F 7/2006* (2013.01); *G03F 7/325* (2013.01); *G03F 7/40* (2013.01); *H01L 21/027* (2013.01); *H01L 21/0274* (2013.01); *H01L 21/28* (2013.01); *H01L 21/304* (2013.01); *H01L 21/3065* (2013.01); *H01L 21/31116* (2013.01); *H01L 21/32* (2013.01); *H01L 21/321* (2013.01); *H01L 21/3205* (2013.01); *H01L 21/3212* (2013.01); *H01L 21/768* (2013.01); *H01L 21/7684* (2013.01); *H01L 21/76802* (2013.01); *H01L 21/76829* (2013.01); *H01L 21/76843* (2013.01); *H01L 21/76877* (2013.01)

(56) References Cited

U.S. PATENT DOCUMENTS

| | | | |
|---|---|---|---|
| 6,819,396 | B1 | 11/2004 | Tanabe et al. |
| 7,078,351 | B2* | 7/2006 | Chiu .................. H01L 21/0276 |
| | | | 438/736 |
| 2002/0001941 | A1 | 1/2002 | Kudo |
| 2004/0157444 | A1 | 8/2004 | Chiu et al. |
| 2004/0266130 | A1* | 12/2004 | Wang ...................... C25F 3/02 |
| | | | 438/424 |
| 2007/0059919 | A1* | 3/2007 | Ooka ................ H01L 21/76831 |
| | | | 438/618 |
| 2010/0126934 | A1 | 5/2010 | Nakazato et al. |
| 2012/0058642 | A1* | 3/2012 | White ..................... C09G 1/02 |
| | | | 438/693 |
| 2012/0208125 | A1* | 8/2012 | Hatakeyama ......... G03F 7/0043 |
| | | | 430/281.1 |
| 2013/0052824 | A1 | 2/2013 | Hagiwara |
| 2014/0342566 | A1 | 11/2014 | Hagiwara |
| 2015/0021779 | A1* | 1/2015 | Liou ................. H01L 21/76883 |
| | | | 257/773 |
| 2017/0059995 | A1 | 3/2017 | Furutani et al. |

FOREIGN PATENT DOCUMENTS

| | | |
|---|---|---|
| JP | 2005-74415 A | 3/2005 |
| JP | 2007-243120 A | 9/2007 |
| JP | 2008-208048 A | 9/2008 |
| JP | 2009-182225 A | 8/2009 |
| JP | 2010-219466 A | 9/2010 |
| JP | 2012-009513 A | 1/2012 |
| JP | 2013-046005 A | 3/2013 |
| TW | 200900379 A | 1/2009 |
| TW | 201546558 A | 12/2015 |
| WO | 2015190174 A1 | 12/2015 |

OTHER PUBLICATIONS

Written Opinion dated Jan. 9, 2018 from the International Bureau in counterpart International Application No. PCT/JP2017/035438.
International Preliminary Report on Patentability dated Apr. 2, 2019 from the International Bureau in counterpart International Application No. PCT/JP2017/035438.
Communication dated Apr. 14, 2020, from the Japanese Patent Office in Application No. 2018-542914.
Office Action dated Jul. 30, 2020, from the Korean Intellectual Property Office in Korean application No. 10-2019-7008180.
Office Action dated Nov. 30, 2020 in Taiwanese Application No. 106133589.

* cited by examiner

MANUFACTURING METHOD OF SEMICONDUCTOR CHIP, AND KIT

CROSS-REFERENCE TO RELATED APPLICATIONS

This application is a Continuation of PCT International Application No. PCT/JP2017/035438 filed on Sep. 29, 2017, which claims priority under 35 U.S.C. § 119(a) to Japanese Patent Application No. 2016-193257 filed on Sep. 30, 2016. Each of the above applications is hereby expressly incorporated by reference, in its entirety, into the present application.

BACKGROUND OF THE INVENTION

1. Field of the Invention

The present invention relates to a manufacturing method of a semiconductor chip, and a kit.

2. Description of the Related Art

In a manufacturing process of a semiconductor chip, a procedure of forming a fine metal interconnection in an insulating layer is performed. Specifically, an opening portion is formed on an insulating layer by a predetermined etching treatment, and the formed opening portion is filled with metal. Then, a treatment in which the surface of the insulating layer filled with metal is flattened by performing chemical-mechanical polishing is performed (see JP2010-219466A). In the treatments, a procedure of using a predetermined chemical liquid, for example, a procedure of coating a base material with a pre-wet liquid before the base material is coated with a composition for forming a resist film is provided in many cases.

SUMMARY OF THE INVENTION

Recently, it is required that the metal interconnection is more thinned. For example, it is required that so-called a local interconnection which is provided in a semiconductor chip having a multilayer interconnection structure is more thinned.

The inventor produced a semiconductor chip having a metal interconnection which had been more thinned, by using a method in the related art as described in JP2010-219466A and examined manufacturing yield. As a result, the inventor confirmed a decrease of the manufacturing yield.

Thus, an object of the present invention is to provide a manufacturing method of a semiconductor chip, in which the manufacturing yield is excellent.

Another object of the present invention is to provide a kit which can be suitably applied to the manufacturing method of a semiconductor chip.

The inventors performed close examination in order to solve the above problem. As a result, the inventors found that it was possible to solve the above problem by adjusting the amount of impurities in a chemical liquid used in a manufacturing method of a semiconductor chip and completed the present invention.

That is, the inventors found that it was possible to achieve the above object by a configuration as follows.

(1) There is provided a manufacturing method of a semiconductor chip. The method includes Process 1 of forming an insulating layer on a base material, Process 2 of forming a patterned resist film on the insulating layer, Process 3 of forming the insulating layer having an opening portion by etching the insulating layer with the patterned resist film as a mask, Process 4 of removing the patterned resist film, Process 5 of filling the opening portion of the insulating layer with metal, and Process 6 of performing chemical-mechanical polishing on the insulating layer filled with metal.

In at least one process of Process 1 to Process 6, a chemical liquid which includes an organic solvent and metal impurities including at least one metal atom selected from the group consisting of a Fe atom, a Cr atom, a Ni atom, and a Pb atom, and in which the total content of the metal atom is 0.001 to 100 mass ppt is used.

(2) In the manufacturing method of a semiconductor chip in (1), the chemical liquid includes organic impurities, and the total content of the organic impurities in the chemical liquid is 0.1 to 5000 mass ppm with respect to the total mass of the chemical liquid.

(3) In the manufacturing method of a semiconductor chip in (1) or (2), the number of counting targets which are provided in the chemical liquid, have a size of 0.1 μm or greater, and are to be counted by a light scattering type in-liquid particle counter is equal to or smaller than 100 pieces/mL.

(4) In the manufacturing method of a semiconductor chip in any of (1) to (3), the chemical liquid includes water, and the content of the water in the chemical liquid is 0.01 to 1.0 mass % with respect to the total mass of the chemical liquid.

(5) In the manufacturing method of a semiconductor chip in any of (1) to (4), the organic solvent is selected from the group consisting of methanol, ethanol, I-propanol, isopropanol, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol.

(6) In the manufacturing method of a semiconductor chip in any of (1) to (5), Process 2 includes Process 2-1 of coating the insulating layer with a pre-wet liquid, Process 2-2 of forming a coated film by applying a composition for forming a resist film onto the insulating layer coated with the pre-wet liquid, Process 2-3 of forming the patterned resist film by exposing the coated film in a pattern shape and performing a developing treatment with using a developer.

The chemical liquid is used as at least one of the pre-wet liquid or the developer.

(7) In the manufacturing method of a semiconductor chip in any of (1) to (5), Process 2 includes Process 2-1 of coating the insulating layer with a pre-wet liquid, Process 2-2 of forming a coated film by applying a composition for forming a resist film onto the insulating layer coated with the pre-wet liquid, Process 2-3 of forming the patterned resist film by exposing the coated film in a pattern shape and performing a developing treatment with a developer, and Process 2-4 of washing the patterned resist film by using a rinse liquid after Process 2-3.

The chemical liquid is used as the rinse liquid.

(8) In the manufacturing method of a semiconductor chip in (6) or (7), the exposing is performed by EUV light.

(9) In the manufacturing method of a semiconductor chip in any of (1) to (5), the patterned resist film is a metal hard mask.

(10) In the manufacturing method of a semiconductor chip in any of (1) to (9), in Process 1, the insulating layer including a silicon atom is formed by using a physical vapor deposition method, a chemical vapor deposition method, or a spin coating method.

(11) In the manufacturing method of a semiconductor chip in any of (1) to (10), in Process 3, etching of the insulating layer is performed by plasma etching with an etching gas which includes a nitrogen gas and a halogen gas.

(12) In the manufacturing method of a semiconductor chip in any of (1) to (11), in Process 4, the patterned resist film is removed by a treatment with a treatment liquid which includes an alkaline component and an organic solvent, or by oxygen ashing.

(13) In the manufacturing method of a semiconductor chip in any of (1) to (12), in Process 4, a treatment of removing impurities which have been generated by etching performed in Process 3 is performed.

(14) In the manufacturing method of a semiconductor chip in (13), the treatment of removing impurities is performed with a washing treatment with a treatment liquid including a hydroxylamine compound.

(15) In the manufacturing method of a semiconductor chip in any of (1) to (14), in Process 5, the opening portion of the insulating layer is filled with metal by any of a physical vapor deposition method, a chemical vapor deposition method, or a plating method.

(16) In the manufacturing method of a semiconductor chip in any of (1) to (15), in Process 5, the metal is Cu, Al, Co, W, Ta, TaN, Ti, TiN, Ru, Mn, or an alloy thereof.

(17) In the manufacturing method of a semiconductor chip in (16), Process 5 includes Process 5-1 of filling the opening portion of the insulating layer with first metal selected from the group consisting of Ta, TaN, Ti, TiN, Ru, Mn, and an alloy thereof, and Process 5-2 of further filling the opening portion which has been filled with the first metal, with second metal selected from the group consisting of Cu, Al, Co, W, and an alloy thereof.

(18) In the manufacturing method of a semiconductor chip in (17), Process 6 includes Process 6-1 of performing the chemical-mechanical polishing by using a polishing liquid which includes amino acid.

(19) In the manufacturing method of a semiconductor chip in (17) or (18), Process 6 includes Process 6-2 of performing the chemical-mechanical polishing with a polishing liquid which includes organic acid and exhibits alkalinity.

(20) The manufacturing method of a semiconductor chip in any of (1) to (19) further includes a process of performing a washing treatment on the insulating layer subjected to the chemical-mechanical polishing, by using a washing liquid which includes polyvalent carboxylic acid, after Process 6.

(21) The manufacturing method of a semiconductor chip in any of (1) to (20) further includes a process of forming an etching stopper layer on the base material before Process 1.

(22) In the manufacturing method of a semiconductor chip in any of (1) to (21), all or some of Process 1 to Process 6 are repeated again after Process 1 to Process 6 are performed.

(23) In the manufacturing method of a semiconductor chip in (2), the organic impurity is one kind or more selected from the group consisting of dioctyl phthalate, diisononyl phthalate, dioctyl adipate, dibutyl phthalate, ethylene rubber, ethylene propylene rubber, and an addition polymer of 5-ethylidene-2-norbornene.

(24) A kit includes two or more selected from the group consisting of a pre-wet liquid, a developer, a rinse liquid, a polishing liquid, and a composition for forming a resist film.

All of the pre-wet liquid, the developer, the rinse liquid, the polishing liquid, or the composition for forming a resist film include a chemical liquid X which includes an organic solvent and metal impurities including at least one metal atom selected from the group consisting of a Fe atom, a Cr atom, a Ni atom, and a Pb atom and in which the total content of the metal atom is 0.001 to 100 mass ppt.

According to the present invention, it is possible to provide a manufacturing method of a semiconductor chip, in which manufacturing yield is excellent.

According to the present invention, it is possible to provide a kit which can be suitably applied to the manufacturing method of a semiconductor chip.

DESCRIPTION OF THE PREFERRED EMBODIMENTS

Figure 1:
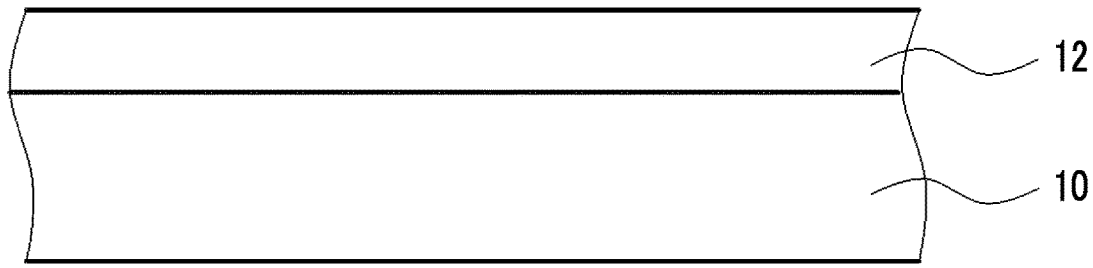
FIG. 1 is a sectional view illustrating a stacked body obtained by Process 1.

Hereinafter, the embodiment of the invention will be described in detail.

Although descriptions of configuration requirements, which will be made below, are based on the representative embodiment of the present invention, the invention is not limited to such an embodiment.

In this specification, a numerical range indicated by using a term of "to" means a range which includes numerical values described before and after the term of "to", as a lower limit value and an upper limit value.

In the embodiment of the invention, a term of "preparation" means a case where a specific material is comprised by, for example, synthesis or mixing and a case where a predetermined matter is secured by, for example, purchase.

In the embodiment of the invention, "ppm" means "parts-per-million (10-6)", and "ppt" means "parts-per-trillion (10-12)".

In the present invention, 1 Å (angstrom) corresponds to 0.1 nm.

Regarding a mark of a group (atom group) in the present invention, a mark which does not indicate substitution or non-substitution includes a case where the group does not have a substituent and a case where the group has a substituent, in a range without impairing the advantage of the present invention. For example, "a hydrocarbon group" includes a hydrocarbon group (substituted hydrocarbon group) having a substituent, in addition to a hydrocarbon group (unsubstituted hydrocarbon group) which does not have a substituent. This is similarly applied to each compound.

In the present invention, light means actinic light or radiation. In the present invention, "exposure" includes drawing with a particle beam such as an electron beam or an ion beam, in addition to exposure by a mercury lamp, a far ultraviolet ray, an X-ray, an extreme ultraviolet (EUV) ray, or the like, so long as particular statements are not made.

A manufacturing method of a semiconductor chip according to the present invention includes predetermined processes, and a predetermined chemical liquid is used in at least one process.

The inventors know that a desired advantage is not obtained in a case where a semiconductor chip is manufactured by a method in the related art, because many metal impurities are provided in a chemical liquid to be used. On the contrary, the inventor knows the followings in the present invention. That is, since concentration of a metal atom of a predetermined type, which is derived from metal impurities in a chemical liquid is adjusted to be in a predetermined range, a desired advantage is obtained.

In the following descriptions, firstly, a chemical liquid to be used in the present invention will be described in detail. Then, procedures of each process will be described in detail.

<Chemical Liquid>

A chemical liquid includes an organic solvent and metal impurities including at least one metal atom selected from the group consisting of a Fe atom, a Cr atom, a Ni atom, and a Pb atom. In the chemical liquid, the total content of the predetermined metal atom is 0.001 to 100 mass ppt.

(Organic Solvent)

The chemical liquid includes an organic solvent.

The type of the organic solvent is not particularly limited, but well-known organic solvents can be used.

The content of the organic solvent in the chemical liquid is not particularly limited, but the organic solvent is preferably included as the main component. Specifically, the content of the organic solvent is preferably equal to or greater than 98 mass %, more preferably equal to or greater than 99 mass %, further preferably equal to or greater than 99.5 mass %, and particularly preferably equal to or greater than 99.8 mass %, with respect to the total mass of the chemical liquid. The upper limit value thereof is not particularly limited, but it is general that the upper limit value thereof is preferably equal to or smaller than 99.99 mass %.

The organic solvent may be singly used or may be used in combination of two kinds or more thereof. In a case where a combination of two kinds or more of organic solvents is used, it is preferable that the total content thereof is in the above range.

The content of the organic solvent in the chemical liquid can be measured by using a gas chromatography mass spectrometry (GCMS) device. Measurement conditions and the like are as described in examples which will be described later.

The boiling point of the organic solvent is not particularly limited. However, the boiling point of the organic solvent is preferably lower than 200° C. from a point of improving manufacturing yield of a semiconductor chip (simply also described as "a point of improving the advantage of the present invention" below).

In this specification, the boiling point means a boiling point at 1 atm.

The organic solvent is not particularly limited. Examples of the organic solvent include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methylcyclohexanol, trimethylcyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2,2-trifluoroethyl ether, ethyl vinyl ether, butyl vinyl ether, allyl ethyl ether, allyl propyl ether, allyl butyl ether, diallyl ether, 2-methoxypropene, ethyl-1-propenyl ether, cis-1-bromo-2-ethoxyethylene, 2-chloroethyl vinyl ether, allyl-1,1,2,2-tetrafluoroethyl ether, octane, isooctane, nonane, decane, methylcyclohexane, decalin, xylene, ethylbenzene, diethylbenzene, cumene, second-butylbenzene, cymene, dipentene, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, γ-butyrolactone, isoamyl acetate, chloroform, dichloromethane, 1,4-dioxane, hexyl alcohol, 2-heptanone, isoamyl acetate, and tetrahydrofuran.

Among the above substances, from a point of improving the advantage of the present invention, at least one selected from the group consisting of methanol, ethanol, 1-propanol, isopropanol, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol is preferable as the organic solvent.

In a case where the chemical liquid includes two kinds or more of organic solvents, the combination of the organic solvents is not particularly limited. In a case where the chemical liquid includes two kinds or more of organic solvents, from a point of improving the advantage of the present invention, organic solvents which have, for example, different boiling points, different solubility parameters, and/or different relative dielectric constants are preferable.

In a case where the chemical liquid includes two kinds or more of organic solvents, a substance including two kinds or more of ethers is preferable as the organic solvent. The chemical liquid including two kinds or more of ethers has more excellent defect suppression performance.

The type of ethers is not particularly limited, and well-known ethers can be used. For example, two kinds or more of ethers selected from the group consisting of propylene glycol monomethyl ether acetate, propylene glycol monomethyl ether, diethylene glycol monomethyl ether, diethylene glycol monoethyl ether, and diethylene glycol monobutyl ether are preferable as the two kinds or more of ethers.

Among the above substances, it is preferable that the organic solvent includes propylene glycol monomethyl ether acetate and propylene glycol monomethyl ether.

In a case where the chemical liquid includes two kinds of organic solvent, a content mass ratio of the organic solvents in the chemical liquid is not particularly limited. Generally, the content mass ratio thereof is preferably 1/99 to 99/1, more preferably 10/90 to 90/10, and further preferably 20/80 to 60/40.

(Metal Impurities)

The chemical liquid includes metal impurities which include at least one metal atom (specific metal atom) selected from the group consisting of a Fe atom, a Cr atom, a Ni atom, and a Pb atom.

The inventors know that the specific metal atom easily adheres to various materials (for example, base material and insulating layer) and the metal impurities including the specific metal easily influences manufacturing yield of a semiconductor chip.

In this specification, the metal impurities mean metal ions and metal impurities provided in a chemical liquid in a form of a solid (metal simplex, particulate metal-containing compound, or the like).

In this specification, in the chemical liquid, the total content of metal atoms provided in the metal impurities is measured by inductively coupled plasma mass spectrometry (ICP-MS). A measuring method of the content of the metal atoms, which uses ICP-MS is as described in the examples which will be described later.

The content of metal particles thereof is measured by SP-ICP-MS in comparison to the above method. Thus, in a case where the content of metal particles is subtracted from the content of metal atoms in a sample, the content of metal ions in the sample can be calculated.

Examples of a measurement device of SP-ICP-MS include Agilent 8800 Triple Quadrupole ICP-MS (inductively coupled plasma mass spectrometry, used for analyzing a semiconductor, Opt #200) manufactured by Agilent Technologies. In addition, NexION350S manufactured by PerkinElmer Inc. and Agilent 8900 manufactured by Agilent Technologies are also exemplified.

The total content of at least one metal atom in the metal impurities in the chemical liquid and is selected from the group consisting of a Fe atom, a Cr atom, a Ni atom, and a Pb atom is 0.001 to 100 mass ppt, preferably 0.1 to 100 mass ppt, more preferably 1 to 90 mass ppt, further preferably 1 to 80 mass ppt, particularly preferably 1 to 50 mass ppt, and most preferably 1 to 40 mass ppt, with respect to the total mass of the chemical liquid.

In a case where the total content of the metal atom is smaller than 0.001 mass ppt, and in a case where the total content of the metal atom is greater than 100 mass ppt, the manufacturing yield of a semiconductor chip is decreased. The reason that the advantage is deteriorated in a case where the total content of the metal atom is smaller than 0.001 mass ppt is supposed as follows. Firstly, metal impurities including the above-described specific metal atom have properties of being easily aggregated. Thus, in a case where the content of the specific metal atom is too small, metal impurities including the specific metal atom are easily separated from each other. Therefore, it is considered that the number of formed defects which may influence manufacturing yield of a semiconductor chip is increased and the manufacturing yield is decreased. The reason that the effect is deteriorated in a case where the total content of the metal atom is greater than 100 mass ppt is supposed as follows. Many defects derived from the metal impurities are formed in the middle of a manufacturing process of a semiconductor chip, and, as a result, the manufacturing yield of a semiconductor chip is decreased.

The metal impurities may be singly used or may be used in combination of two kinds or more thereof. In a case where a combination of two kinds or more of metal impurities is used, the total content of metal atoms is preferably in the above range.

The content of each of the Fe atom, the Cr atom, the Ni atom, and the Pb atom in the chemical liquid is preferably in the following range.

Fe atom: 0.001 to 50 mass ppt (preferably 0.05 to 50 mass ppt, and more preferably 0.1 to 10 mass ppt)

Cr atom: 0.001 to 50 mass ppt (preferably 0.05 to 50 mass ppt, and more preferably 0.1 to 10 mass ppt)

Ni atom: 0.001 to 50 mass ppt (preferably 0.05 to 50 mass ppt, and more preferably 0.1 to 10 mass ppt)

Pb atom: 0.001 to 50 mass ppt (preferably 0.05 to 50 mass ppt, and more preferably 0.1 to 10 mass ppt)

Metal impurities which include other metal atoms in addition to at least one metal atom selected from the group consisting of the Fe atom, the Cr atom, the Ni atom, and the Pb atom may be included as the metal impurities.

The total content of metal atoms which includes the specific metal atom and other metal atoms in the chemical liquid is not particularly limited. From a point of improving the manufacturing yield of a semiconductor chip, the above total content is preferably 0.001 to 200 mass ppt, more preferably 0.1 to 200 mass ppt, further preferably 0.1 to 100 mass ppt, and particularly preferably 0.1 to 80 mass ppt.

The metal impurities may be added in the chemical liquid or may be inevitably mixed in the chemical liquid in a manufacturing process of the chemical liquid. Examples of a case of being inevitably mixed in the chemical liquid in a manufacturing process of the chemical liquid include a case where the metal impurities are provided in a raw material (for example, organic solvent) used in manufacturing the chemical liquid, and a case where the metal impurities are mixed in the manufacturing process of the chemical liquid (for example, contamination).

As will be described later, the content of the metal impurities (content of the metal atom) can be adjusted by using a filter and by a predetermined treatment.

(Additional Components)

The chemical liquid may include other components in a range in which the advantage of the present invention is exhibited, in addition to the above-described component. Examples of other components include organic impurities and water.

[Organic Impurities] The chemical liquid may include organic impurities.

In this specification, the organic impurities mean a compound which is different from the organic solvent as the main component provided in the chemical liquid, and mean an organic matter which is contained in the content of 5000 mass ppm or smaller with respect to the total mass of the chemical liquid. That is, in this specification, it is assumed that the organic matter which is contained in the content of 5000 mass ppm or smaller with respect to the total mass of the chemical liquid corresponds to the organic impurities and does not correspond to the organic solvent.

In a case where organic impurities configured by plural types of compounds are included in the chemical liquid, the compounds correspond to the organic impurities so long as each of the compounds corresponds to the organic matter which is described above and is contained in the content of 5000 mass ppm or smaller.

Water does not correspond to the organic impurities.

The organic impurities may be added in the chemical liquid or may be inevitably mixed in the chemical liquid in a manufacturing process of the chemical liquid. Examples of a case of being inevitably mixed in the chemical liquid in a manufacturing process of the chemical liquid include a case where the organic impurities are provided in a raw material (for example, organic solvent) used in manufacturing the chemical liquid, and a case where the organic impurities are mixed in the manufacturing process of the chemical liquid (for example, contamination). The example of the case is not limited thereto.

The total content of the organic impurities in the chemical liquid is not particularly limited. From a point of improving the manufacturing yield of a semiconductor chip, the total content of the organic impurities is preferably 0.1 to 5000 mass ppm, more preferably 1 to 2000 mass ppm, further preferably 1 to 1000 mass ppm, particularly preferably 1 to 500 mass ppm, and most preferably 1 to 100 mass ppm, with respect to the total mass of the chemical liquid.

The organic impurities may be singly used or may be used in combination of two kinds or more thereof. In a case where a combination of two kinds or more of organic impurities is used, it is preferable that the total content thereof is in the above range.

The content of the organic impurities in the chemical liquid can be measured by using a gas chromatography mass spectrometry (GCMS) device. Measurement conditions and the like are as described in the examples.

Examples of the organic impurities include an antioxidant such as dibutylhydroxytoluene (BHT), distearyl thiodipropionate (DSTP), 4,4'-butylidenebis-(6-t-butyl-3-methylphenol), 2,2'-methylenebis-(4-ethyl-6-t-butylphenol), and an antioxidant disclosed in JP2015-200775A; a unreacted raw material; a structural isomer and a by-product generated when the organic solvent is manufactured; and an eluate from members and the like constituting a manufacturing device of the organic solvent (for example, a plasticizer eluted from a rubber member such as an O-ring).

In addition, examples of the organic impurities include dioctyl phthalate (DOP), bis(2-ethylhexyl)phthalate (DEHP), bis(2-propylheptyl)phthalate (DPHP), dibutyl phthalate (DBP), benzylbutyl phthalate (BBzP), diisodecyl phthalate (DIDP), diisooctyl phthalate (DIOP), diethyl phthalate (DEP), diisobutyl phthalate (DIBP), dihexyl phthalate, diisononyl phthalate (DINP), tris(2-ethylhexyl) trimellitate (TEHTM), tris(n-octyl-n-decyl)trimellitate (ATM), bis(2-ethylhexyl)adipate (DEHA), monomethyl adipate (MMAD), dioctyl adipate (DOA), dibutyl sebacate (DBS), dibutyl maleate (DBM), diisobutyl maleate (DIBM), azelaic acid ester, benzoic acid ester, terephthalate (example: dioctyl terephthalate (DEHT)), 1,2-cyclohexane dicarboxylic acid diisononyl ester (DINCH), epoxidized vegetable oil, sulfonamide (examples: N-(2-hydroxypropyl)benzene sulfonamide (HP BSA) and N-(n-butyl)benzene sulfonamide (BBSA-NBBS)), organic phosphate ester (examples: tricresyl phosphate (TCP) and tributyl phosphate (TBP)), acetylated monoglyceride, triethyl citrate (TEC), triethyl acetyl citrate (ATEC), tributyl citrate (TBC), tributyl acetyl citrate (ATBC), trioctyl citrate (TOC), trioctyl acetyl citrate (ATOC), trihexyl citrate (THC), acetyltrihexyl citrate (ATHC), epoxidized soybean oil, ethylene propylene rubber, polybutene, an addition polymer of 5-ethylidene-2-norbornene, and polymer plasticizers exemplified below.

It is supposed that the organic impurities are mixed from filters, pipes, tanks, O-rings, containers, and the like touched in a purification process. In particular, mixing of a compound other than alkyl olefin is particularly unpreferable because of causing a bridge defect.

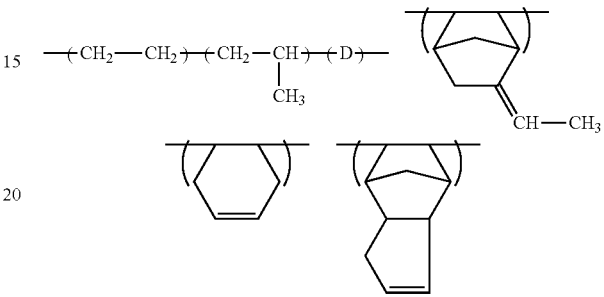

Examples of the organic impurities include a by-product generated with synthesizing the organic solvent, and/or an unreacted raw material (also referred to as "a by-product and the like" below). For example, in a case where the organic solvent is an alcohol compound, a ketone compound, an ester compound, an ether compound, or an aldehyde compound, examples of the by-product include an alcohol compound, a ketone compound, an ester compound, an ether compound, and an aldehyde compound.

Examples of the by-product include compounds represented by Formulae I to V.

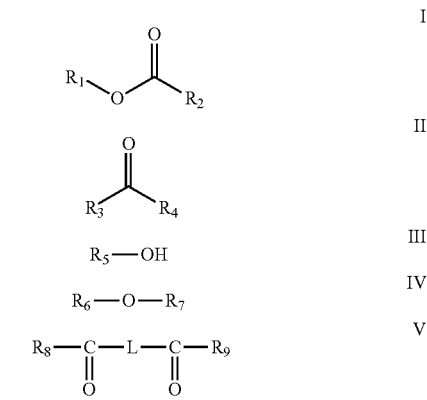

In Formula I, $R_1$ and $R_2$ each independently indicate an alkyl group or a cycloalkyl group, or $R_1$ and $R_2$ are bonded to each other so as to form a ring.

As the alkyl group or the cycloalkyl group indicated by $R_1$ and $R_2$, an alkyl group having 1 to 12 carbon atoms or a cycloalkyl group having 6 to 12 carbon atoms is preferable. An alkyl group having 1 to 8 carbon atoms or a cycloalkyl group having 6 to 8 carbon atoms is more preferable.

As the ring formed by bonding $R_1$ and $R_2$ to each other, a lactone ring is provided, a lactone ring having 4 to 9 member rings is preferable, and a lactone ring having 4 to 6 member rings is more preferable.

It is preferable that $R_1$ and $R_2$ satisfy a relationship of causing the carbon atoms of the compound represented by Formula I to be equal to or greater than 6.

In Formula II, $R_3$ and $R_4$ each independently indicate a hydrogen atom, an alkyl group, an alkenyl group, a cycloalkyl group, or a cycloalkenyl group, or $R_3$ and $R_4$ are bonded to each other so as to form a ring. Both of $R_3$ and $R_4$ are not hydrogen atoms.

As the alkyl group represented by $R_3$ and $R_4$, an alkyl group having 1 to 12 carbon atoms is preferable and an alkyl group having 1 to 8 carbon atoms is more preferable.

As the alkenyl group represented by $R_3$ and $R_4$, an alkenyl group having 2 to 12 carbon atoms is preferable and an alkenyl group having 2 to 8 carbon atoms is more preferable.

As the cycloalkyl group represented by $R_3$ and $R_4$, a cycloalkyl group having 6 to 12 carbon atoms is preferable and a cycloalkyl group having 6 to 8 carbon atoms is more preferable.

As the cycloalkenyl group represented by $R_3$ and $R_4$, a cycloalkenyl group having 3 to 12 carbon atoms is preferable and a cycloalkenyl group having 6 to 8 carbon atoms is more preferable.

The ring formed by bonding $R_3$ and $R_4$ to each other has a cyclic ketone structure. The ring may be saturated cyclic ketone or may be unsaturated cyclic ketone. The cyclic ketone preferably has 6 to 10 member rings and more preferably has 6 to 8 member rings.

It is preferable that $R_3$ and $R_4$ satisfy a relationship of causing the carbon atoms of the compound represented by Formula II to be equal to or greater than 6.

In Formula III, $R_5$ indicates an alkyl group or a cycloalkyl group.

As the alkyl group represented by $R_5$, an alkyl group having 6 or greater carbon atoms is preferable, an alkyl group having 6 to 12 carbon atoms is more preferable, and an alkyl group having 6 to 10 carbon atoms is further preferable.

The alkyl group may have an ether bond in the chain or may have a substituent such as a hydroxyl group.

As the cycloalkyl group represented by $R_5$, a cycloalkyl group having 6 or greater carbon atoms is preferable, a cycloalkyl group having 6 to 12 carbon atoms is more preferable, and a cycloalkyl group having 6 to 10 carbon atoms is further preferable.

In Formula IV, $R_6$ and $R_7$ each independently indicate an alkyl group or a cycloalkyl group, or $R_6$ and $R_7$ are bonded to each other so as to form a ring.

As the alkyl group represented by $R_6$ and $R_7$, an alkyl group having 1 to 12 carbon atoms is preferable and an alkyl group having 1 to 8 carbon atoms is more preferable.

As the cycloalkyl group represented by $R_6$ and $R_7$, a cycloalkyl group having 6 to 12 carbon atoms is preferable and a cycloalkyl group having 6 to 8 carbon atoms is more preferable.

The ring formed by bonding $R_6$ and $R_7$ to each other has a cyclic ether structure. The cyclic ether structure preferably has 4 to 8 member rings and more preferably 5 to 7 member rings.

It is preferable that $R_6$ and $R_7$ satisfy a relationship of causing the carbon atoms of the compound represented by Formula IV to be equal to or greater than 6.

In Formula V, $R_5$ and $R_9$ each independently indicate an alkyl group or a cycloalkyl group, or $R_5$ and $R_9$ are bonded to each other so as to form a ring. L indicates a single bond or an alkylene group.

As the alkyl group represented by $R_5$ and $R_9$, an alkyl group having 6 to 12 carbon atoms is preferable and an alkyl group having 6 to 10 carbon atoms is more preferable.

As the cycloalkyl group represented by $R_5$ and $R_9$, a cycloalkyl group having 6 to 12 carbon atoms is preferable and a cycloalkyl group having 6 to 10 carbon atoms is more preferable.

The ring formed by bonding $R_5$ and $R_9$ to each other has a cyclic diketone structure. The cyclic diketone structure preferably has 6 to 12 member rings and more preferably 6 to 10 member rings.

As the alkylene group represented by L, an alkylene group having 1 to 12 carbon atoms is preferable and an alkylene group having 1 to 10 carbon atoms is more preferable.

It is preferable that R8, R9, and L satisfy a relationship of causing the carbon atoms of the compound represented by Formula V to be equal to or greater than 6.

From a point of improving defect performance and further improving the advantage of the present invention, the organic impurity is preferably one kind or more selected from the group consisting of dioctyl phthalate, diisononyl phthalate, dioctyl adipate, dibutyl phthalate, ethylene rubber, ethylene propylene rubber, and an addition polymer of 5-ethylidene-2-norbornene.

[Water]

The chemical liquid may include water. The type of the water is not particularly limited, and, for example, distilled water, ion exchange water, and pure water can be used.

Water may be added in the chemical liquid or may be inevitably mixed in the chemical liquid in a manufacturing process of the chemical liquid. Examples of a case of being inevitably mixed in the chemical liquid in a manufacturing process of the chemical liquid include a case where the water is provided in a raw material (for example, organic solvent) used in manufacturing the chemical liquid, and a case where the water is mixed in the manufacturing process of the chemical liquid (for example, contamination).

The content of the water in the chemical liquid is not particularly limited. Generally, the content of the water is preferably equal to or smaller than 2.0 mass %, more preferably equal to or smaller than 1.0 mass %, and further preferably smaller than 0.5 mass %, with respect to the total mass of the chemical liquid.

If the content of the water in the chemical liquid is equal to or smaller than 1.0 mass %, the manufacturing yield of a semiconductor chip is more improved.

A lower limit is not particularly limited, but may be about 0.01 mass % in many cases. In manufacturing, it is difficult to set the content of the water to be equal to or smaller than the above value.

In this specification, the content of the water means a moisture content measured by using a device which uses the Karl Fischer moisture measurement method as a measurement principle. The measuring method by the device is as described in the examples.

<Physical Properties of Chemical Liquid>

From a point of the more excellent advantage of the present invention, in the chemical liquid, it is preferable that the number of counting targets which have a size of 0.1 µm or greater and are to be counted by a light scattering type in-liquid particle counter is equal to or smaller than 100 pieces/mL.

In this specification, the counting targets which have a size of 0.1 µm or greater and are to be counted by a light scattering type in-liquid particle counter are also referred to as "coarse particles".

Examples of the coarse particles include particles such as dust, dirt, organic solid matters, and inorganic solid matters, which are included in a raw material (for example, organic solvent) used in manufacturing the chemical liquid, and dust, dirt, solid matters (configured from organic matters and/or inorganic matters) taken in as contaminants during a period of preparing the chemical liquid.

The coarse particle also includes impurities which include metal atoms and are colloidalized. The type of the metal atom is not particularly limited. However, in a case where the content of at least one metal atom selected from the group consisting of Na, K, Ca, Fe, Cu, Mg, Mn, Li, Al, Cr, Ni, Zn, and Pb (preferably, Fe, Cr, Ni, and Pb) is too low, impurities including the metal atom are easily colloidalized.

<Manufacturing Method of Chemical Liquid>

A manufacturing method of the chemical liquid is not particularly limited, and well-known manufacturing methods can be used. Among the methods, from a point of more simply obtaining the chemical liquid, a manufacturing method of the chemical liquid, which includes processes as follows in this order is preferable. In the following descriptions, each of the processes will be described in detail.

(1) Organic solvent preparation process of preparing an organic solvent (2) Purification process of obtaining a chemical liquid by purifying the organic solvent ((1) Organic Solvent Preparation Process)

The organic solvent preparation process is a process of preparing an organic solvent.

A method of preparing an organic solvent is not particularly limited. For example, a method of securing an organic solvent by purchase and the like and a method of obtaining an organic solvent by causing a raw material to react are exemplified. As the organic solvent, an organic solvent in which the content of metal impurities including the metal atom described above is small (for example, the content of the organic solvent is equal to or greater than 99 mass %) is preferably prepared. Examples of a commercially available product of such an organic solvent include a product called as "a high-purity grade product".

A method of obtaining an organic solvent by causing a raw material to react is not particularly limited, and well-known methods are exemplified. For example, a method of obtaining an organic solvent by causing one or a plurality of raw materials to react under a state where a catalyst is provided is exemplified.

More specifically, for example, methods as follows are exemplified: a method of obtaining butyl acetate by causing acetate and n-butanol to react with each other under a state where sulfuric acid is provided; a method of obtaining 1-hexanol by causing ethylene, oxygen, and water to react with each other under a state where $Al(C_2H_5)_3$ is provided; a method of obtaining 4-methyl-2-pentanol by causing cis-4-methyl-2-pentene to react under a state where $Ipc_2BH$ (diisopinocampheylborane) is provided; a method of obtaining propylene glycol 1-monomethyl ether 2-acetate (PGMEA) by causing Propylene oxide, methanol, and acetic acid to react with each other under a state where sulfuric acid is provided; a method of obtaining isopropyl alcohol (IPA) by causing acetone and hydrogen to react with each other under a state where copper oxide-zinc oxide-aluminum oxide is provided; and a method of obtaining ethyl lactate by causing lactic acid and ethanol to react with each other.

((2) Purification Process of Obtaining Chemical Liquid by Purifying Organic Solvent)

The purification process is a process of obtaining a chemical liquid having desired characteristics by purifying the organic solvent which has been obtained in the process of (1).

A purifying method is not particularly limited, and well-known methods are exemplified. For example, it is preferable that the purifying method of the organic solvent includes at least one process selected from the group consisting of processes listed below. In the following descriptions, each of the processes will be described in detail.

In the purification process, each of the following processes may be performed once or may be performed plural times. The order of the following processes is not particularly limited.

Distillation process

Component adjustment process

[Distillation Process]

The (2) purification process preferably includes a distillation process. The distillation process means a process of obtaining a distilled organic solvent (also referred to as "a purified matter" below) by distilling the organic solvent. A distillation method is not particularly limited, and well-known methods are exemplified.

Among the methods, a method of distilling the organic solvent by using a purification device as follows is preferable because it is possible to more easily obtain a purified matter and it is more difficult to cause not-intended impurities to be mixed with the purified matter in the distillation process.

Purification Device

As one form of the purification device which can be used in the distillation process, for example, a purification device as follows is exemplified. That is, the purification device includes a distillation tower for obtaining the purified matter by distilling the organic solvent and a wetting portion (for example, inner wall and duct) of the distillation tower is formed from at least one selected from the group consisting of a non-metal material and an electropolished metal material.

The type of the non-metal material is not particularly limited, and well-known non-metal materials can be used.

Examples of the non-metal material include at least one selected from the group consisting of a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, an ethylene tetrafluoride-ethylene copolymer resin, a trifluorochloroethylene-ethylene copolymer resin, a vinylidene fluoride resin, a trifluorochloroethylene copolymer resin, and a vinyl fluoride resin.

The type of the metal material is not particularly limited, and well-known metal materials can be used.

Examples of the metal material include a metal material in which the total content of chrome and nickel is greater than 25 mass % with respect to the total mass of the metal material. Among this type of metal material, a metal material in which the total content of chrome and nickel is equal to or greater than 30 mass % is preferable. The upper limit value of the total content of chrome and nickel in a metal material is not particularly limited. Generally, the upper limit value thereof is preferably equal to or smaller than 90 mass %.

Examples of the metal material include stainless steel and nickel-chromium alloys.

The type of the stainless steel is not particularly limited, and well-known kinds of stainless steel can be used. Among the kinds of stainless steel, an alloy which includes 8 mass % or more of nickel is preferable and austenitic stainless steel which includes 8 mass % or more of nickel is more preferable. Examples of the austenitic stainless steel include SUS (Steel Use Stainless) 304 (Ni content of 8 mass % and Cr content of 18 mass %), SUS304L (Ni content of 9 mass % and Cr content of 18 mass %), SUS316 (Ni content of 10 mass % and Cr content of 16 mass %), and SUS316L (Ni content of 12 mass % and Cr content of 16 mass %).

The type of the nickel-chromium alloy is not particularly limited, and well-known nickel-chromium alloys can be used. Among the alloys, a nickel-chromium alloy in which the content of nickel is 40 to 75 mass % and the content of chromium is 1 to 30 mass % is preferable.

Examples of the nickel-chromium alloy include HASTELLOY (trade name, the same below), MONEL (trade name, the same below), and INCONEL (trade name, the same below). More specifically, HASTELLOY C-276 (Ni content of 63 mass % and Cr content of 16 mass %), HASTELLOY-C(Ni content of 60 mass % and Cr content of 17 mass %), HASTELLOY C-22 (Ni content of 61 mass % and Cr content of 22 mass %), and the like are exemplified.

The nickel-chromium alloy may include, if necessary, boron, silicon, tungsten, molybdenum, copper, cobalt, and the like in addition to the above-described alloy.

A method of electropolishing the metal material is not particularly limited, and well-known methods are exemplified. For example, a method described in the paragraphs of [0011] to [0014] in JP2015-227501A and a method described in the paragraphs of [0036] to [0042] and the like in JP2008-264929A are exemplified.

Regarding the metal material, it is supposed that the content of chromium in a passive layer on the surface of the metal material becomes greater than the content of chromium having a parent phase by electropolishing. Therefore, metal impurities including metal atoms in the organic solvent flow out from the distillation tower having a wetting portion which is formed from an electropolished metal material. Accordingly, it is supposed that it is possible to obtain a distilled organic solvent in which the content of impurities is reduced.

The metal material may be subjected to buffing. A method of buffing is not particularly limited, and well-known methods are exemplified. The size of abrasive grains used in finishing of buffing is not particularly limited, and the size thereof is preferably equal to or smaller than #400 because it is easy to more reduce unevenness of the surface of the metal material. Buffing is preferably performed before electropolishing.

[Component Adjustment Process]

The (2) purification process preferably includes the component adjustment process.

The component adjustment process is a process of adjusting the content of a reactant, a purified matter, and the like and the content of metal impurities, organic impurities, water, and the like included in the organic solvent (referred to as "a purification target" below).

A method of adjusting the content of metal impurities, organic impurities, water, and the like included in the purification target is not particularly limited, and well-known methods can be used.

Examples of the method of adjusting the content of metal impurities, organic impurities, water, and the like included in the purification target include a method of adding metal impurities, organic impurities, water, and the like which have a predetermined amount, to the purification target, and a method of removing metal impurities, organic impurities, water, and the like in the purification target.

The method of removing metal impurities, organic impurities, water, and the like in the purification target is not particularly limited, and well-known methods can be used.

As the method of removing metal impurities, organic impurities, water, and the like in the purification target, for example, a method of causing the purification target to pass through a filter (a process of performing the above operation is referred to as "a filtering process" below) is preferable. The method of causing the purification target to pass through the filter is not particularly limited. A method in which a filter unit which comprises a filter and a filter housing is disposed in the middle of a transfer line for transferring the purification target, and the purification target is caused to pass through the filter unit in a pressed state or a unpressed state is exemplified.

The type of the filter is not particularly limited, and well-known filters can be used.

Filtering Process

The component adjustment process preferably includes the filtering process.

The filter used in the filtering process is not particularly limited, and well-known filters can be used.

Examples of the material of the filter used in the filtering process include a fluororesin such as polytetrafluoroethylene (PTFE); a polyamide resin such as nylon; and a polyolefin resin (including high density and an ultrahigh molecular weight) such as polyethylene and polypropylene (PP). Among the materials, the polyamide resin, PTFE, or polypropylene (including high-density polypropylene) is preferable. If a filter formed by this material is used, it is possible to more effectively remove a foreign matter which functions as the cause of an occurrence of a particle defect and has easy and high polarity, and to reduce the amount of the metal impurities with high efficiency.

The lower limit value of critical surface tension of the filter is preferably equal to or greater than 70 mN/m. The upper limit value thereof is preferably equal to or smaller than 95 mN/m. It is more preferable that the critical surface tension of the filter is 75 to 85 mN/m among the values as described above.

The value of the critical surface tension is the nominal value of a manufacturer. If a filter having critical surface tension in the above range is used, it is possible to more effectively remove a foreign matter which functions as the cause of an occurrence of a particle defect and has easy and high polarity, and to reduce the amount of the metal impurities with high efficiency.

The pore size of the filter is preferably about 0.001 to 1.0 µm, more preferably about 0.01 to 0.5 µm, and further preferably about 0.01 to 0.1 µm. If the pore size of the filter is set to be in the above range, it is possible to reliably remove a fine foreign matter included in the purification target while an occurrence of filter clogging is suppressed.

In a case where the filter is used, a combination with a different filter may be used. At this time, filtering by a first filter may be performed only once or may be performed two times or more. In a case where filtering is performed two times or more by combining a different filter, the filters may be the same type as each other or may be types different from each other. A case where the filters have different types is preferable. Typically, it is preferable that at least one of a pore size or a constituent material is different from each other in a first filter and a second filter.

It is preferable that the pore size of the filter used during second filtering and the subsequent filtering is equal to or smaller than the pore size of the filter used during first filtering. The first filter having a different pore size in the above-described range may be combined. Here, the pore size can refer to the nominal value of a filter manufacturer. As a commercial filter, for example, filters manufactured by Pall Corporation, ADVANTEC Toyo Roshi Kaisha, Ltd., Entegris Japan Co., Ltd. (former Nihon microlith Corporation) and KITZ MICRO FILTER CORPORATION can be selected from various filters to be provided. In addition, a "P-Nylon filter (pore size of 0.02 μm and critical surface tension of 77 mN/m)" (manufactured by Pall Corporation) made of polyamide; a "PE-clean filter (pore size of 0.02 μm)" (manufactured by Pall Corporation) made of high-density polyethylene; and a "PE-clean filter (pore size of 0.01 μm)" (manufactured by Pall Corporation) made of high-density polyethylene can be used.

As a preferable form, a form in which a plurality of filters in series is used, and one thereof is a Nylon filter is exemplified.

The chemical liquid is not particularly limited. However, for example, from a viewpoint of obtaining a desired advantage and of suppressing an increase of the amount of metal impurities (in particular, metal impurities provided in the chemical liquid, in a solid form) in a case where the purified chemical liquid is stored, the relationship of the purification target and the material of the filter used in filtering is as follows. A combination of the purification target and the material of the filter used in filtering satisfies a relational expression of (Ra/R0)≤1 in a case where an interaction radius (R0) in a Hansen solubility parameter (HSP) space deduced from the material of the filter and a radius (Ra) of a sphere in a Hansen space deduced from the purification target are set. It is preferable that the material of the filter and a filtered purification target which satisfy the relational expression are used. (Ra/R0)≤0.98 is preferable and (Ra/R0)≤0.95 is more preferable. The lower limit is preferably equal to or greater than 0.5, more preferably equal to or greater than 0.6, and further preferably equal to or greater than 0.7. The mechanism is not clear. However, in a case where the value in the relational expression is in the above range, an occurrence of a situation in which the content of metal impurities in the chemical liquid is increased when the chemical liquid is stored for a long term is suppressed.

The combination of the filter and the purification target is not particularly limited, and a combination disclosed in U.S. 2016/0089622A is exemplified.

As the second filter, a filter formed of a material which is similar to that of the above-described first filter can be used. A filter having a pore size which is similar to that of the above-described first filter can be used. In a case where a filter having a pore size which is smaller than that of the first filter is used as the second filter, a ratio (pore size of the second filter/pore size of the first filter) between the pore size of the second filter and the pore size of the first filter is preferably 0.01 to 0.99, more preferably 0.1 to 0.9, and further preferably 0.2 to 0.9. If the pore size of the second filter is set to be in the above range, a fine foreign matter to be mixed in the solution is more reliably removed.

Since filtration pressure influences filtration precision, pulsation of the pressure during filtering is preferably as small as possible.

In a case where two filters or more are used, differential pressure before and after passing through each of the filters is performed (also referred to as "filtration differential pressure" below) is not particularly limited. The filtration differential pressure is preferably equal to or lower than 250 kPa and more preferably equal to or lower than 200 kPa. The lower limit is not particularly limited and is preferably equal to or higher than 50 kPa. If the filtration differential pressure is equal to or lower than 250 kPa, it is possible to prevent an occurrence of a situation in which excessive pressure is applied to the filter, and thus to expect a decrease of an eluate.

In the manufacturing method of the chemical liquid, a filtration rate is not particularly limited. The filtration rate is preferably equal to or greater than 1.0 L/min/m$^2$, more preferably equal to or greater than 0.75 L/min/m$^2$, and further preferably equal to or greater than 0.6 L/min/m$^2$.

Differential pressure resistance for ensuring filter performance (filter is not broken) is set in the filter. In a case where the value of the differential pressure resistance is large, it is possible to increase the filtration rate by increasing filtration pressure. That is, the upper limit of the filtration rate generally depends on the differential pressure resistance of the filter. Generally, the upper limit thereof is preferably equal to or smaller than 10.0 L/min/m$^2$.

In the manufacturing method of the chemical liquid, the filtration pressure is not particularly limited. The filtration pressure is preferably 0.001 to 1.0 MPa, more preferably 0.003 to 0.5 MPa, and further preferably 0.005 to 0.3 MPa. In particular, in a case where a filter having a small pore size is used, it is possible to efficiently decrease the amount of a particulate foreign matter or impurities which are dissolved in the purification target, by increasing pressure of the filter. In a case where a filter having a pore size which is smaller than 20 nm is used, pressure of the filter is particularly preferably 0.005 to 0.3 MPa.

If the pore size of a filtration filter is set to be small, the filtration rate thereof is decreased. However, the filtration pressure is decreased in a manner that a plurality of filtration filters having the same type are connected in parallel to each other, and thus the filter area is increased. Thus, it is possible to compensate for the decrease of the filtration rate.

Before the filter is used, the filter may be washed. A method of washing the filter is not particularly limited. A method of immersing a filter in a washing liquid, a method of causing a washing liquid to pass through a filter, and a method obtained by combining the above methods are exemplified.

Since the filter is washed, it is easy to control the amount of a component extracted from the filter. As a result, a chemical liquid having a more excellent advantage of the present invention is obtained.

The washing liquid is not particularly limited, and well-known washing liquids can be used. The washing liquid is not particularly limited. Examples of the washing liquid include water and an organic solvent. As the organic solvent, an organic solvent which may be contained in the chemical liquid may be provided. Examples of such an organic solvent include alkylene glycol monoalkyl ether carboxylate, alkylene glycol monoalkyl ether, lactic acid alkyl ester, alkyl alkoxypropionate, cyclic lactone (preferably 4 to 10 carbon atoms), a monoketone compound (preferably 4 to 10 carbon atoms) which may have a ring, alkylene carbonate, alkoxy alkyl acetate, and alkyl pyruvate.

More specifically, examples of the washing liquid include propylene glycol monomethyl ether, propylene glycol monomethyl ether acetate, dimethyl sulfoxide, n-methyl pyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, γ-butyrolactone, and mixtures thereof.

The filtering process more preferably includes processes as follows. In the filtering process, each of the following processes may be performed once or may be performed plural times. The order of the following processes is not particularly limited.

1. Particle removing process
2. Metal ion removing process
3. Organic impurity removing process
4. Ion exchange process In the following descriptions, the processes will be described in detail.

Particle Removing Process

The particle removing process is a process of removing a coarse particle and/or metal impurities (metal impurities provided in the chemical liquid, in a solid form) in the purification target by using a particle removal filter. The particle removal filter is not particularly limited, and well-known particle removal filters can be used.

Examples of the particle removal filter include a filter having a particle removal diameter of 20 nm or smaller. The organic solvent is filtered by using the above filter, and thus it is possible to remove a coarse particle (a form of the coarse particle is as described above) from the organic solvent.

The particle removal diameter is preferably 1 to 15 nm and more preferably 1 to 12 nm. When the particle removal diameter is equal to or smaller than 15 nm, it is possible to remove a finer coarse particle. When the particle removal diameter is equal to or greater than 1 nm, filtration efficiency is improved.

Here, the particle removal diameter means the minimum size of particles which can be removed by the filter. For example, in a case where the particle removal diameter of a filter is 20 nm, particles having a diameter of 20 nm or smaller can be removed.

Examples of the material of the filter include 6-nylon, 6,6-nylon, polyethylene, polypropylene, polystyrene, polyimide, polyamide imide, and fluororesin.

Polyimide and/or polyamide imide may have at least one selected from the group consisting of a carboxy group, a salt type carboxy group, and a —NH-bond. Regarding solvent resistance, a fluororesin, polyimide, and/or polyamide imide is excellent.

A filter unit may be configured by a plurality of filters. That is, the filter unit may further include a filter having a particle removal diameter of 50 nm or greater (for example, microfiltration membrane which has a pore size of 50 nm or greater and is for removing fine particles). In a case where fine particles are provided in the purification target in addition to colloidalized impurities, particularly, colloidalized impurities including metal atoms such as iron or aluminum, the purification target is filtered by using a filter having a particle removal diameter of 50 nm or greater (for example, microfiltration membrane which has a pore size of 50 nm or greater and is for removing fine particles) before filtering is performed by using a filter having a particle removal diameter of 20 nm (for example, microfiltration membrane having a pore size of 20 nm). Thus, filtration efficiency of the filter having a particle removal diameter of 20 nm or smaller (for example, microfiltration membrane having a pore size of 20 nm) is improved and performance of removing coarse particles is more improved.

Metal Ion Removing Process

It is preferable that the filtering process further includes the metal ion removing process.

As the metal ion removing process, a process of causing the purification target to pass through a metal ion absorption filter is preferable. A method of causing a purification target to pass through a metal ion absorption filter is not particularly limited. A method in which a metal ion absorption filter unit comprising a metal ion absorption filter and a filter housing is disposed in the middle of a transfer line for transferring the purification target, and the purification target is caused to pass through the metal ion absorption filter unit in a pressed state or a unpressed state is exemplified.

The type of the metal ion absorption filter is not particularly limited, and well-known metal ion absorption filters can be used.

Among the filters, a filter which can perform ion exchange is preferable as the metal ion absorption filter. Here, a metal ion as an absorption target is not particularly limited. From a point of easily functioning as the cause of the occurrence of a defect in a semiconductor chip, at least one metal ion selected from the group consisting of Fe, Cr, Ni, and Pb is preferable, and all kinds of metal ions (Fe, Cr, Ni, and Pb) are more preferable.

From a viewpoint of improving performance of absorbing metal ions, the metal ion absorption filter preferably has an acid group on the surface thereof. Examples of the acid group include a sulfo group and a carboxy group.

Examples of the material of a base material constituting the metal ion absorption filter include cellulose, diatomaceous earth, nylon, polyethylene, polypropylene, polystyrene, and fluororesin.

The metal ion absorption filter may be configured by a material which includes polyimide and/or polyamide imide. Examples of the metal ion absorption filter include a polyimide and/or polyamide imide porous membrane disclosed in JP 2016-155121A.

The polyimide and/or polyamide imide porous membrane may have at least one selected from the group consisting of a carboxy group, a salt type carboxy group, and a —NH-bond. If the metal ion absorption filter is configured from a fluororesin, polyimide, and/or polyamide imide, more excellent solvent resistance is obtained.

Organic Impurity Removing Process

The filtering process preferably includes the organic impurity removing process. As the organic impurity removing process, a process of causing the purification target to pass through an organic impurity absorption filter is preferable. A method of causing a purification target to pass through an organic impurity absorption filter is not particularly limited. A method in which a filter unit comprising an organic impurity absorption filter and a filter housing is disposed in the middle of a transfer line for transferring the purification target, and the organic solvent is caused to pass through the filter unit in a pressed state or a unpressed state is exemplified.

The type of the organic impurity absorption filter is not particularly limited, and well-known organic impurity absorption filters can be used.

Among the filters, a filter in which an organic matter skeleton which can interact with organic impurities is provided on the surface (in other words, the surface is modified by an organic matter skeleton which can interact with organic impurities) is preferable as the organic impurity absorption filter, from a point of improving absorption performance of organic impurities. Examples of the organic matter skeleton which can interact with organic impurities include a chemical structure which allows the organic impurity absorption filter to capture organic impurities by reacting with the organic impurities. More specifically, in a case where n-long chain alkyl alcohol (structural isomer in a case where 1-long chain alkyl alcohol is used as the organic solvent) is provided as the organic impurities, an alkyl group is exemplified as the organic matter skeleton. In a case where dibutyl hydroxytoluene (BHT) is included as the organic impurities, a phenyl group is exemplified as the organic matter skeleton.

Examples of the material of a base material constituting the organic impurity absorption filter include cellulose in which activated carbon is carried and supported, diatomaceous earth, nylon, polyethylene, polypropylene, polystyrene, and fluororesin.

A filter which is disclosed in JP2002-273123A and JP2013-150979A, and in which activated carbon is stuck to nonwoven fabric can also be used as the organic impurity absorption filter.

As the mechanism of the organic impurity absorption filter, physical absorption can also be applied in addition to chemical absorption (absorption using an organic impurity removal filter in which an organic matter skeleton which can interact with organic impurities is provided on the surface) described above.

For example, in a case where BHT is included as the organic impurities, the structure of BHT is larger than 10 Å (~1 nm). Thus, because an organic impurity absorption filter having a pore size of 1 nm is used, it is not possible to cause BHT to pass through pores of the filter. That is, since BHT is physically captured by the filter, BHT is removed from the purification target. In this manner, as removal of organic impurities, physical removal can be also applied in addition to chemical interaction. In this case, a filter having a pore size of 3 nm or greater is used as "the particle removal filter", and a filter having a pore size of smaller than 3 nm is used as "the organic impurity absorption filter".

Ion Exchange Process

The filtering process may further include the ion exchange process.

As the ion exchange process, a process of causing the purification target to pass through an ion exchange unit is preferable. A method of causing a purification target to pass through an ion exchange unit is not particularly limited. A method in which an ion exchange unit is disposed in the middle of a transfer line for transferring the purification target, and the organic solvent is caused to pass through the ion exchange unit in a pressed state or a unpressed state is exemplified.

The ion exchange unit is not particularly limited, and well-known ion exchange units can be used. Examples of the ion exchange unit include a unit in which a tower-like container is filled with an ion exchange resin, and an ion absorption membrane.

As one form of the ion exchange process, a process using a unit in which a cation exchange resin or an anion exchange resin as the ion exchange resin is provided on a single bed, a unit in which a cation exchange resin and an anion exchange resin are provided on a plurality of beds, and an unit in which a cation exchange resin and an anion exchange resin are provided on a mixed bed is exemplified.

As the ion exchange resin, a dried resin which hardly includes moisture is preferable because the amount of moisture eluted from the ion exchange resin is reduced. As such a dried resin, a commercially available product can be used. For example, 15JS-HG•DRY (trade name, dried cation exchange resin, moisture of 2% or smaller) and MSPS2-1•DRY (trade name, mixed bed resin, moisture of 10% or smaller) which are manufactured by ORGANO Corporation are exemplified.

It is preferable that the ion exchange process is performed before the above-described distillation process or before a moisture adjusting process which will be described later.

As another form of the ion exchange process, a process using an ion absorption membrane is exemplified.

A treatment at a high flow rate is possible by using the ion absorption membrane. The ion absorption membrane is not particularly limited. Examples of the ion absorption membrane include NEOSEPTA (trade name, manufactured by ASTOM Corporation).

It is preferable that the ion exchange process is performed after the above-described distillation process. If the ion exchange process is performed, it is possible to remove impurities which flow out, in a case where the impurities accumulated in the purification device flow out, and it is possible to remove an eluate from piping which is used as a transfer line and is made of stainless steel (SUS) or the like.

Moisture Adjusting Process

The moisture adjusting process is a process of adjusting the content of water included in the purification target. A method of adjusting the content of water is not particularly limited. A method of adding water to the purification target, and a method of removing water from the purification target are exemplified.

A method of removing water is not particularly limited, and well-known dehydration methods can be used.

Regarding the method of removing water, a dehydration membrane, a water absorbent which is insoluble in an organic solvent, an aeration replacement device using a dried inert gas, a heating or vacuum heating device, and the like are exemplified.

In a case where the dehydration membrane is used, membrane dehydration by pervaporation (PV) or vapor permeation (VP) is performed. The dehydration membrane is configured in a form of a water permeable membrane module, for example. A membrane formed from a polymer material such as polyimide, cellulose, and polyvinyl alcohol or an inorganic material such as zeolite can be used as the dehydration membrane.

The water absorbent is used in a manner of being added to the purification target. Examples of the water absorbent include zeolite, diphosphorus pentaoxide, silica gel, calcium chloride, sodium sulfate, magnesium sulfate, anhydrous zinc chloride, fuming sulfuric acid, and soda lime.

In a case where zeolite (in particular, MOLECULAR SIEVE (trade name) and the like manufactured by UNION SHOWA Corporation) is used in a dehydration treatment, olefins can also be removed.

It is preferable that the above-described component adjustment process is performed in a sealed state under an atmosphere of an inert gas, in which a probability of mixing water to the purification target is low.

It is preferable that the above treatments are performed under an atmosphere of an inert gas, in which a dew point temperature is equal to or lower than −70° C., in order to largely suppress mixing of moisture. The reason is that a probability of mixing moisture into the organic solvent is low since moisture concentration in a gas phase is equal to or smaller than 2 mass ppm under the atmosphere of an inert gas at −70° C. or lower.

The manufacturing method of the chemical liquid may include an absorption purification treatment process of a metal component, which uses silicon carbide and is disclosed in WO2012/043496A, in addition to the above processes.

In the manufacturing method of the chemical liquid, a part coming into contact with the chemical liquid in a device and a process relating to manufacturing, storing, and transferring is preferably washed before the chemical liquid is manufactured. A liquid used in washing is not particularly limited. As the liquid, the chemical liquid itself, or a liquid obtained by diluting the chemical liquid is preferable. Alternatively, an organic solvent in which particles containing metal atoms, metal ion components, and organic impurities are substantially not included, or the amount thereof is sufficiently reduced can be used. Washing may be performed plural times. Two different kinds or more of organic solvents may be used or may be used without mixing the organic solvents.

The washing may be circulation washing.

It can be determined whether or not the device relating to manufacturing is sufficiently washed, by measuring metal atoms, metal ion components, and the like which are included in a liquid used in washing. As a criterion of the washing, the content of a metal atom included in a liquid after washing is preferably equal to or smaller than 10 mass ppm, more preferably equal to or smaller than 0.1 mass ppm. It is further preferable that washing is performed until the content of metal atom included in a liquid after washing is equal to or smaller than 0.001 mass ppm.

Preferably, all processes regarding handling which includes manufacturing of a chemical liquid, filling of the chemical liquid, and the like, treatment analysis, and measuring are performed in a clean room. It is preferable that the clean room satisfies the 14644-1 clean room standards. The clean room preferably satisfies any of ISO (International Organization for Standardization) Class 1, ISO Class 2, ISO Class 3, or ISO Class 4. It is more preferable that the clean room satisfies ISO Class 1 or ISO Class 2, and it is further preferable that the clean room satisfies ISO Class 1.

<Manufacturing Method of Semiconductor Chip>

Hereinafter, a manufacturing method of a semiconductor chip will be described with reference to the drawings.

(Process 1: Insulating Layer Forming Process)

Process 1 is a process of forming an insulating layer on a base material. As illustrated in FIG. 1, an insulating layer 12 is formed on a base material 10 by performing this process.

The type of the base material is not particularly limited, and various base materials can be used. Examples of the base material include a semiconductor substrate. A material forming the semiconductor substrate is not particularly limited. Generally, it is preferable that the semiconductor substrate is configured from Group III-V compounds such as silicon, silicon germanium, and GaAs, or combinations thereof.

As the base material, a semiconductor substrate including a transistor is also exemplified. As the transistor, a so-called field effect transistor is exemplified. A manufacturing method of a transistor is not particularly limited, and well-known methods can be used.

Further, as the base material, a base material which includes a semiconductor substrate including a transistor and an insulating layer in which a metal interconnection or a via disposed on the surface of the substrate is embedded is exemplified. In the base material, the insulating layer may be obtained by stacking a plurality of layers.

As described above, this procedure is useful in a case where a finer metal interconnection (so-called local interconnection) is manufactured. However, this procedure may be used in manufacturing so-called an intermediate interconnection and a global interconnection.

The type of the insulating layer is not particularly limited, and well-known insulating layers can be used. Examples of the material of the insulating layer include inorganic materials and organic materials such as polyimide. Examples of the inorganic materials include oxide, nitride, oxynitride, and the like of a metal atom selected from the group consisting of Si, Al, Zr, Ti, Nb, and Ta.

From a point of insulating performance, an insulating layer including a silicon atom is preferable as the above insulating layer. Examples of the insulating layer including a silicon atom include films configured by $SiO_X$, SiN, and SiOC. It is preferable that x indicates a value of 1 to 3.

The thickness of the insulating layer is not particularly limited. Generally, the thickness thereof is 0.1 to 1.0 μm in many cases.

The method of forming an insulating layer is not particularly limited, and well-known methods can be used. For example, a physical vapor deposition method and a chemical vapor deposition method are exemplified. A method in which a composition for forming an insulating layer, such as a sol-gel solution is applied, and if necessary, a heating treatment is performed is exemplified. As a coating method, a spin coating method is preferable.

In Process 1, if necessary, after the insulating layer is formed on the base material, a treatment of washing the insulating layer by using a washing liquid may be performed. The type of the washing liquid to be used is not particularly limited, and the above-described chemical liquid is preferably used.

After Process 1 and before Process 2, a process of forming an anti-reflective film (BARC: Bottom Anti Reflective Coating) on the insulating layer may be performed. Since the anti-reflective film is disposed on the insulating layer, pattern precision of a resist film which will be described later is more improved.

The material forming the anti-reflective film is not particularly limited, and well-known materials can be used.

(Process 2: Resist Film Forming Process)

Figure 2:
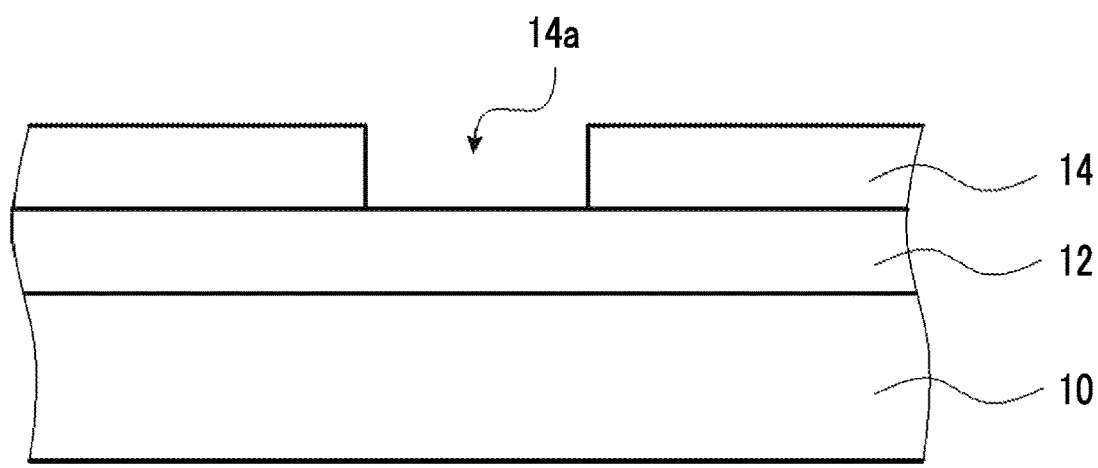
FIG. 2 is a sectional view illustrating a stacked body obtained by Process 2.

Process 1 is a process of forming a patterned resist film on the insulating layer. As illustrated in FIG. 2, a patterned resist film 14 is formed on the insulating layer 12 by performing this process. The patterned resist film 14 has an opening portion 14*a* at a predetermined position.

The method of forming a patterned resist film is not particularly limited and well-known methods are exemplified. Among the methods, from a point of excellent productivity, Process 2-1 to Process 2-4 as follows are preferably performed. Process 2-4 is a process which is performed if necessary.

Process 2-1: process of coating the insulating layer with a pre-wet liquid

Process 2-2: process of forming a coated film by applying a composition for forming a resist film onto the insulating layer coated with the pre-wet liquid Process 2-3: process of forming the patterned resist film by exposing the coated film in a pattern shape and performing a developing treatment with a developer, and Process 2-4: process of washing the patterned resist film by using a rinse liquid Procedures of Process 2-1 to Process 2-4 will be described below in detail.

Process 2-1 is a process of coating the insulating layer with a pre-wet liquid. If the pre-wet liquid is previously applied before the insulating layer is coated with the composition for forming a resist film, coating properties of the composition for forming a resist film are more improved.

The type of the pre-wet liquid is not particularly limited, and, for example, well-known organic solvents can be used as the pre-wet liquid. The type of the organic solvent is not particularly limited, and the example of the organic solvent included in the above-described chemical liquid is exemplified.

From a point of improving manufacturing yield of a semiconductor chip, the above-described chemical liquid is preferably be used as the pre-wet liquid.

The method of coating an insulating layer with a pre-wet liquid is not particularly limited. For example, well-known coating methods such as a spin coating method, a spray coating method, and a dip coating method are exemplified.

After the pre-wet liquid is applied, if necessary, a dry treatment may be performed.

Process 2-2 is a process of forming a coated film by coating the insulating layer coated with the pre-wet liquid, with the composition for forming a resist film.

The type of the composition for forming a resist film, which is to be used is not particularly limited, and well-known compositions for forming a resist film can be exemplified. For example, a so-called positive type photoresist composition and a so-called negative type photoresist composition are exemplified.

The composition for forming a resist film may include the above-described chemical liquid as a solvent.

Examples of the composition for forming a resist film include a non-chemically amplified resist.

Examples of the non-chemically amplified resist include the followings.

(1) Resist material having solubility which changes in a manner that the main chain is cut off by irradiation with a g-ray, an h-ray, an i-ray, KrF, ArF, an electron beam (EB), EUV, or the like, and the molecular weight is reduced (for example, resist material in which a copolymer of an α-chloroacrylate ester compound and an α-methylstyrene compound described in the paragraphs of [0025] to [0029] and [0056] in JP2013-210411A and the paragraphs of [0032] and [0063] in U.S. 2015/0008211A is used as the main component).

(2) Resist material such as hydrogensilsesquioxane (HSQ) accompanied by a silanol condensation reaction caused by a g-ray, an h-ray, an i-ray, KrF, ArF, an electron beam (EB), EUV, or the like, calixarene substituted with chlorine (3) Resist which includes a metal complex (which is a complex of magnesium, chromium, manganese, iron, cobalt, nickel, copper, zinc, silver, cadmium, indium, tin, antimony, cesium, zirconium, hafnium, and the like, and titanium, zirconium, or hafnium is preferable from a viewpoint of pattern formability) that absorbs light of a g-ray, an h-ray, an i-ray, KrF, ArF, an electron beam (EB), EUV, or the like and is obtained by a ligand exchange process in combination with ligand elimination and photoacid generator (resist materials described in the paragraphs of [0017] to [0033] and [0037] to [0047] in JP2015-075500A, the paragraphs of [0017] and [0043] to [0044] in JP2012-185485A, and the paragraphs of [0042] to [0051] and [0066] in U.S. 2012/0208125A, for example)

As the composition for forming a resist film, a silicon resist is also preferable.

Examples of the silicon resist include resist materials described in the paragraphs [0010] and [0129] to [0165] in JP2008-083384A.

The composition for forming a resist film may include a resin having polarity which changes by an action of acid. As the resin, a resin P having a group which is decomposed by an action of acid so as to generate a polar group is more preferable. As the resin, a resin in which solubility in a developer including an organic solvent as the main component is reduced by an action of acid is preferable among the resins. The resin P has a repetitive unit represented by Formula (AI) which will be described later. The resin having a repetitive unit represented by Formula (AI) includes a group (also referred to as "an acid-decomposable group" below) which is decomposed by the action of acid, so as to form an alkali-soluble group.

As the polar group, an alkali-soluble group is exemplified. Examples of the alkali-soluble group include a carboxy group, a fluorinated alcohol group (preferably, hexafluoroisopropanol group), a phenolic hydroxyl group, and a sulfonic acid group.

The polar group in the acid-decomposable group is protected by a group (acid-eliminable group) which is eliminated by acid. Examples of the acid-eliminable group include —C($R_{36}$)($R_{37}$)($R_{38}$), —C($R_{36}$)($R_{37}$)($OR_{39}$), and —C($R_{01}$)($R_{02}$)($OR_{39}$).

In the formula, $R_{36}$ to $R_{39}$ each independently indicate an alkyl group, a cycloalkyl group, an aryl group, an aralkyl group, or an alkenyl group. $R_{36}$ and $R_{37}$ may be bonded to each other so as to form a ring.

$R_{01}$ and $R_{02}$ each independently indicate a hydrogen atom, an alkyl group, a cycloalkyl group, an aryl group, an aralkyl group, or an alkenyl group.

The resin P in which solubility in a developer including an organic solvent as the main component is decreased by the action of acid will be described below in detail.

(Formula (AI): Repetitive Unit Having Acid-Decomposable Group)

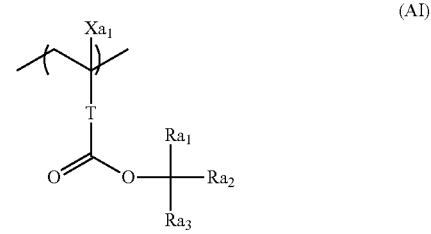

(AI)

In Formula (AI), $Xa_1$ indicates an alkyl group which may include a hydrogen atom or a substituent.

T indicates a single bond or a divalent linking group.

$Ra_1$ to $Ra_3$ each independently indicate an alkyl group (which preferably has a linear chain or a branched chain) or a cycloalkyl group (which is monocyclic or polycyclic).

A cycloalkyl group (which is monocyclic or polycyclic) may be formed by bonding two of $Ra_1$ to $Ra_3$ to each other.

Examples of the alkyl group which is represented by $Xa_1$ and may have a substituent include a methyl group and a group represented by —$CH_2$—$R_{11}$. $R_{11}$ indicates a halogen atom (fluorine atom and the like), a hydroxyl group, or a monovalent organic group.

It is preferable that $Xa_1$ indicates a hydrogen atom, a methyl group, a trifluoromethyl group, or a hydroxylmethyl group.

Examples of the divalent linking group of T include an alkylene group, a —COO-Rt- group, and a —O-Rt- group. In the formula, Rt indicates an alkylene group or a cycloalkylene group.

T preferably indicates a single bond or a —COO-Rt- group. Rt preferably indicates an alkylene group having 1 to 5 carbon atoms and more preferably indicates a —$CH_2$— group, a —$(CH_2)_2$— group, or a —$(CH_2)_3$— group.

As the alkyl group of $Ra_1$ to $Ra_3$, an alkyl group having 1 to 4 carbon atoms is preferable.

As the cycloalkyl group of $Ra_1$ to $Ra_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable.

As the cycloalkyl group formed by bonding two of $Ra_1$ to $Ra_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable. A monocyclic cycloalkyl group having 5 to 6 carbon atoms is more preferable.

In the cycloalkyl group formed by bonding two of $Ra_1$ to $Ra_3$, one methylene group constituting a ring may be substituted with a group which has a hetero atom such as an oxygen atom or a hetero atom such as a carbonyl group.

Regarding the repetitive unit represented by Formula (AI), for example, a form in which Rat indicates a methyl group or an ethyl group and the above-described cycloalkyl group is formed by bonding $Ra_2$ and $Ra_3$ to each other is preferable.

Each of the groups may have a substituent. Examples of the substituent include an alkyl group (1 to 4 carbon atoms), a halogen atom, a hydroxyl group, an alkoxy group (1 to 4 carbon atoms), a carboxy group, and an alkoxycarbonyl group (2 to 6 carbon atoms). A group having 8 or smaller carbon atoms is preferable.

The total content of the repetitive unit having an acid-decomposable group is preferably 20 to 90 mol %, more preferably 25 to 85 mol %, and further preferably 30 to 80 mol %, with respect to all repetitive units in the resin P.

(Repetitive Unit Having Lactone Structure)

It is preferable that the resin P includes a repetitive unit Q having a lactone structure.

It is preferable that the repetitive unit Q having a lactone structure has the lactone structure at a side chain. For example, a repetitive unit derived from a (meth)acrylic acid derivative monomer is more preferable.

The repetitive unit Q having a lactone structure may be singly used or may be used in combination of two kinds or more thereof. It is preferable that the repetitive unit Q is singly used.

The content of the repetitive unit Q having a lactone structure with respect to all repetitive units of the resin P is, for example, 3 to 80 mol %, and preferably 3 to 60 mol %.

As the lactone structure, a lactone structure having 5 to 7 member rings is preferable. A structure in which another cyclic structure is condensed with the lactone structure having 5 to 7 member rings, in a form in which a bicyclo structure or a spiro structure is formed is more preferable.

It is preferable that the lactone structure has a repetitive unit having a lactone structure which is represented by any of Formulae (LC1-1) to (LC1-17). As the lactone structure, a lactone structure represented by Formula (LC1-1), Formula (LC1-4), Formula (LC1-5), or Formula (LC1-8) is preferable. A lactone structure represented by Formula (LC1-4) is more preferable.

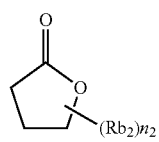

LC1-1

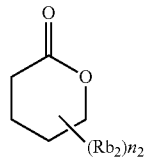

LC1-2

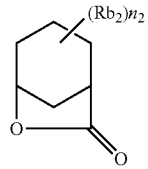

LC1-3

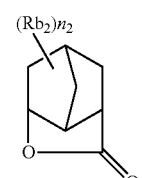

LC1-4

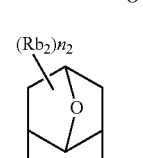

LC1-5

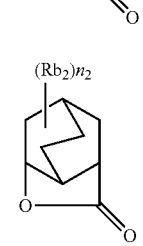

LC1-6

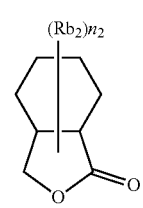

LC1-7

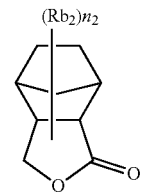

LC1-8

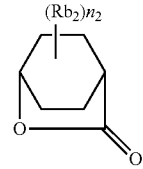

LC1-9

LC1-10

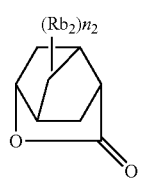

LC1-11

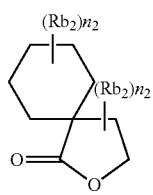

LC1-12

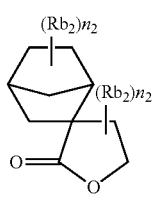

LC1-13

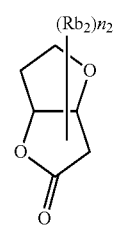

LC1-14

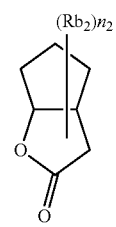

LC1-15

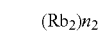

LC1-16

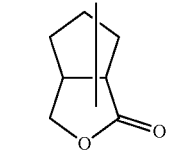

LC1-17

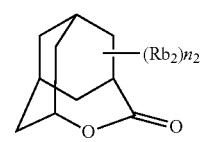

A part of the lactone structure may have a substituent (Rb$_2$). Examples of the preferable substituent (Rb$_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, and an acid-decomposable group. $n_2$ indicates an integer of 0 to 4. When $n_2$ is equal to or greater than 2, a plurality of substituents (Rb$_2$) may be the same as each other or may be different from each other. In addition, a ring may be formed by bonding the plurality of substituents (Rb$_2$) to each other.

The resin P is preferably a resin represented by Formula (I) among the above resins. The resin represented by Formula (I) refers to a resin configured from a repetitive unit selected from the group consisting of a repetitive unit represented by Formula (a), a repetitive unit represented by Formula (b), a repetitive unit represented by Formula (c), a repetitive unit represented by Formula (d), and a repetitive unit represented by Formula (e).

(I)

(a)

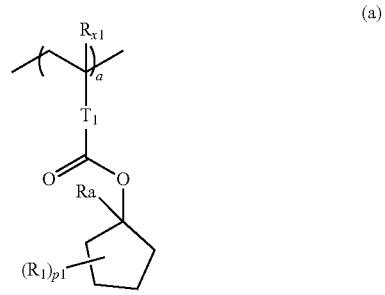

(b)

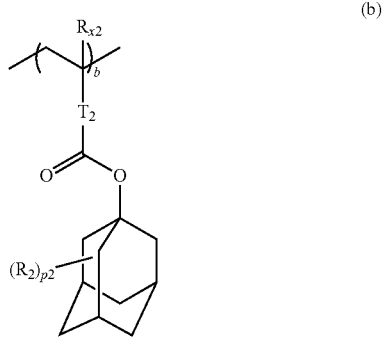

(c)

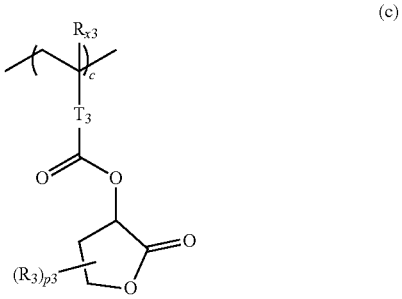

(d)

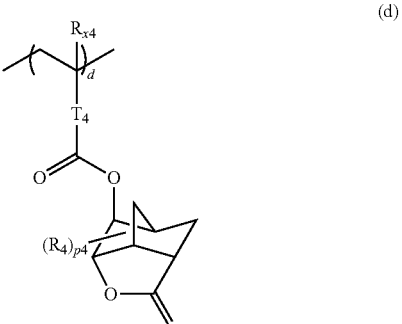

-continued

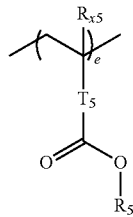

(e)

In Formula (I), $R_{x1}$ to $R_{x5}$ each independently indicate a hydrogen atom or an alkyl group which may have a substituent.

$R_1$ to $R_4$ each independently indicate a monovalent substituent. $p_1$ to $p_4$ each independently indicate 0 or a positive integer.

Ra indicates a linear chain or branched chain alkyl group.

$T_1$ to $T_5$ each independently indicate a single bond or a divalent linking group.

$R_5$ indicates a monovalent organic group.

a to e indicate mol %. a to e each independently indicate values included in a range of $0 \leq a \leq 00$, a range of $0 \leq b \leq 100$, a range of $0 \leq c < 100$, a range of $0 \leq d < 100$, and a range of $0 \leq e < 100$. $a+b+c+d+e=100$ and $a+b \neq 0$.

In Formula (I), a repetitive unit (e) has a structure which is different from any of those of repetitive units (a) to (d).

In Formula (I), $R_{x1}$ to $R_{x5}$ have the same meaning as $Xa_1$ in Formula (AI) described above, and suitable forms thereof are the same as that of $Xa_1$.

In Formula (I), $T_1$ to $T_5$ have the same meaning as T in Formula (AI) described above, and suitable forms thereof are the same as that of T.

In Formula (I), $R_a$ indicates a linear chain or branched chain alkyl group. For example, a methyl group, an ethyl group, and a t-butyl group are exemplified. Among the groups, a linear chain or branched chain alkyl group which has 1 to 4 carbon atoms is preferable.

In Formula (I), $R_1$ to $R_4$ each independently indicate a monovalent substituent. $R_1$ to $R_4$ are not particularly limited. Examples of $R_1$ to $R_4$ include a hydroxyl group, a cyano group, and a linear chain or branched chain alkyl group or cycloalkyl group which has a hydroxyl group, a cyano group, or the like.

In Formula (I), $p_1$ to $p_4$ each independently indicate 0 or a positive integer. The upper limit value of p corresponds to the number of hydrogen atoms which may be substituted in each of the repetitive units.

In Formula (I), $R_5$ indicates a monovalent organic group. $R_5$ is not particularly limited. Examples of $R_5$ include a monovalent organic group having a sulton structure, and a monovalent organic group having cyclic ether such as dioxolane.

In Formula (I), a to e indicate mol % and each independently indicate values included in a range of $0 \leq a \leq 100$, a range of $0 \leq b \leq 100$, a range of $0 \leq c < 100$, a range of $0 \leq d < 100$, and a range of $0 \leq e < 100$. $a+b+c+d+e=100$ and $a+b \neq 0$. In Formula (I), the content of the repetitive unit having an acid-decomposable group with respect to all repetitive units and the preferable range of the content of the repetitive unit having a lactone structure are respectively as described above.

The resin P may include a repetitive unit having a sulton structure.

(Repetitive Unit Having Phenolic Hydroxyl Group)

The resin P may include a repetitive unit having a phenolic hydroxyl group.

Examples of the repetitive unit having a phenolic hydroxyl group include a repetitive unit represented by General Formula (I).

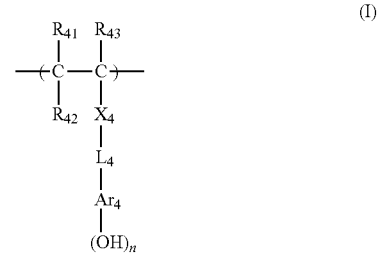

(I)

In Formula, $R_{41}$, $R_{42}$, and $R_{43}$ each independently indicate a hydrogen atom, an alkyl group, a halogen atom, a cyano group, or an alkoxycarbonyl group. $R_{42}$ may be bonded to $Ar_4$ so as to form a ring. In this case, $R_{42}$ indicates a single bond or an alkylene group.

$X_4$ indicates a single bond, —COO—, or —CONR$_{64}$—. $R_6$ indicates a hydrogen atom or an alkyl group.

$L_4$ indicates a single bond or an alkylene group.

$Ar_4$ indicates an (n+1)-valent aromatic ring group. In a case where $Ar_4$ is bonded to $R_2$ so as to form a ring, $Ar_4$ indicates an (n+2)-valent aromatic ring group.

n indicates an integer of 1 to 5.

The alkyl group of $R_{41}$, $R_{42}$, and $R_{43}$ in General Formula (I) may have a substituent. An alkyl group having 20 or smaller carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable. An alkyl group having 8 or smaller carbon atoms is more preferable, and an alkyl group having 3 or smaller carbon atoms is further preferable.

The cycloalkyl group of $R_{41}$, $R_{42}$, and $R_{43}$ in General Formula (I) may be monocyclic or polycyclic. The cycloalkyl group may have a substituent. A cycloalkyl group which is monocyclic and has 3 to 8 carbon atoms, such as a cyclopropyl group, a cyclopentyl group, and a cyclohexyl group, is preferable.

As the halogen atom of $R_{41}$, $R_{42}$, and $R_{43}$ in General Formula (I), a fluorine atom, a chlorine atom, a bromine atom, and an iodine atom are exemplified. The fluorine atom is preferable.

An alkyl group included in the alkoxycarbonyl group of $R_{41}$, $R_{42}$, and $R_{43}$ in General Formula (I) is preferably similar to the alkyl group of $R_4$, $R_{42}$, and $R_{43}$.

Examples of the substituent in each group include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms of the substituent is preferably equal to or greater than 8.

$Ar_4$ indicates an (n+1)-valent aromatic ring group. In a case where n is 1, a divalent aromatic ring group may have a substituent. Examples thereof include an arylene group having 6 to 18 carbon atoms, such as a phenylene group, a tolylene group, a naphthylene group, and an anthracenylene group, and an aromatic ring group including a heterocycle such as thiophene, furan, pyrrole, benzothiophene, benzofuran, benzopyrrole, triazine, imidazole, benzimidazole, triazole, thiadiazole, and thiazole.

In a case where n is an integer greater than 2, specific examples of the (n+1)-valent aromatic ring group include substances obtained by removing (n−1) hydrogen atoms from the above-described specific examples of the divalent aromatic ring group.

The (n+1)-valent aromatic ring group may further have a substituent.

Examples of the substituent which may be included in the alkyl group, the cycloalkyl group, the alkoxycarbonyl group, the alkylene group, and the (n+1)-valent aromatic ring group described above include the alkyl group exemplified in $R_{41}$, $R_{42}$, and $R_{43}$ in General Formula (I); an alkoxy group such as a methoxy group, an ethoxy group, a hydroxyethoxy group, a propoxy group, a hydroxypropoxy group, and a butoxy group; and an aryl group such as a phenyl group.

The alkyl group of $R_{64}$ in —$CONR_{64}$— ($R_{64}$ indicates a hydrogen atom or an alkyl group) represented by $X_4$ may have a substituent. An alkyl group having 20 or smaller carbon atoms, such as a methyl group, an ethyl group, a propyl group, an isopropyl group, an n-butyl group, a sec-butyl group, a hexyl group, a 2-ethylhexyl group, an octyl group, and a dodecyl group is exemplified. An alkyl group having 8 or smaller carbon atoms is more preferable.

As $X_4$, a single bond, —COO—, or —CONH— are preferable. The single bond or —COO— are more preferable.

The alkylene group in $L_4$ may have a substituent. An alkylene group having 1 to 8 carbon atoms, such as a methylene group, an ethylene group, a propylene group, a butylene group, a hexylene group, and an octylene group is preferable.

As $Ar_4$, an aromatic ring group which has 6 to 18 carbon atom and may have a substituent is preferable. A benzene ring group, a naphthalene ring group, or a biphenylene ring group is more preferable.

The repetitive unit represented by General Formula (I) preferably has a hydroxystyrene structure. That is, $Ar_4$ is preferably a benzene ring group.

As the repetitive unit having a phenolic hydroxyl group, a repetitive unit represented by General Formula (p1) is preferable.

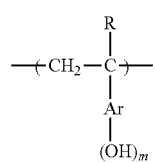

(p1)

R in General Formula (p1) indicates a hydrogen atom, a halogen atom, or an alkyl group which has carbon atoms 1 to 4 and has a linear chain or a branched chain. A plurality of R may be the same as or different from each other. As R in General Formula (p1), a hydrogen atom is preferable.

Ar in General Formula (p1) indicates an aromatic ring. Examples thereof include an aromatic hydrocarbon ring which may have a substituent having 6 to 18 carbon atoms, such as a benzene ring, a naphthalene ring, an anthracene ring, a fluorene ring, and a phenanthrene ring; and an aromatic ring heterocycle including a heterocycle such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among the above aromatic rings, a benzene ring is more preferable.

m in General Formula (p1) indicates an integer of 1 to 5 and is preferably 1.

Specific examples of the repetitive unit having a phenolic hydroxyl group will be described below. However, the present invention is not limited thereto. In formulae, a indicates 1 or 2.

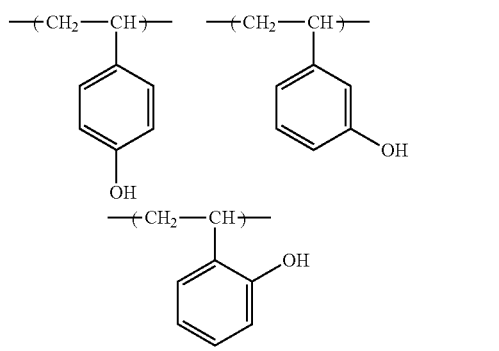

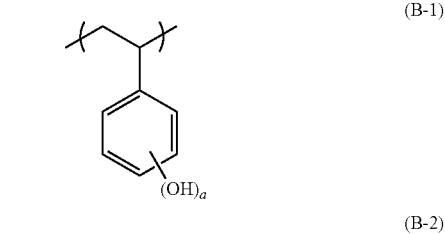

(B-1)

(B-2)

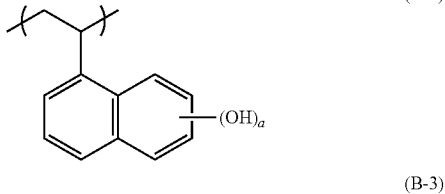

(B-3)

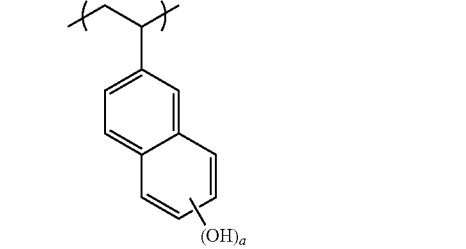

(B-4)

(B-5) 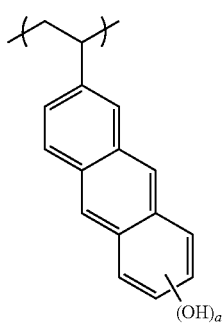
(B-6) 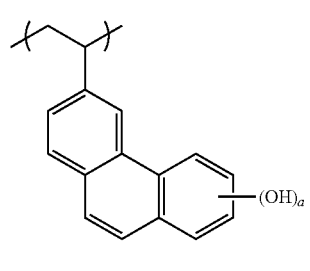
(B-7) 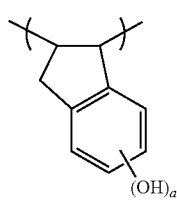
(B-8) 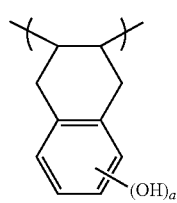
(B-9) 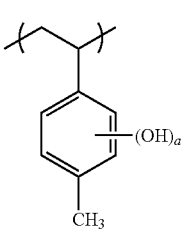
(B-10) 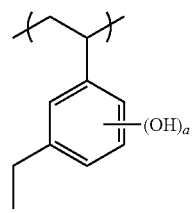
(B-11) 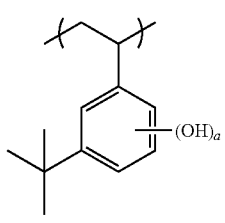
(B-12) 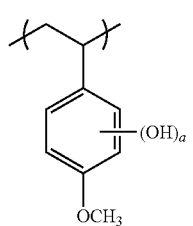
(B-13) 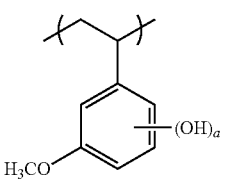
(B-14) 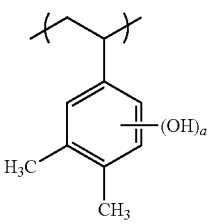
(B-15) 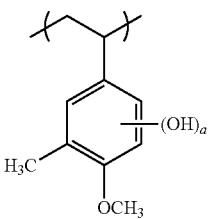
(B-16) 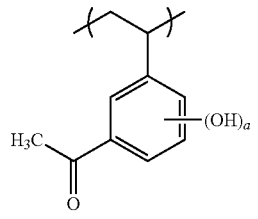
(B-17) 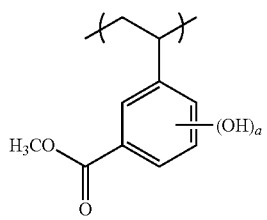
(B-18) 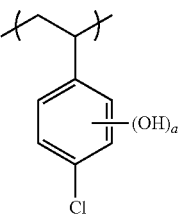

(B-19) 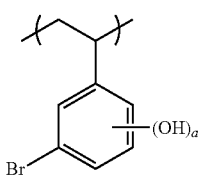
(B-20) 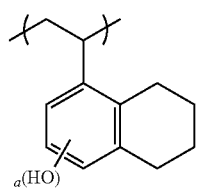
(B-21) 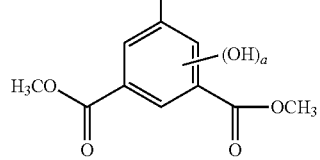
(B-22) 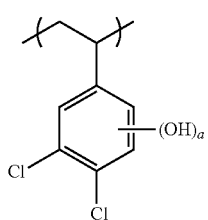
(B-23) 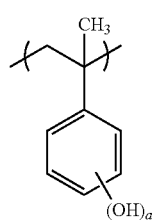
(B-24) 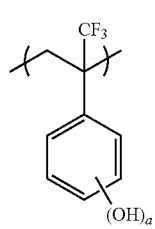
(B-25) 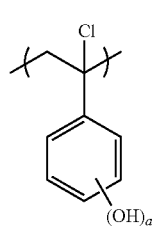
(B-26) 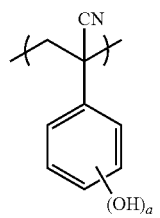
(B-27) 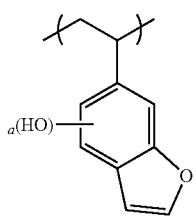
(B-28) 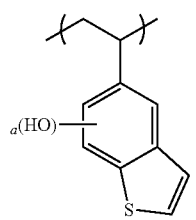
(B-29) 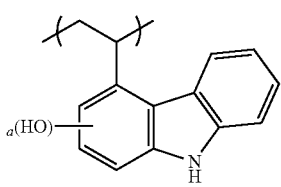
(B-30) 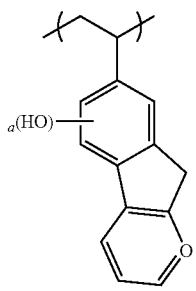
(B-31) 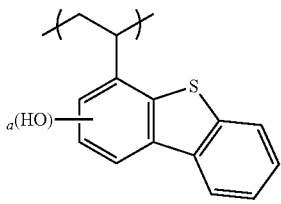
(B-32) 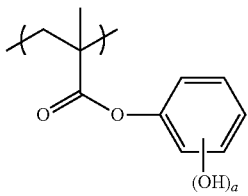

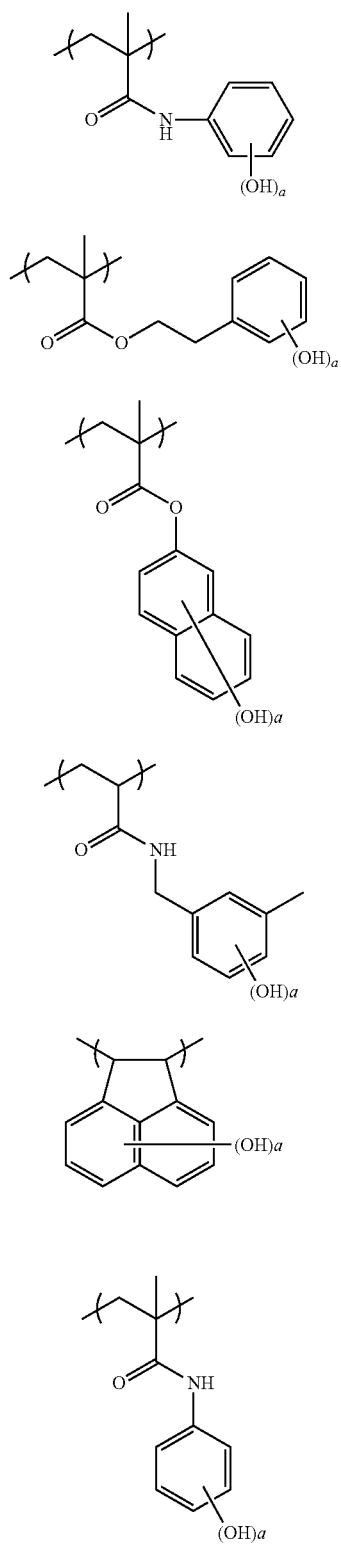

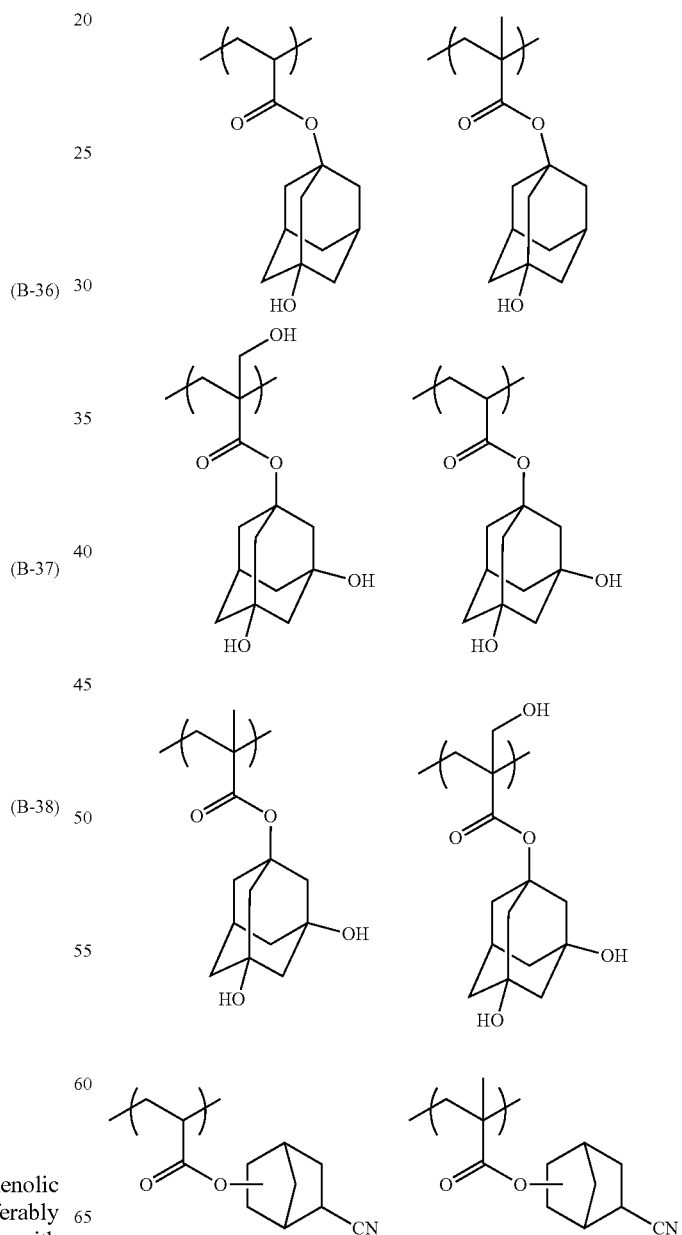

(Repetitive Unit Containing Organic Group Having Polar Group)

The resin P may further contain a repetitive unit including an organic group having a polar group, in particular, contain a repetitive unit having an alicyclic hydrocarbon structure substituted with a polar group.

Thus, substrate adhesion and developer affinity are improved. As the alicyclic hydrocarbon structure substituted with a polar group, an adamantyl group, a diamantyl group, or a norbornane group is preferable. As the polar group, a hydroxyl group or a cyano group is preferable.

Specific examples of the repetitive unit having a polar group are provided below. However, the present invention is not limited thereto.

The content of the repetitive unit having a phenolic hydroxyl group is preferably 0 to 50 mol %, more preferably 0 to 45 mol %, and further preferably 0 to 40 mol %, with respect to all repetitive units in the resin P.

-continued

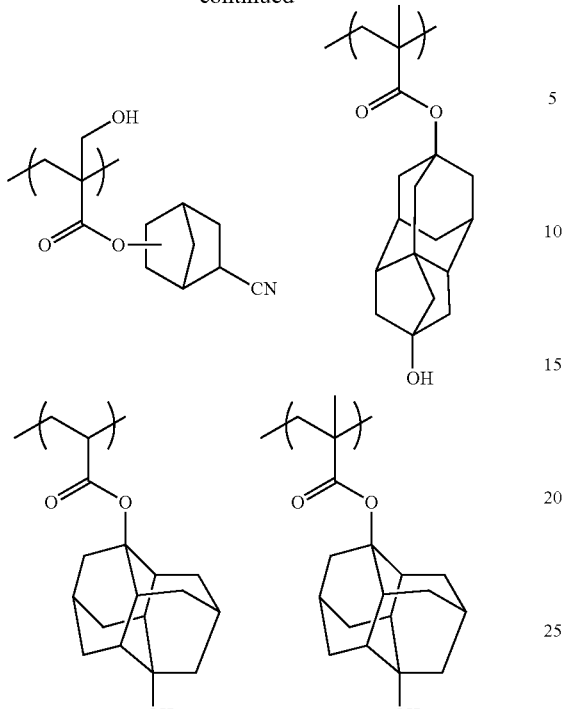

In a case where the resin P contains the repetitive unit including an organic group having a polar group, the content thereof is preferably 1 to 50 mol %, more preferably 1 to 30 mol %, further preferably 5 to 25 mol %, and particularly preferably 5 to 20 mol %, with respect to the all repetitive units in the resin P.

(Repetitive Unit Having Group (Photoacid Generation Group) that Generates Acid by Irradiation with Actinic Ray or Radiation)

The resin P may include a repetitive unit having a group (photoacid generation group) that generates acid by irradiation with an actinic ray or radiation.

Examples of the repetitive unit having a group (photoacid generation group) that generates acid by irradiation with an actinic ray or radiation include a repetitive unit represented by General Formula (4).

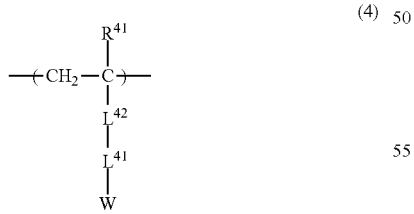

(4)

$R_4^1$ indicates a hydrogen atom or a methyl group. $L^{41}$ indicates a single bond or a divalent linking group. $L^{42}$ indicates a divalent linking group. W indicates a structural part which is decomposed by irradiation with an actinic ray or radiation, so as to generate acid in a side chain.

Specific examples of the repetitive unit represented by General Formula (4) will be described below. However, the present invention is not limited thereto.

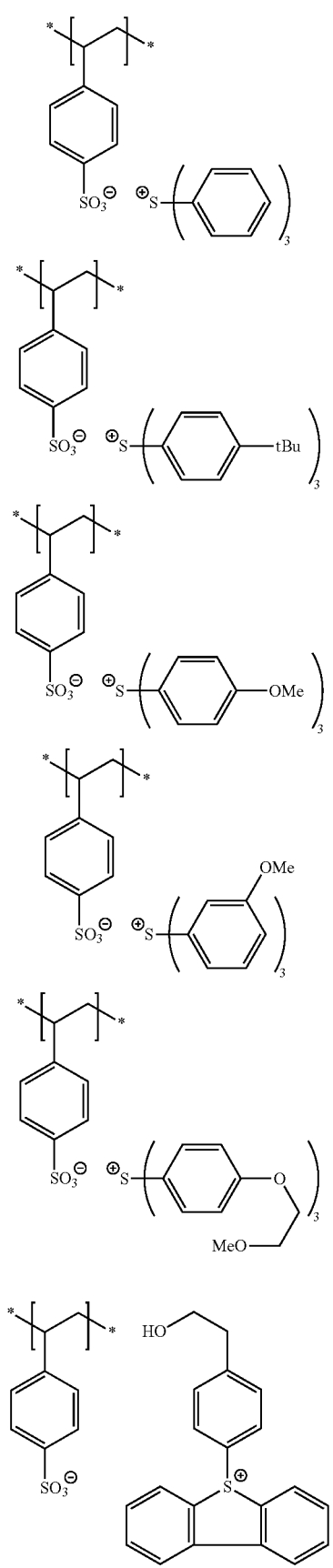

-continued
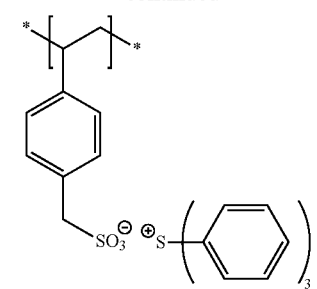
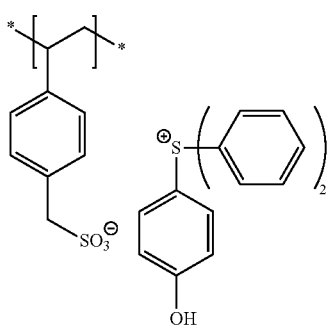
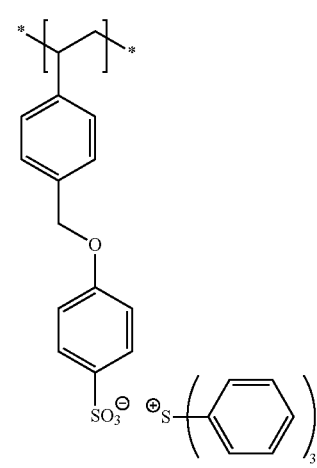
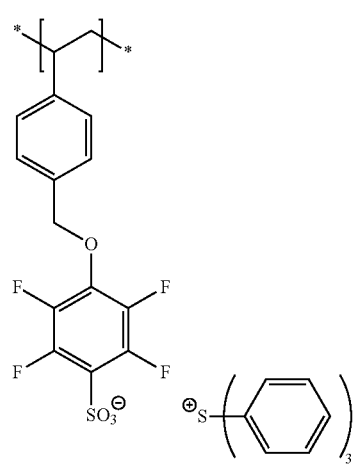
-continued
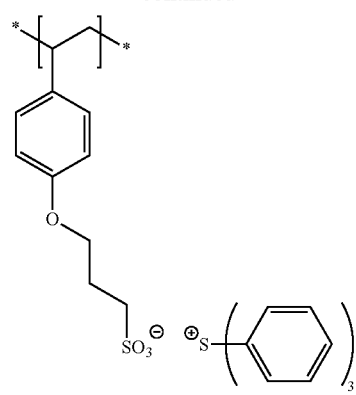
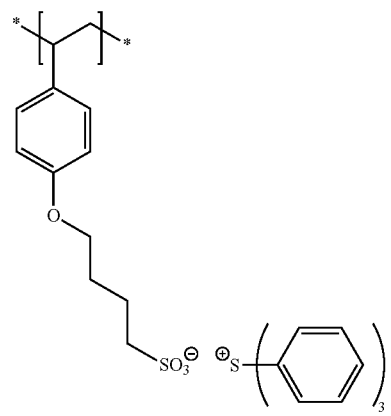
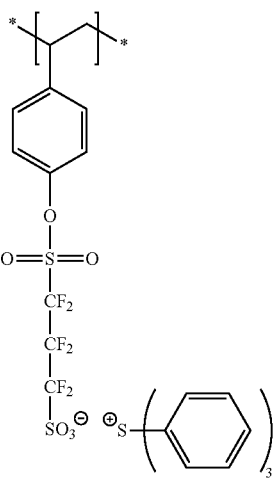

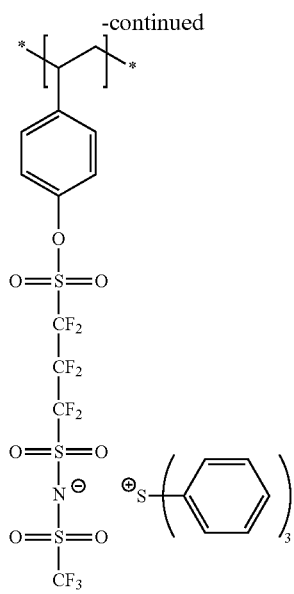

In addition, examples of the repetitive unit represented by General Formula (4) include a repetitive unit described in the paragraphs of [0094] to [0105] in JP2014-041327A.

In a case where the resin P contains the repetitive unit having a photoacid generation group, the content of the repetitive unit having a photoacid generation group is preferably 1 to 40 mol %, more preferably 5 to 35 mol %, and further preferably 5 to 30 mol %, with respect to all repetitive units in the resin P.

The resin P may include a repetitive unit represented by General Formula (VI).

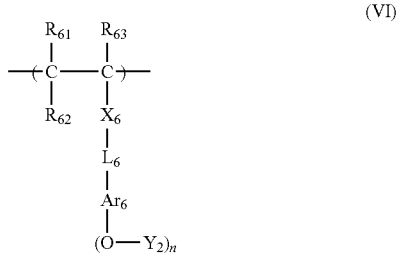

In General Formula (VI), $R_{61}$, $R_{62}$, and $R_{63}$ each independently indicate a hydrogen atom, an alkyl group, a cycloalkyl group, a halogen atom, a cyano group, or an alkoxycarbonyl group. $R_{62}$ may be bonded to $Ar_6$ so as to form a ring. In this case, $R_{62}$ indicates a single bond or an alkylene group.

$X_6$ indicates a single bond, —COO—, or —CONR$_{64}$—. $R_{64}$ indicates a hydrogen atom or an alkyl group.

$L_6$ indicates a single bond or an alkylene group.

$Ar_6$ indicates an (n+1)-valent aromatic ring group. In a case where $Ar_6$ is bonded to $R_{62}$ so as to form a ring, $Ar_6$ indicates an (n+2)-valent aromatic ring group.

$Y_2$ each independently indicates a hydrogen atom or a group eliminated by the action of acid, in a case of n≥2. At least one of $Y_2$ indicates a group eliminated by the action of acid.

n indicates an integer of 1 to 4.

As a group $Y_2$ eliminated by the action of acid, a structure represented by General Formula (VI-A) is preferable.

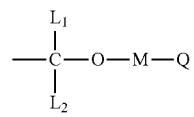

$L_1$ and $L_2$ each independently indicate a hydrogen atom, an alkyl group, a cycloalkyl group, an aryl group, or a group obtained by combining an alkylene group and an aryl group to each other.

M indicates a single bond or a divalent linking group.

Q indicates an alkyl group, a cycloalkyl group which may include a hetero atom, an aryl group which may include a hetero atom, an amino group, an ammonium group, a mercapto group, a cyano group, or an aldehyde group.

At least two of Q, M, or Li may be bonded to each other, so as to form a ring (preferably, 5 member rings or 6 member rings).

Preferably, the repetitive unit represented by General Formula (VI) is a repetitive unit represented by General Formula (3).

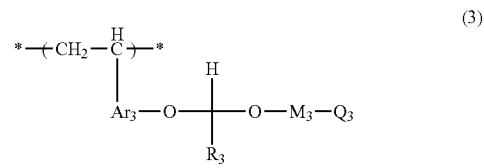

In General Formula (3), $Ar_3$ indicates an aromatic ring group.

$R_3$ indicates a hydrogen atom, an alkyl group, a cycloalkyl group, an aryl group, an aralkyl group, an alkoxy group, an acyl group, or a heterocyclic group.

$M_3$ indicates a single bond or a divalent linking group.

$Q_3$ indicates an alkyl group, a cycloalkyl group, an aryl group, or a heterocyclic group.

At least two of $Q_3$, $M_3$, or $R_3$ may be bonded to each other, so as to form a ring.

The aromatic ring group indicated by $Ar_3$ is similar to $Ar_6$ in General Formula (VI) in a case where n in General Formula (VI) is 1. The aromatic ring group is more preferably a phenylene group or a naphthylene group, and further preferably a phenylene group Specific examples of the repetitive unit represented by General Formula (VI) will be described below. However, the present invention is not limited thereto.

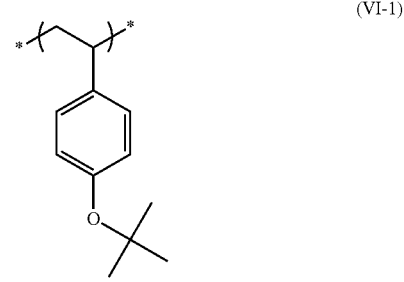

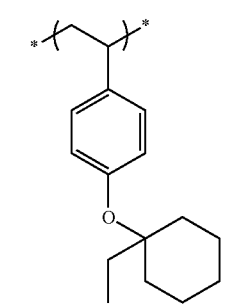 (VI-2)
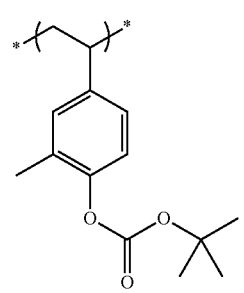 (VI-3)
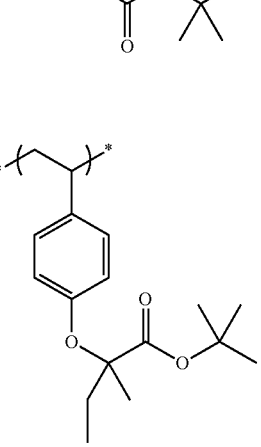 (VI-4)
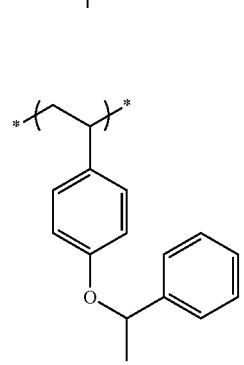 (VI-5)
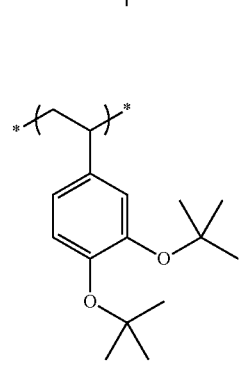 (VI-6)
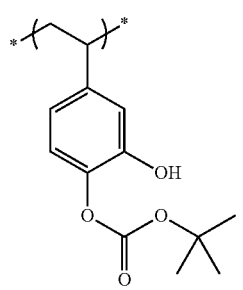 (VI-7)
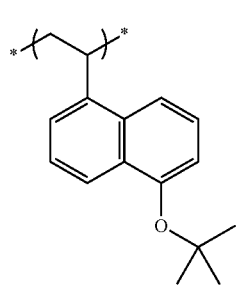 (VI-8)
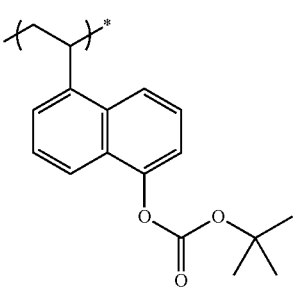 (VI-9)
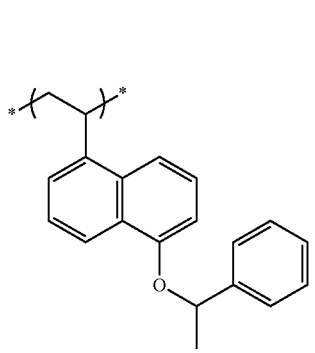 (VI-10)
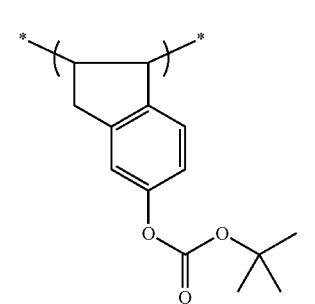 (VI-11)

(VI-12) 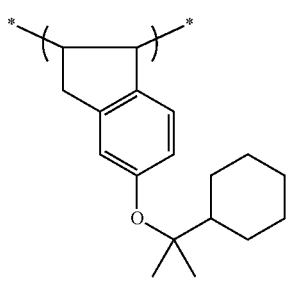
(VI-13) 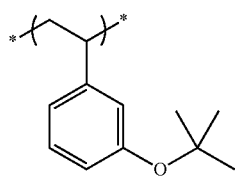
(VI-14) 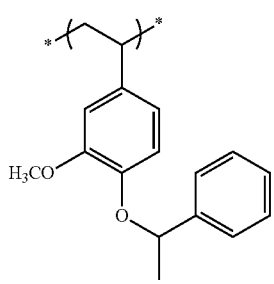
(VI-15) 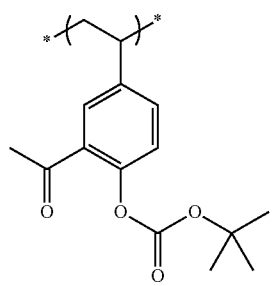
(VI-16) 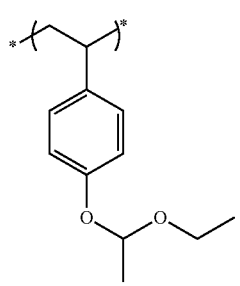
(VI-17) 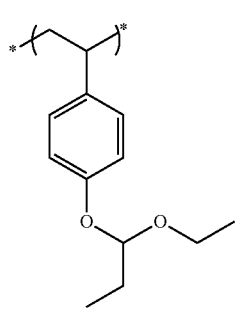
(VI-18) 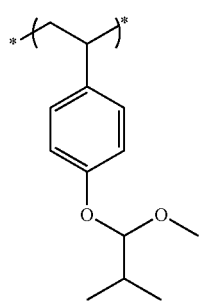
(VI-19) 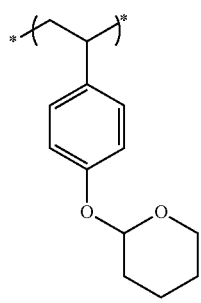
(VI-20) 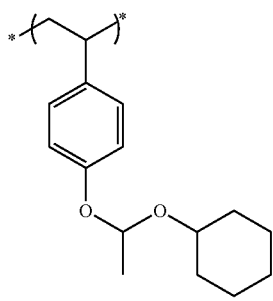
(VI-21) 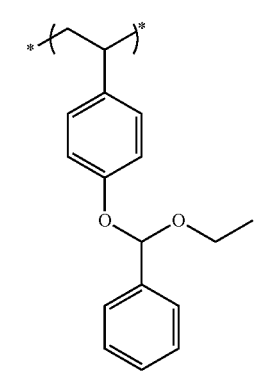
(VI-22) 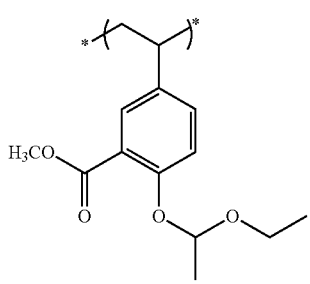

-continued
(VI-23)
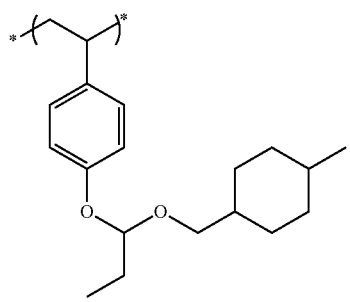
(VI-24)
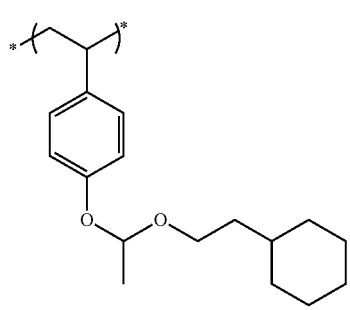
(VI-25)
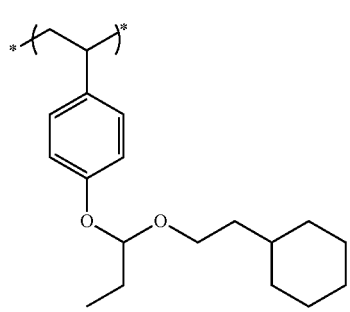
(VI-26)
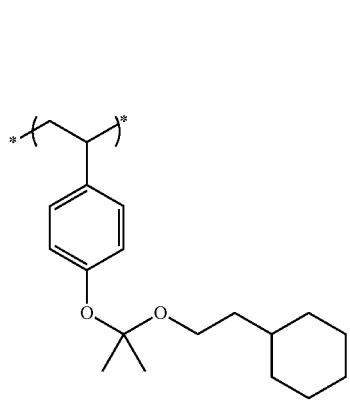
(VI-27)
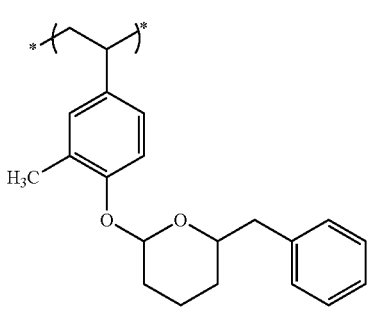
(VI-28)
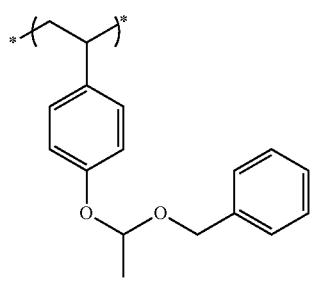
(VI-29)
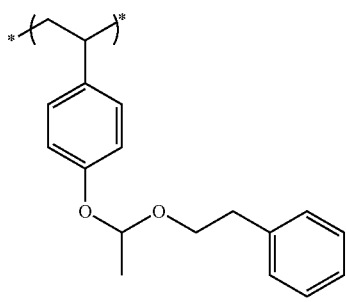
(VI-30)
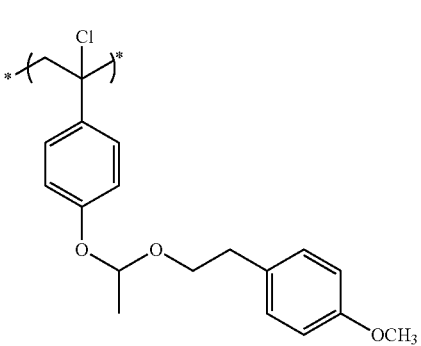
(VI-31)
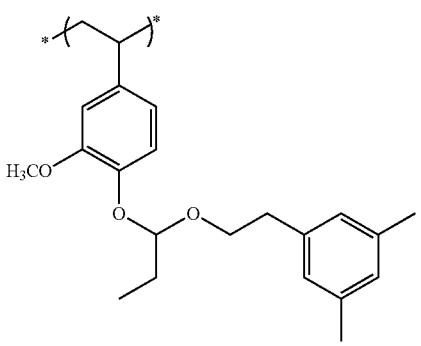
(VI-32)
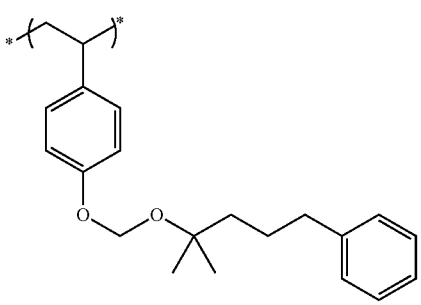

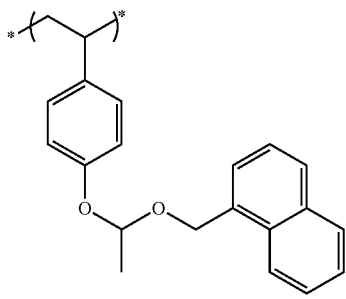
(VI-33)

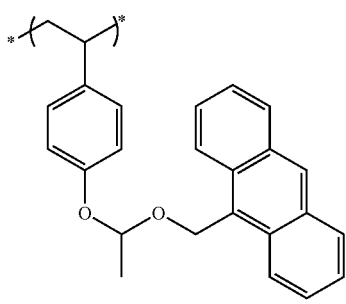
(VI-34)

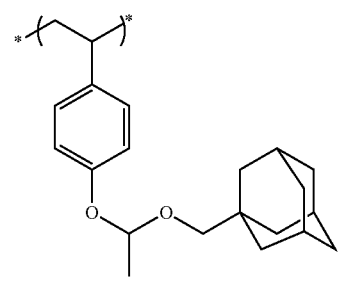
(VI-35)

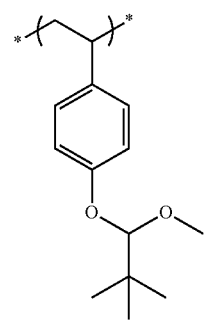
(VI-36)

The resin P may include a repetitive unit represented by General Formula (4).

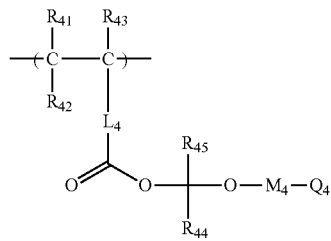
(4)

In General Formula (4), $R_{41}$, $R_{42}$, and $R_{43}$ each independently indicate a hydrogen atom, an alkyl group, a cycloalkyl group, a halogen atom, a cyano group, or an alkoxycarbonyl group. $R_{42}$ may be bonded to $L_4$ so as to form a ring. In this case, $R_{42}$ indicates an alkylene group.

$L_4$ indicates a single bond or a divalent linking group. In a case where $L_4$ is bonded to $R_{42}$ to form a ring, $L_4$ indicates a trivalent linking group.

$R_{44}$ and $R_{45}$ indicate a hydrogen atom, an alkyl group, a cycloalkyl group, an aryl group, an aralkyl group, an alkoxy group, an acyl group, or a heterocyclic group.

$M_4$ indicates a single bond or a divalent linking group.

$Q_4$ indicates an alkyl group, a cycloalkyl group, an aryl group, or a heterocyclic group.

At least two of $Q_4$, $M_4$, or $R_{44}$ may be bonded to each other, so as to form a ring.

$R_{41}$, $R_{42}$, and $R_{43}$ are similar to $R_{51}$, $R_{52}$, and $R_{53}$ in General Formula (V) described above. The preferable ranges thereof are also similar to each other.

$L_4$ is similar to $L^5$ in General Formula (V) described above. The preferable ranges thereof are also similar to each other.

$R_{44}$ and $R_{45}$ are similar to $R_3$ in General Formula (3) described above. The preferable ranges thereof are also similar to each other.

$M_4$ is similar to $M_3$ in General Formula (3) described above. The preferable ranges thereof are also similar to each other.

$Q_4$ is similar to $Q_3$ in General Formula (3) described above. The preferable ranges thereof are also similar to each other.

The ring formed by bonding at least two of $Q_4$, $M_4$, or $R_{44}$ may be the same as the ring formed by bonding at least two of $Q_3$, $M_3$, or $R_3$. The preferable ranges thereof are also similar to each other.

Specific examples of the repetitive unit represented by General Formula (4) will be described below. However, the present invention is not limited thereto.

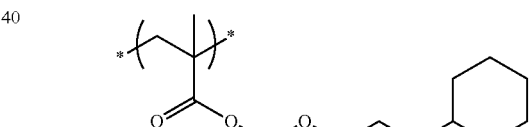

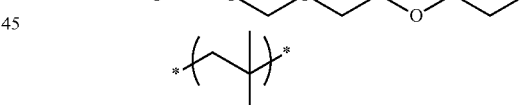

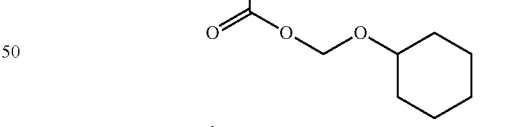

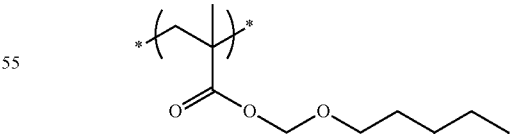

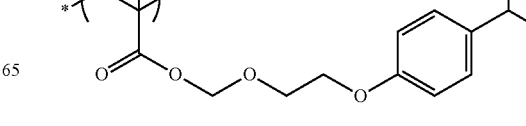

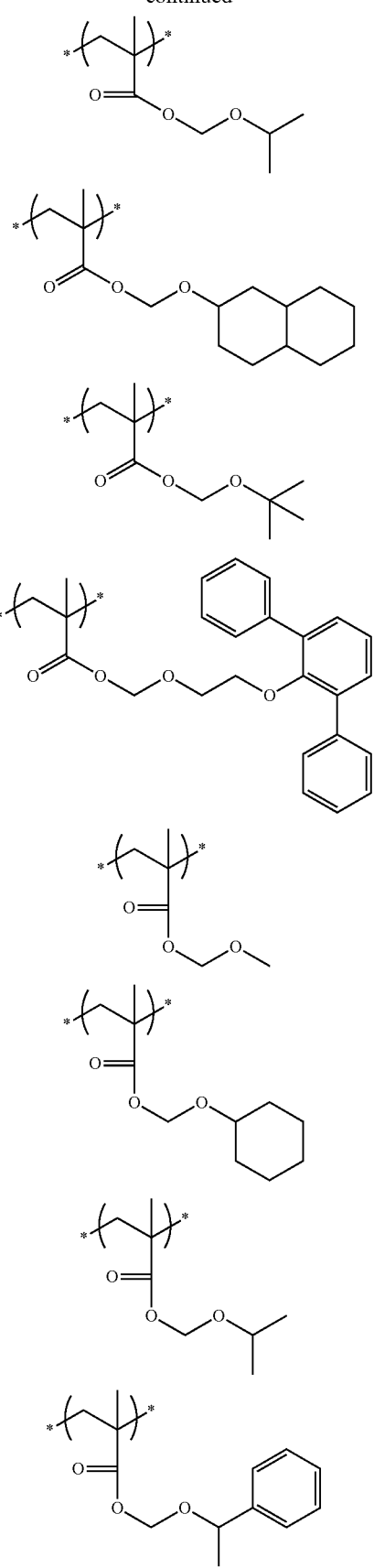
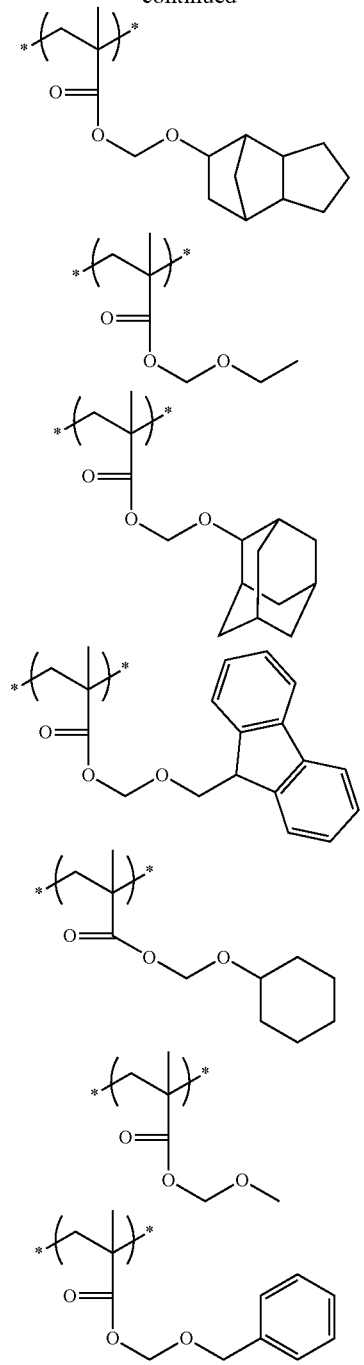
The resin P may include a repetitive unit represented by General Formula (BZ).
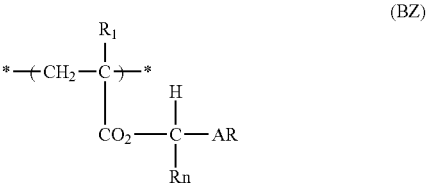

In General Formula (BZ), AR indicates an aryl group. Rn indicates an alkyl group, a cycloalkyl group, or an aryl group. Rn and AR may be bonded to each other so as to form a non-aromatic ring.

$R_1$ indicates a hydrogen atom, an alkyl group, a cycloalkyl group, a halogen atom, a cyano group, or an alkyloxycarbonyl group.

Specific examples of the repetitive unit represented by General Formula (BZ) will be described below. However, the present invention is not limited thereto.

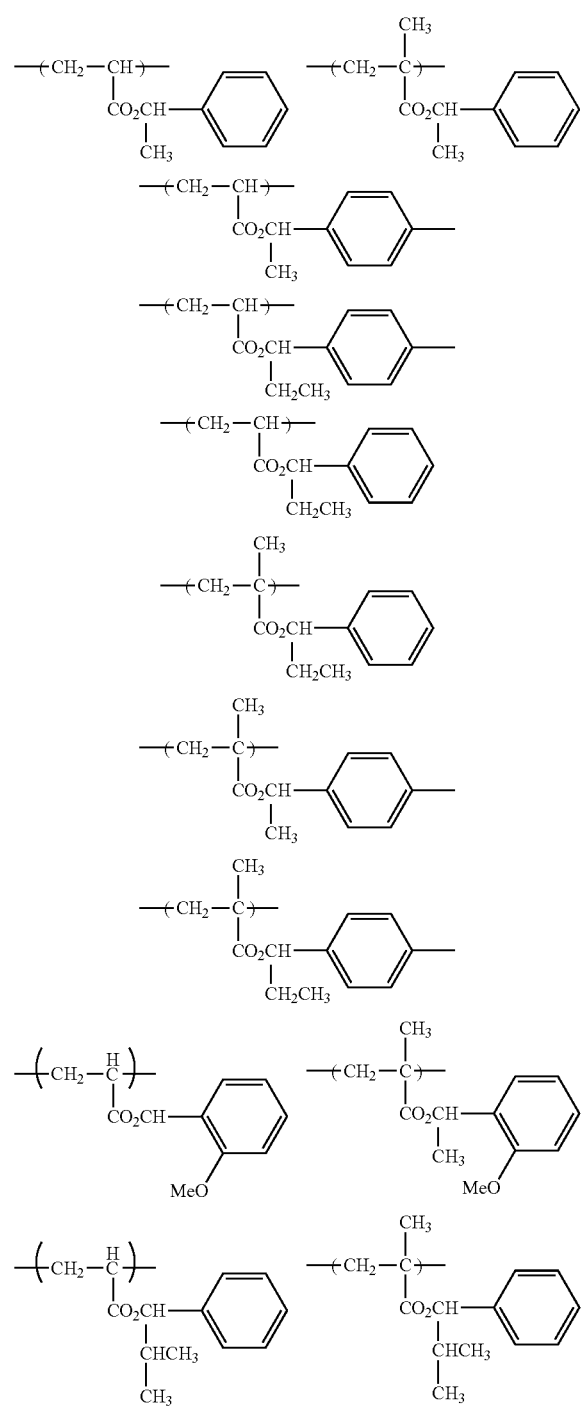

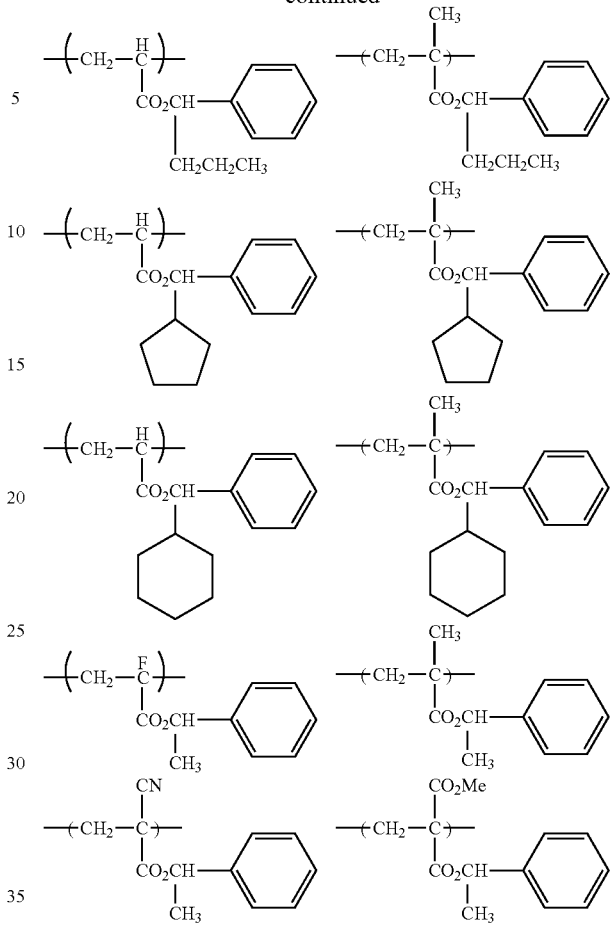

The content of the repetitive unit having an acid-decomposable group in the resin P (total content in a case where plural kinds are contained) is preferably 5 to 80 mol %, more preferably 5 to 75 mol %, and further preferably 10 to 65 mol %, with respect to all repetitive units in the resin P.

The resin P may include a repetitive unit represented by General Formula (V) or General Formula (VI).

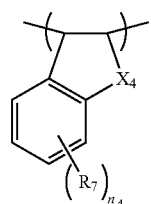

(V)

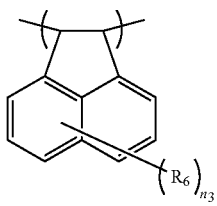

(VI)

In Formulae, $R_6$ and $R_7$ each independently indicate a hydrogen atom, a hydroxy group, an alkyl group, an alkoxy group, or an acyloxy group which has 1 to 10 carbon atoms and has a linear chain, a branched chain, or a cyclic shape, a cyano group, a nitro group, an amino group, a halogen atom, an ester group (—OCOR or —COOR: R indicates an alkyl group or a fluorinated alkyl group having 1 to 6 carbon atoms), or a carboxyl group.

$n_3$ indicates an integer of 0 to 6.

$n_4$ indicates an integer of 0 to 4.

$X_4$ indicates a methylene group, an oxygen atom, or a sulfur atom.

Specific examples of the repetitive unit represented by General Formula (V) or General Formula (VI) will be described below. However, the present invention is not limited thereto.

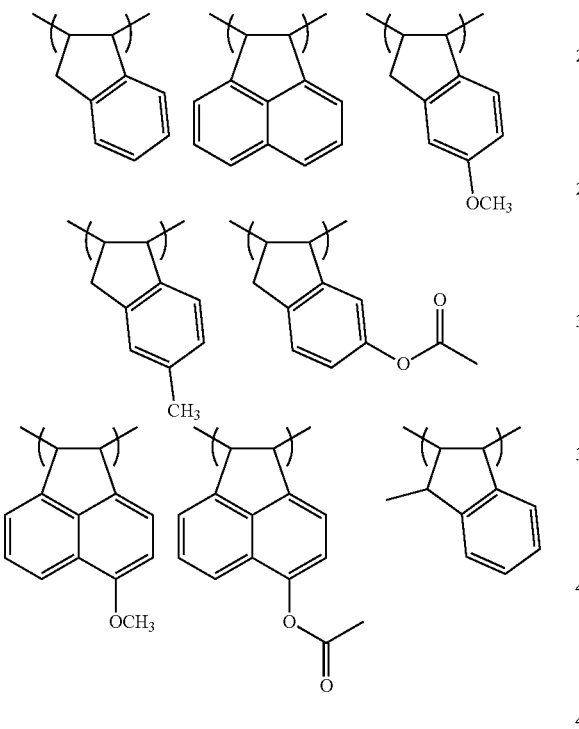

The resin P may further include a repetitive unit in which a silicon atom is provided on a side chain. Examples of the repetitive unit in which the silicon atom is provided on the side chain include a (meth)acrylate repetitive unit having a silicon atom and a vinyl repetitive unit having a silicon atom. Typically, the repetitive unit in which a silicon atom is provided on a side chain is a repetitive unit having a group in which a silicon atom is provided on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, and cyclic or linear-chain polysiloxane as follows, or a silsesquioxane structure of a cage type, a ladder type, or a random type. In the formulae, R and $R^1$ each independently indicate a monovalent substituent. * indicates a joiner.

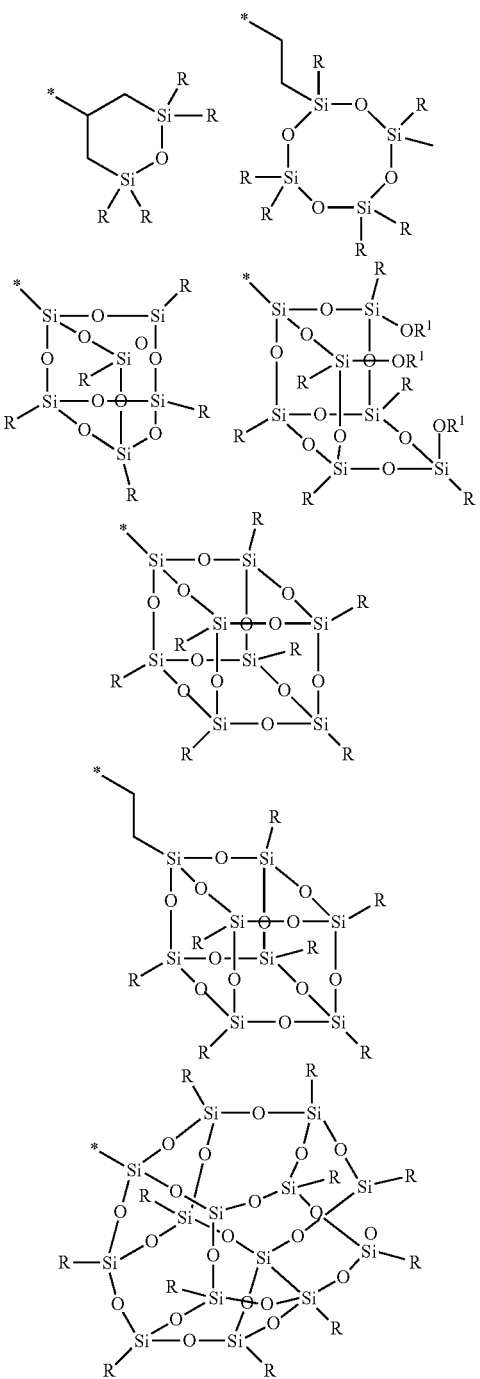

As the repetitive unit having the above group, for example, a repetitive unit derived from an acrylate or methacrylate compound having the above group or a repetitive unit derived from a compound having the above group and a vinyl group is preferable.

The repetitive unit having a silicon atom is preferably a repetitive unit having a silsesquioxane structure is preferable. Thus, in a case where a pattern which is ultra-fine (for example, line width having 50 nm or smaller) and has a sectional shape having a high aspect ratio (for example, film thickness/line width is equal to or smaller than 3) is formed, it is possible to exhibit very excellent collapse performance.

Examples of the silsesquioxane structure include a cage type silsesquioxane structure, a ladder type silsesquioxane structure, and a random type silsesquioxane structure. Among the structures, the cage type silsesquioxane structure is preferable.

Here, the cage type silsesquioxane structure refers to a silsesquioxane structure having a cage-shape skeleton. The cage type silsesquioxane structure may be a complete cage type silsesquioxane structure or an incomplete cage type silsesquioxane structure. The complete cage type silsesquioxane structure is preferable.

The ladder type silsesquioxane structure refers to a silsesquioxane structure having a ladder-shape skeleton.

The random type silsesquioxane structure refers to a silsesquioxane structure having a random skeleton.

The cage type silsesquioxane structure is preferably a siloxane structure represented by Formula (S).

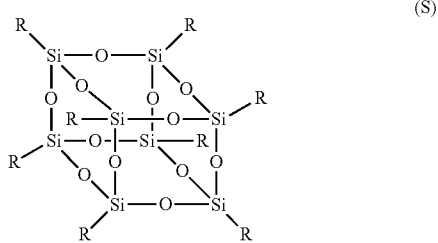

In Formula (S), R indicates a monovalent organic group. A plurality of Rs may be the same as or different from each other.

The organic group is not particularly limited. Specific examples of the organic group include a hydroxy group, a nitro group, a carboxy group, an alkoxy group, an amino group, a mercapto group, a blocked mercapto group (for example, mercapto group blocked (protected) by an acyl group), an acyl group, an imide group, a phosphino group, a phosphinyl group, a silyl group, a vinyl group, a hydrocarbon group which may have a hetero atom, a (meth)acryl group-containing group, and an epoxy group-containing group.

Examples of a hetero atom of the hydrocarbon group which may have the hetero atom include an oxygen atom, a nitrogen atom, a sulfur atom, and a phosphorus atom.

Examples of the hydrocarbon group which may have the hetero atom include an aliphatic hydrocarbon group, an aromatic hydrocarbon group, or a combination thereof.

The aliphatic hydrocarbon group may have any of a linear chain shape, a branched chain shape, or a cyclic shape. Specific examples of the aliphatic hydrocarbon group include a linear-chain or branched-chain alkyl group (in particular, 1 to 30 carbon atoms), a linear-chain or branched-chain alkenyl group (in particular, 2 to 30 carbon atoms), and a linear-chain or branched-chain alkynyl group (in particular, 2 to 30 carbon atoms).

Examples of the aromatic hydrocarbon group include aromatic hydrocarbon groups having 6 to 18 carbon atoms, such as a phenyl group, a tolyl group, a xylyl group, and a naphthyl group.

In a case where the resin P has the repetitive unit in which a silicon atom is provided on the side chain, the content thereof is preferably 1 to 30 mol %, more preferably 5 to 25 mol %, and further preferably 5 to 20 mol %, with respect to the all repetitive units in the resin P.

The weight average molecular weight of the resin P is preferably 1,000 to 200,000, more preferably 3,000 to 20,000, and further preferably 5,000 to 15,000, in terms of a polystyrene equivalent value by a gel permeation chromatography (GPC) method. Since the weight average molecular weight is set to be 1,000 to 200,000, it is possible to prevent deterioration of heat resistance and dry etching resistance. In addition, it is possible to prevent an occurrence of a situation in which developability is deteriorated, or film formability is deteriorated by increasing viscosity.

Dispersity (molecular weight distribution) is normally 1 to 5, preferably 1 to 3, more preferably 1.2 to 3.0, and further preferably 1.2 to 2.0.

In an actinic ray-sensitive or radiation-sensitive resin composition, the content of the resin P is preferably 50 to 99.9 mass %, and more preferably 60 to 99.0 mass %, with respect to the total solid content.

In the actinic ray-sensitive or radiation-sensitive resin composition, the resin P may be singly used or be used in combination of plural kinds thereof.

Regarding any of other components (for example, acid generator, basic compound, quencher, hydrophobic resin, surfactant, and solvent) included in the composition for forming a resist film, well-known components are exemplified. For example, resist compositions disclosed in JP2016-057614A, JP2014-219664A, JP2016-138219A, and JP2015-135379A can be preferably used as the composition for forming a resist film.

As a solvent of the composition for forming a resist film, the above-described chemical liquid may be used.

A coating method with the composition for forming a resist film is not particularly limited. Well-known coating methods such as a spin coating method, a spray coating method, and a dip coating method are exemplified.

After coating with the composition for forming a resist film is performed, if necessary, a dry treatment may be performed.

The thickness of the formed coated film is not particularly limited. Generally, the thickness thereof is 0.05 to 0.30 μm in many cases.

Process 2-3 is a process of forming a patterned resist film by exposing the coated film in a pattern shape and performing a developing treatment with a developer.

A method of performing exposure to have a pattern shape is not particularly limited. For example, a method of exposing the coated film via a mask having an opening portion which has a predetermined shape is exemplified. The type of light at time of performing exposure is not particularly limited. Optimal light is selected in accordance with the type of a composition for forming a resist film, which is to be used. Among various types of light, ultraviolet light or EUV light is preferable.

After exposure, if necessary, a heating treatment of heating the exposed coated film may be performed.

The type of the developer is not particularly limited. An optimal developer is selected in accordance with the type of a composition for forming a resist film, which is to be used. Among various types of developers, from a point of more improving the manufacturing yield of a semiconductor chip, it is preferable that the above-described chemical liquid is used as the developer.

The method of the developing treatment is not particularly limited, and well-known methods are exemplified. For example, a method in which a coated film subjected to an exposing treatment is coated with a developer so as to bring the coated film into contact with the developer, and a method in which a base material including a coated film which has been subjected to an exposing treatment is immersed in a developer are exemplified.

Regarding conditions (temperature of a developer, a developing time, and the like) of the developing treatment, optimal conditions are appropriately selected in accordance with the type of a developer to be used, the type of a material forming a coated film, and the like.

A predetermined patterned resist film is formed by performing the developing treatment.

The shape of an opening portion in the resist film is not particularly limited. For example, a hole shape and a line shape are exemplified.

Process 2-4 is a process of washing the patterned resist film by using a rinse liquid. It is possible to remove impurities adhering onto the patterned resist film by performing this process.

The type of the rinse liquid is not particularly limited. The optimal developer is selected in accordance with the type of a composition for forming a resist film, which is to be used. Among rinse liquids, from a point of more improving the manufacturing yield of a semiconductor chip, it is preferable that the above-described chemical liquid is used as the rinse liquid.

The method of the developing treatment is not particularly limited, and well-known methods are exemplified. For example, a method in which a coated film subjected to an exposing treatment is coated with a developer so as to bring the coated film into contact with the rinse liquid, and a method in which a base material including a coated film which has been subjected to an exposing treatment is immersed in a rinse liquid are exemplified.

As described above, the chemical liquid may be used as the pre-wet liquid, the developer, or the rinse liquid. The chemical liquid may be applied as at least two or more of the pre-wet liquid, the developer, or the rinse liquid.

In the above descriptions, a form in which the composition for forming a resist film is used is described. The procedure of this process is not limited to the above form.

For example, the patterned resist film may be a metal hard mask. The metal hard mask refers to a mask configured by a component including a metal atom, such as metal, metal oxide, metal nitride, and metal oxynitride.

The material forming the metal hard mask is not particularly limited. For example, metal, metal oxide, metal nitride, and metal oxynitride are exemplified. Among the materials, a material selected from the group consisting of Cu, Co, W, AlOx, AlN, AlOxNy, WOx, Ti, TiN, ZrOx, HfOx, and TaOx is preferable. Here, x and y indicate values represented by x=1 to 3 and y=1 to 2, respectively.

As the material forming the metal hard mask, for example, TiN, $WO_2$, and $ZrO_2$ are preferable.

A method of forming the metal hard mask is not particularly limited, and well-known methods are exemplified. For example, a method as follows is exemplified. That is, a precursor film formed from the above component is formed on the insulating layer. A resist film having a predetermined pattern is formed on the precursor film. The precursor film is etched by using the resist film as a mask. The patterned resist film is removed, and thereby a metal hard mask is formed.

Preferably, defects occur small in the formed pattern.

A method of detecting a foreign matter and a pattern defect on a wafer is not particularly limited, and a wafer top surface inspection device (SP-5; manufactured by KLA Tencor) can be used.

A semiconductor wafer is coated with the chemical liquid, and the surface of the wafer, which is coated with the chemical liquid is irradiated with a laser beam. At this time, in a case where the laser beam abuts on a foreign matter or a defect, the light is scattered, and the scattered light is detected by a detector. In this manner, the foreign matter or a defect is detected.

In a case where the irradiation with the laser beam is performed, the measurement is performed while the wafer is rotated. Thus, it is possible to determine a coordinate position of the foreign matter or the defect from a rotation angle of the wafer and a radial position of the laser beam.

Surfscan series manufactured KLA Tencor are exemplified as such a wafer top surface inspection device.

In particular, regarding evaluation of a defect, which relates to manufacturing of a fine semiconductor device which has a node of 10 nm or smaller, a wafer top surface inspection device having resolution which is equal to or greater than resolution of SP-5 is preferably used.

(Process 3: Etching Process)

Figure 3:
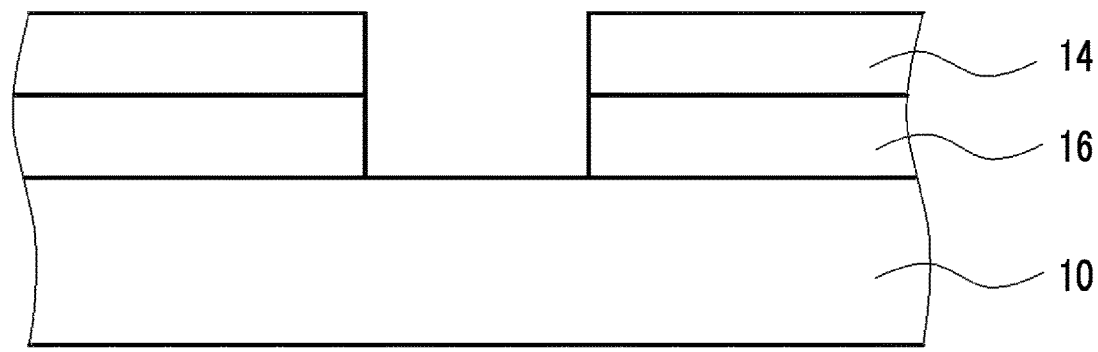
FIG. 3 is a sectional view illustrating a stacked body obtained by Process 3.

Process 3 is a process of forming an insulating layer having an opening portion by etching the insulating layer with the patterned resist film as a mask. As illustrated in FIG. 3, a patterned insulating layer 16 which has an opening portion 16a is formed on the base material 10 by performing this process.

A method of etching the insulating layer is not particularly limited. The optimal method is selected in accordance with the type of the material forming the insulating layer. Among various methods, a method using a predetermined etching gas is preferable. In particular, a method in which an insulating layer is etched by using plasma etching which uses an etching gas which includes a nitrogen gas and a halogen gas is more preferable.

In Process 3, if necessary, after the insulating layer is etched, a treatment of washing the insulating layer by using a washing liquid may be performed. The type of the washing liquid to be used is not particularly limited, and the above-described chemical liquid is preferably used.

Figure 4:
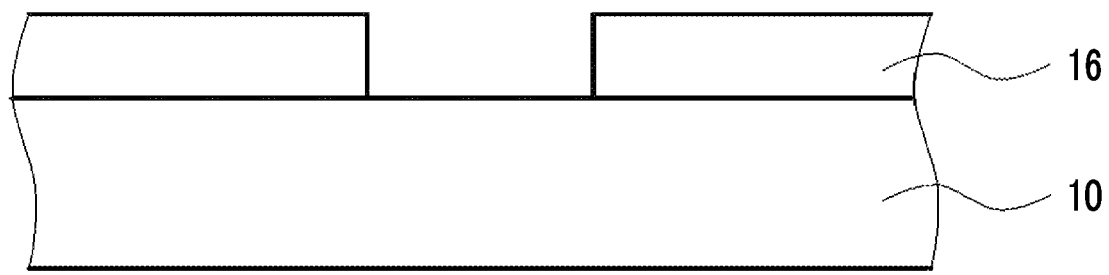
FIG. 4 is a sectional view illustrating a stacked body obtained by Process 4.

(Process 4: Resist Removing Process) Process 4 is a process of removing the patterned resist film. As illustrated in FIG. 4, a stacked body which includes the base material 10 and the patterned insulating layer 16 which has the opening portion 16a is formed by performing this process.

A method of removing the resist film is not particularly limited. The optimal method is selected in accordance with the type of the material forming the resist film. For example, an ashing treatment is exemplified. Specific examples of the ashing treatment include photo-excitation ashing and plasma ashing. In the photo-excitation ashing, irradiation with light such as ultraviolet light is performed in a chamber into which a gas such as ozone is introduced, so as to cause a chemical reaction between the gas and a resist film, and the resist film is removed by the chemical reaction. In the plasma ashing, plasma is generated from a gas by using a high-frequency wave and the like, and a resist film is removed by using the plasma. Among the methods, oxygen ashing is preferable.

In addition, a method of removing a resist film by bringing a predetermined treatment liquid (peeling liquid) into contact with the resist film is also exemplified. The type of the treatment liquid is not particularly limited. A treatment liquid which includes an alkaline component and an organic solvent is preferable.

In Process 4, it is preferable that a treatment of removing impurities which have been generated by etching performed in Process 3 is performed. In particular, in a case where plasma etching is performed as etching in Process 3, it is preferable that a treatment of removing impurities (post etching residues) which have been generated by the plasma etching is performed.

The treatment of removing impurities which have been generated by etching performed in Process 3 is preferably performed after the patterned resist film is removed.

The treatment of removing impurities is not particularly limited, and well-known methods can be used. For example, a washing treatment using a predetermined treatment liquid is exemplified. Among the methods, from a point of improving removal properties of impurities, a treatment liquid including a hydroxylamine compound is preferably used.

As the treatment liquid including a hydroxylamine compound, a commercially available product may be used. For example, chemical liquids of EKC265 and EKC270 (manufactured by Du Pont Corporation) are exemplified.

The "hydroxylamine compound" includes hydroxylamine, hydroxylamine derivatives, and salts thereof.

The hydroxylamine derivatives are not particularly limited. Examples of the hydroxylamine derivatives include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

Examples of the salts of hydroxylamine or hydroxylamine derivatives include inorganic acid salts or organic acid salts of hydroxylamine or hydroxylamine derivatives. For example, hydroxylamine nitrate, hydroxylamine sulfate, hydroxylamine hydrochloride, hydroxylamine phosphate, sulfuric acid N,N-diethylhydroxylamine, and nitric acid N,N-diethylhydroxylamine are exemplified.

The content of the hydroxylamine compound in the treatment liquid is not particularly limited. The content thereof is preferably 0.1 to 20 mass % and more preferably 1 to 10 mass %, with respect to the total mass of the treatment liquid.

The treatment liquid may further include at least one selected from the group consisting of a solvent (for example, water and organic solvent), an anticorrosive agent, polyvalent carboxylic acid, and base.

The type of the anticorrosive agent is not particularly limited. For example, an agent described as an example of an anticorrosive agent which may be included in a polishing liquid used in Process 6 which will be described later is exemplified.

The type of polyvalent carboxylic acid is not particularly limited. For example, a substance described as an example of polyvalent carboxylic acid which may be included in a washing liquid used in Process 7 which will be described later is exemplified.

The type of base is not particularly limited. For example, an amine compound is preferable and an amine compound having a cyclic structure is more preferable. Examples of the amine compound having a cyclic structure include tetrahydrofurfurylamine, N-(2-aminoethyl)piperazine, 1,8-diazabicyclo[5.4.0]-7-undecene, 1,4-diazabicyclo[2.2.2]octane, hydroxyethyl piperazine, piperazine, 2-methylpiperazine, trans-2,5-dimethylpiperazine, cis-2,6-dimethylpiperazine, 2-piperidine methanol, cyclohexylamine, and 1,5-diazabicyclo[4,3,0]-5-nonene.

In Process 4, if necessary, a treatment in which the base material comprising the insulating layer having an opening portion is washed by using a washing liquid may be performed after the resist film is removed. The type of the washing liquid to be used is not particularly limited, and the above-described chemical liquid is preferably used.

(Process 5: Metal Filling Process)

Figure 5A:
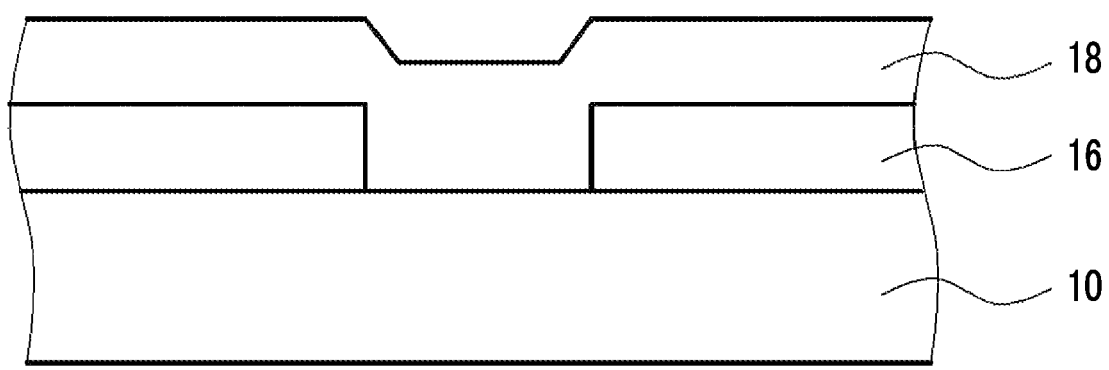
FIG. 5A is a sectional view illustrating a stacked body obtained by Process 5.

Process 5 is a process of filling the opening portion of the insulating layer with metal. As illustrated in FIG. 5A, a metal film 18 is formed by performing this process, so as to fill the opening portion 16a of the insulating layer 16. In FIG. 5A, the metal film 18 is formed so as to embed the opening portion of the insulating layer 16 and to cover the insulating layer 16. However, it is not limited to this form. A form of filling (embedding) the opening portion of the insulating layer may be made.

A method of filling the opening portion of the insulating layer with metal is not particularly limited, and well-known methods are exemplified. For example, a physical vapor deposition method, a chemical vapor deposition method, and a plating method are exemplified.

The type of metal used for filling is not particularly limited. From a point of more improving characteristics as a metal interconnection, Cu, Al, Co, W, Ta, TaN, Ti, TiN, Ru, Mn, and alloys thereof are preferable as the metal.

In this specification, TiN and TaN are handled as a metal component. That is, in this specification, TiN and TaN are considered as one component of the metal.

Among the methods, in this process, a method including the following two processes is exemplified.

Process 5-1: process of filling the opening portion of the insulating layer with first metal selected from the group consisting of Ta, TaN, Ti, TiN, Ru, Mn, and an alloy thereof, and Process 5-2: process of further filling the opening portion which has been filled with the first metal, with second metal selected from the group consisting of Cu, Al, Co, W, and an alloy thereof.

Figure 5B:
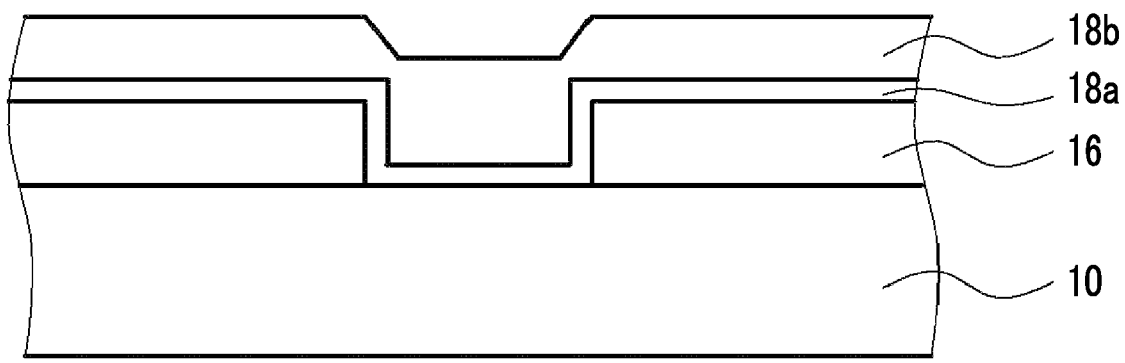
FIG. 5B is a sectional view illustrating a stacked body obtained by a modification example of Process 5.

As illustrated in FIG. 5B, a layered film is formed by performing Process 5-1 and Process 5-2. The layered film is configured from a first metal film 18a formed from the first metal, and a second metal film 18b formed from the second metal. The first metal film formed from the first metal functions as a so-called barrier film. The second metal film formed from the second metal functions as an interconnection area.

(Process 6: Chemical-Mechanical Polishing (CMP) Process)

Figure 6A:
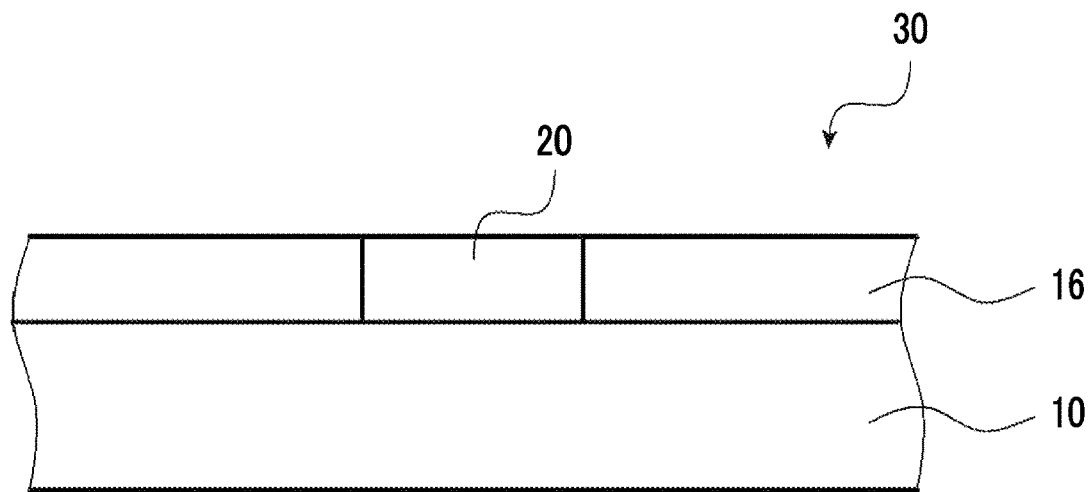
FIG. 6A is a sectional view illustrating a stacked body obtained by Process 6.

Process 6 is a process of performing chemical-mechanical polishing on the insulating layer filled with metal. As illustrated in FIG. 6A, a metal interconnection 20 is formed on the insulating layer 16 by performing this process. The metal interconnection 20 is formed by a flattening treatment which is performed by chemical-mechanical polishing. The remaining metal is removed in the metal interconnection 20, and the metal interconnection 20 is embedded in the insulating layer 16. A semiconductor chip 30 which includes the base material 10 and the insulating layer 16 in which the metal interconnection 20 is embedded is obtained by the above procedures.

The method of performing chemical-mechanical polishing is not particularly limited, and well-known methods are employed. Examples of the method of performing chemical-mechanical polishing include a method in which, while a polishing liquid is supplied to a polishing pad attached to a polishing plate, a polishing target surface of a polishing target body is brought into contact with the polishing pad, the polishing body and the polishing pad are relatively moved, and thus the polishing target surface is polished.

It is preferable that the polishing liquid is continuously supplied to the polishing pad on the polishing plate by a pump during a period of polishing the polishing target surface. The supplied amount is not limited. The amount as much as the surface of the polishing pad is normally covered with the polishing liquid is preferable.

Regarding polishing conditions such as polishing pressure and the rotation speed of the polishing plate, optimal conditions are selected in accordance with the type of the polishing target body and the type of the polishing liquid.

The type of the polishing liquid to be used is not particularly limited, and well-known polishing liquids are exemplified.

The polishing liquid may include abrasive grains. Examples of the abrasive grain include inorganic abrasive grains of silica, alumina, zirconia, ceria, titania, germania, silicon carbide, and the like; and organic abrasive grains of polystyrene, polyacryl, polyvinyl chloride, and the like. Among the grains, from a point of excellent dispersion stability in the polishing liquid, and a point of the small number of polishing scratches occurring by CMP, a silica particle (colloidal silica) is preferable as the abrasive grain.

The polishing liquid may include organic acid. The organic acid is not particularly limited, and well-known organic acids are exemplified. Amino acid (for example, glycine, alanine ($\alpha$-alanine and/or $\beta$-alanine), arginine, isoleucine, and leucine) is preferable.

Examples of organic acid other than amino acid include 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, and malic acid.

The polishing liquid may include an anticorrosive agent. The anticorrosive agent has a function of forming a film by adhering to a polishing target surface of a polishing target body, so as to control corrosion of metal. The anticorrosive agent is not particularly limited, and well-known anticorrosive agents are exemplified. An azole compound is preferable. The azole compound means a compound which contains a complex five-member ring which contains one nitrogen atom or more. The number of nitrogen atom is preferably 1 to 4. The azole compound may contain an atom other than the nitrogen atom, as the hetero atom.

Examples of the azole compound include compounds having skeletons as follows: a pyrrole skeleton, an imidazole skeleton, a pyrazole skeleton, an isothiazole skeleton, an isoxazole skeleton, a triazole skeleton, a tetrazole skeleton, an imidazole skeleton, a thiazole skeleton, an oxazole skeleton, a thiadiazole skeleton, an oxadiazole skeleton, and a tetrazole skeleton.

The polishing liquid may include an oxidant. Examples of the oxidant include hydrogen peroxide, peroxide, nitric acid, nitrate, iodate, periodate, hypochlorite, chlorite, chlorate, perchlorate, persulfate, dichromate, permanganate, silver (II) salts, and iron (III) salts.

Each of the abrasive grain, the organic acid, the anticorrosive agent, and the oxidant may be used singly or may be used in combination of two kinds or more thereof.

The polishing liquid may include other components (for example, solvent (water of organic solvent), a charge control agent, a surfactant, a hydrophilic polymer, and a chelating agent) other than the above components.

The polishing liquid may include the above-described chemical liquid as a solvent.

pH of the polishing liquid is not particularly limited. Generally, pH thereof is preferably 1 to 14.

In Process 6, the type of the polishing liquid may be changed, and thus chemical-mechanical polishing may be performed in stages.

Process 6 preferably includes Process 6-1 of performing chemical-mechanical polishing with a polishing liquid A including amino acid. In particular, it is preferable that Process 6-1 is performed in a case where the second metal (in particular, copper) is removed.

Process 6 preferably includes Process 6-2 of performing chemical-mechanical polishing with a polishing liquid B which includes organic acid and exhibits alkalinity. In particular, it is preferable that Process 6-2 is performed in a case where the first metal (in particular, Ti) is removed.

Figure 6B:
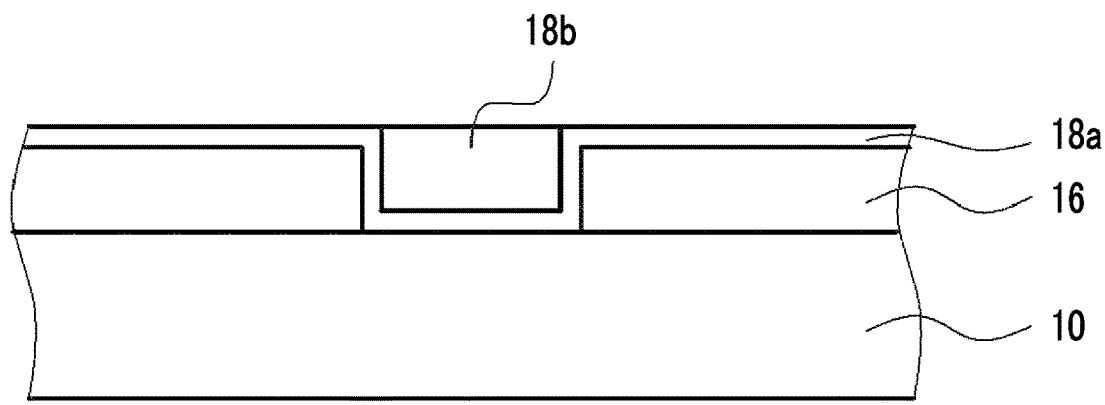
FIG. 6B is a sectional view illustrating a stacked body obtained after first chemical-mechanical polishing is performed in a case where chemical-mechanical polishing is performed at second stages in Process 6.
Figure 6C:
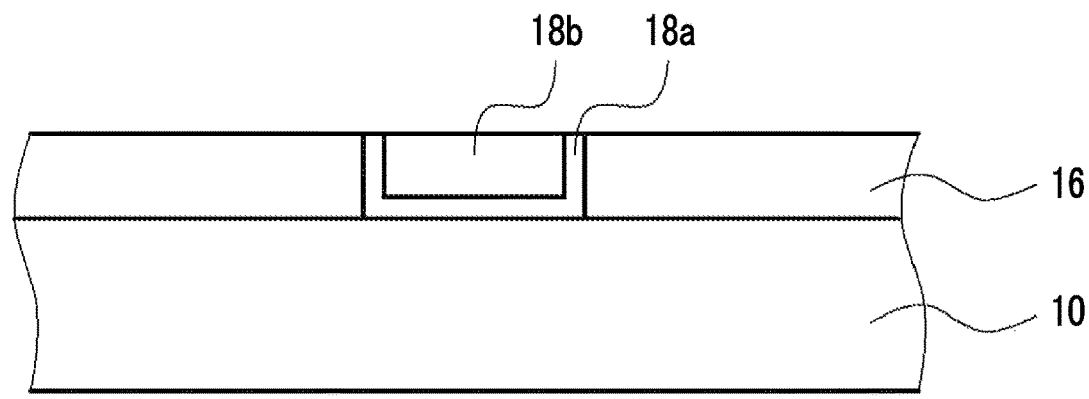
FIG. 6C is a sectional view illustrating a stacked body obtained after second chemical-mechanical polishing is performed in a case where the chemical-mechanical polishing is performed at the second stages in Process 6.

In Process 6, it is preferable that Process 6-1 and Process 6-2 are performed in this order. As described above, in a case where Process 6-1 and Process 6-2 are performed in this order, as illustrated in FIG. 6B, procedures as follows are preferable. That is, the first metal film 18a formed from the first metal is removed until the second metal film 18b formed from the second metal is exposed, in Process 6-1. Then, as illustrated in FIG. 6C, the first metal film 18a and the second metal film 18b are removed until the insulating layer 16 is exposed.

As amino acid included in the polishing liquid A, the above-described amino acid is exemplified.

The content of amino acid in the polishing liquid A is not particularly limited. The content thereof is preferably 1 to 20 mass %, and more preferably 1 to 5 mass %, with respect to the total mass of the polishing liquid A.

The polishing liquid A may include at least one of the abrasive grain, the anticorrosive agent, the oxidant, or other components which are described above, in addition to amino acid.

As organic acid included in the polishing liquid B, the above-described organic acid is exemplified. Polyvalent carboxylic acid (compound having a plurality of carboxyl groups) is preferable. As the organic acid included in the polishing liquid B, organic acid other than amino acid is preferable.

The content of organic acid in the polishing liquid B is not particularly limited. The content thereof is preferably 0.01 to 10 mass %, and more preferably 0.1 to 5 mass %, with respect to the total mass of the polishing liquid B.

The polishing liquid B exhibits alkalinity and pH thereof is preferably 8.5 to 10.5.

The polishing liquid B may include at least one of the abrasive grain, the anticorrosive agent, the oxidant, or other components which are described above, in addition to organic acid.

In particular, in a case where filling with copper is performed in Process 5, a polishing liquid which includes a silica particle, glycine, two kinds or more of anticorrosive agents, and hydrogen peroxide, and has pH of 6 to 8 is preferable as the polishing liquid to be used in Process 6.

The manufacturing method of a semiconductor chip in the present invention may include a process other than Process 1 to Process 6.

For example, a process of forming an etching stopper layer on the base material may be provided before Process 1. Examples of the material forming the etching stopper layer include aluminum oxide and silicon nitride.

It is preferable that Process 7 of performing a washing treatment on the insulating layer subjected to chemical-mechanical polishing, with a washing liquid including polyvalent carboxylic acid is provided after Process 6.

Further, a process of further performing a washing treatment on the insulating layer subjected to chemical-mechanical polishing, with various solvents may be provided after Process 7.

The type of polyvalent carboxylic acid included in the washing liquid to be used in Process 7 is not particularly limited. Examples of polyvalent carboxylic acid include dicarboxylic acid (such as oxalic acid, malonic acid, succinic acid, glutaric acid, adipic acid, pimelic acid, suberic acid, azelaic acid, maleic acid, itaconic acid, phthalic acid, terephthalic acid, and sebacic acid), tricarboxylic acid (such as trimellitic acid and citric acid), tetracarboxylic acid (such as pyromellitic acid, butanetetracarboxylic acid, cyclopentanetetracarboxylic acid, and ethylenediamine tetraacetic acid), and pentacarboxylic acid (such as diethylenetriamine pentaacetic acid).

The washing liquid may include other components other than polyvalent carboxylic acid. Examples of other components include water, a surfactant, and an organic solvent.

Figure 7:
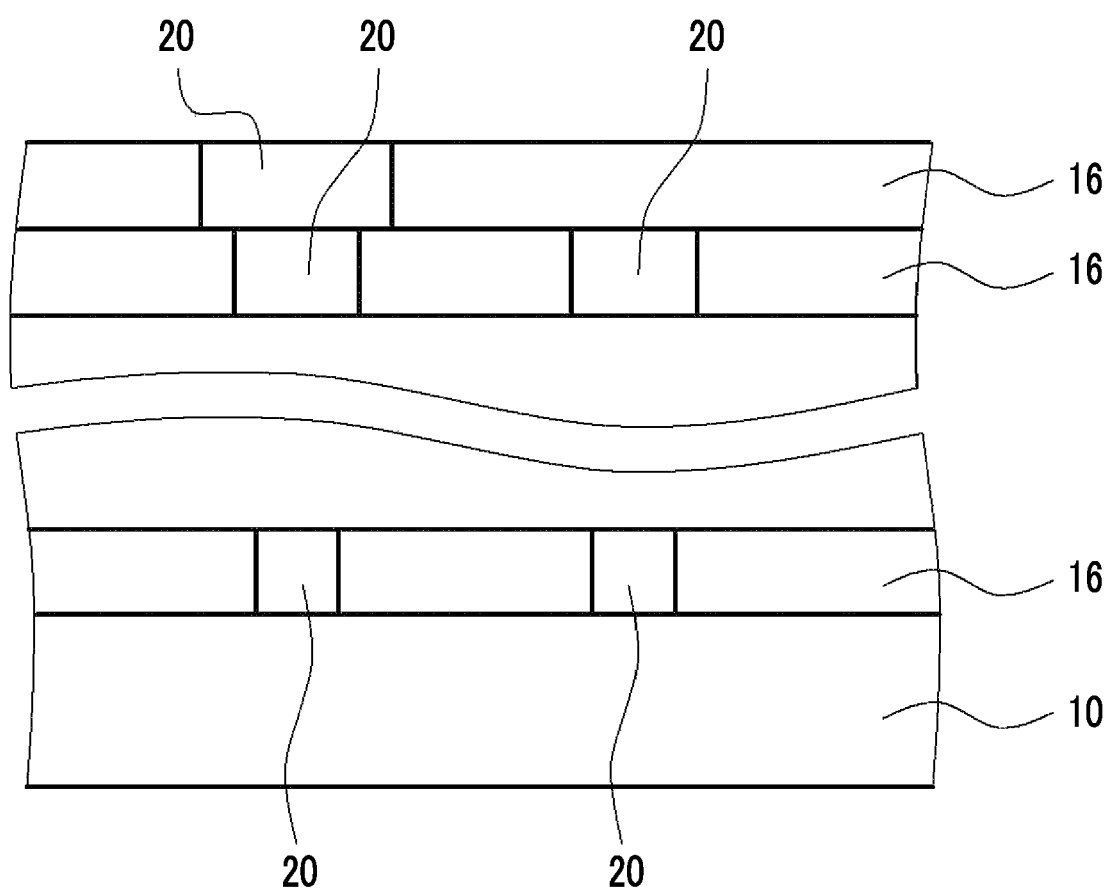
FIG. 7 is a sectional view illustrating a semiconductor chip having a multilayer interconnection structure.

An insulating layer in which a metal interconnection is embedded can be formed by performing the above procedures. After Process 1 to Process 6 are performed, some or all of Process 1 to Process 6 are repeated more. Thus, as illustrated in FIG. 7, a multilayer interconnection structure body in which a plurality of insulating layers 16 in which the metal interconnection 20 is embedded are stacked can be formed.

The number of insulating layers in which the metal interconnection is embedded and which are stacked on each other is not particularly limited. Two layers or more are preferable and eight layers or greater are more preferable. The upper limit of the number of stacked layers is not particularly limited. The upper limit thereof is equal to or smaller than 15 in many cases.

The type of metal forming the metal interconnection embedded in each of the insulating layers may vary for each of the layers. For example, a form in which a metal interconnection embedded in the first to fifth insulating layers is configured from Co, and a metal interconnection embedded in the sixth to fifteenth insulating layers is configured from Cu is exemplified.

Considering the purpose of a use of the chemical liquid, in a case where the above-described chemical liquid is used as the washing liquid or the developer, the advantage of the present invention is improved. Thus, it is preferable that the chemical liquid is used as the washing liquid.

That is, the above-described chemical liquid is preferably used as at least a washing liquid, and further preferably used as the washing liquid and the developer. It is further preferable that the chemical liquid is also used as the rinse liquid in this state.

In an aspect of the process which uses the above-described chemical liquid, the chemical liquid is preferably used in at least one process of Process 3, Process 4, Process 6, or Process 7. The chemical liquid is more preferably used in at least one process of Process 4, Process 6, or Process 7, and further preferably used in at least one process of Process 6 or Process 7.

That is, the above-described chemical liquid is preferably used in at least Process 6 and Process 7, more preferably used in Process 4, Process 6, and Process 7, further preferably used in Process 3, Process 4, Process 6, and Process 7, and particularly preferably used in all of Process 1 to Process 7.

The above-described chemical liquid is preferably used for at least one of the pre-wet liquid, the developer, or the rinse liquid, more preferably used for at least two thereof, and further preferably used for all thereof.

Among the three liquids of the pre-wet liquid, the developer, and the rinse liquid, the above-described chemical liquid is preferably used for the developer.

For example, the above-described chemical liquid may be used for any one of the pre-wet liquid, the developer, and the rinse liquid, and chemical liquids other than the above-described chemical liquid may be used as the remaining liquids.

In the manufacturing method of a semiconductor chip according to the present invention, a kit including two or more selected from the group consisting of the pre-wet liquid, the developer, the rinse liquid, the polishing liquid, and the composition for forming a resist film can be suitably applied.

All of the pre-wet liquid, the developer, the rinse liquid, the polishing liquid, or the composition for forming a resist film include a chemical liquid X as follows.

Chemical liquid X: including an organic solvent and metal impurities including at least one metal atom selected from the group consisting of a Fe atom, a Cr atom, a Ni atom, and a Pb atom and in which the total content of the metal atom is 0.001 to 100 mass ppt.

As the kit, a kit including the rinse liquid and the composition for forming a resist film is preferable, and a kit including the rinse liquid, the composition for forming a resist film, and the developer is more preferable.

In a case where a multilayer interconnection structure body is manufactured by performing Process 1 to Process 6 which are described above, each of Process 1 to Process 6 is preferably performed in a case where at least the first insulating layer in which a metal interconnection is embedded, from a base material side of the multilayer interconnection structure body is manufactured. More preferably, each of Process 1 to Process 6 is performed in a case where at least the first to fifth insulating layers in which a metal interconnection is embedded are manufactured. Further preferably, each of Process 1 to Process 6 is performed in a case where at least the first to tenth insulating layers in which a metal interconnection is embedded are manufactured. In the multilayer interconnection structure body, a metal interconnection in an insulating layer which is closer to a base material side has a finer structure. Thus, a defect more easily occurs in a metal interconnection which is closer to the base material side, and the metal interconnection which is closer to the base material side more largely influences forming of an upper layer. Therefore, it is preferable that Process 1 to Process 6 are performed in a case where an insulating layer in which a metal interconnection close to the base material side is embedded is manufactured.

In a case where a multilayer interconnection structure body is manufactured by performing Process 1 to Process 6, it is preferable that a multilayer interconnection structure body in which a half pitch of a metal interconnection in a layer (bottom layer) disposed to be closest to the base material side is equal to or smaller than 25 nm is manufactured. More preferably, a multilayer interconnection structure body in which the half pitch is equal to or smaller than 20 nm is manufactured. Further preferably, a multilayer interconnection structure body in which the half pitch is equal to or smaller than 10 nm is manufactured. In a case of the above form, the advantage obtained by performing Process 1 to Process 6 is more exhibited.

The pitch is obtained by summing one interconnection width and an interconnection distance between metal interconnections which are regularly arranged. The half pitch means the length corresponding to the half of the pitch.

With the above procedures, it is possible to manufacture a semiconductor chip having favorable manufacturing yield.

The semiconductor chip can be applied to, for example, a personal computer, an office automation (OA) device (for example, facsimile (FAX)), a communication product (for example, telephone), a portable terminal (for example, tablet and smart phone), an audio-visual (AV) apparatus (for example, television, a video camera, and a music player), an entertainment device (for example, game machine), home appliances (for example, microwave oven, washing machine, and air conditioner), infrastructure equipment (for example, train, broadcast equipment, vending machine, and bank automatic teller machine (ATM)), automation equipment (for example, industrial robot and surveillance camera), and an automotive electrical component (for example, automobile and car navigation system).

EXAMPLES

The present invention will be more specifically described below based on examples. A material, a use amount, a ratio, treatment details, treatment procedures, and the like which will be described the following examples can be appropriately changed in a range without departing from the gist of the present invention. Accordingly, the range of the present invention should not be interpreted restrictively by the following examples. "%", "ppt", and "ppm" are based on the mass, so long as particular statements are not made.

<Preparation of Chemical Liquid>

Chemical liquids in examples and comparative examples are respectively prepared by performing the following purification treatment on a raw material solution. A raw material solution having a high purity grade in which purity is equal to or greater than 99 mass % was used.

Specifically, regarding preparation of each chemical liquid, the raw material solution was caused to pass through the following filter and/or the following moisture adjustment means, and thus concentration of each component was adjusted.

First metal ion absorption filter (15 nm IEX PTFE (filter which is made of PTFE, has a sulfo group on the surface of a base material, and has a pore size of 15 nm) manufactured by Entegris Inc.)

Particle removal filter (12 nm PTFE (filter which is made of PTFE and has a particle removal diameter of 12 nm) manufactured by Entegris Inc.)

Second metal ion absorption filter (15 nm IEX PTFE (filter which is made of PTFE, has a sulfo group on the surface of a base material, and has a pore size of 15 nm) manufactured by Entegris Inc.)

Organic impurity absorption filter (special filter A (filter which is disclosed in JP2013-150979A and in which activated carbon is stuck to nonwoven fabric))

Moisture adjustment means including MOLECULAR SIEVE 3A (manufactured by UNION SHOWA Corporation, dehydrating agent)

The number of times of passing through the filter and/or the moisture adjustment means and the type of a raw material solution to be used were adjusted, and thus a chemical liquid having a composition ratio in each of the examples and the comparative examples was prepared.

In a case where the chemical liquids in the examples and the comparative examples were prepared, all processes relating to preparation of the chemical liquid, filling, storing, and analysis measurement were performed in a clean room having a level which satisfied ISO Class 2 or smaller. In order to improve measurement accuracy, regarding measurement of the content of organic impurities and measurement of the content of a metal atom, in a case where measurement in a range which was equal to or lower than a detection limitation in general measurement was performed, measurement was performed in a state where the chemical liquid was condensed to be 1/100 in terms of volume. Then, the value was converted into concentration of a solution before condensation, and thus the content was calculated.

<Measurement of Contents of Organic Solvent and Organic Impurities>

The contents of an organic solvent and organic impurities in the chemical liquid produced in each of the examples and the comparative examples were measured by using a gas chromatography mass spectrometry device (trade name of "GCMS-2020", manufactured by Shimadzu Corporation).

(Measurement Condition)

Capillary column: InertCap 5 MS/NP, 0.25 mmI.D., ×30 m, df-0.25 µm

Sample introduction method: split 75 kPa, constant pressure

Temperature of vaporizing chamber: 230° C.

Temperature of column oven: 80° C. (2 min) to 500° C. (13 min)

Heating rate: 15° C./min

Carrier gas: helium

Septum purge flow rate: 5 mL/min

Split ratio: 25:1

Interface temperature: 250° C.

Temperature of Ion source: 200° C.

Measurement mode: Scan

Sample introduction amount: 1 µL

<Content of Metal Atom Included in Metal Impurities>

The content of metal atoms included in metal impurities in the chemical liquid produced in each of the examples and the comparative examples was measured by using Agilent 8800 Triple Quadrupole ICP-MS (used for analyzing a semiconductor, Opt. #200).

(Measurement Condition)

As a sample introduction system, a quartz torch, a coaxial type PFA (perfluoroalkoxy alkane) nebulizer (self-priming), and a platinum interface corn were used. Measurement parameters of a cool plasma condition are as follows.

RF (Radio Frequency) output (W): 600

Carrier gas flow rate (L/min): 0.7

Make-up gas flow rate (L/min): 1

Sampling depth (mm): 18

<Content of Water>

The content of water included in the chemical liquid produced in each of the examples and the comparative examples was measured by a Karl Fischer moisture meter (produce name of "MKC-710M", manufactured by KYOTO ELECTRONICS MANUFACTURING CO., LTD., Karl Fischer coulometric titration type).

<Number of Coarse Particles>

The number of coarse particles included in the chemical liquid produced in each of the examples and the comparative examples was measured by the following method.

Firstly, the chemical liquid in each of the examples and the comparative examples was in a clean bottle and the bottle was scaled. The bottle was left at room temperature for one day. Regarding the chemical liquid after being left, the number of particles which were included in 1 mL and had a size of 100 nm or greater was counted five times and an average value thereof was used as the number of coarse particles. The counting was performed by using a light scattering type in-liquid particle counter (manufactured by RION Co., Ltd., type number: KS-18F, light source: semiconductor laser excitation solid state laser (wavelength of 532 nm, rated output of 500 mW), flow rate: 10 mL/min, measurement principle is based on a dynamic light scattering method).

The light scattering type in-liquid particle counter was used after being verified with a Polystyrene Latex (PSL) standard particle liquid.

Example 1

A semiconductor substrate including a field effect transistor was manufactured in accordance with a method in U.S. Pat. No. 8,669,617B. An insulating layer in which a via for electrically connecting a source electrode, a drain electrode, and a gate electrode of the field effect transistor to each other was embedded was formed on the semiconductor substrate including the field effect transistor. The obtained stacked body was used below as "a base material".

The insulating layer was formed on the obtained base material by a physical vapor deposition method (see FIG. 1). The material used in forming the insulating layer is tetraethyl orthosilicate (TEOS) and the insulating layer corresponds to a film including a silicon atom.

A pre-wet liquid described in Table 1 was applied onto the obtained insulating layer. Then, a coated film was formed by coating the insulating layer coated with the pre-wet liquid, with a composition for forming a resist film. Exposing (ArF light source) was performed on the obtained coated film so as to have a pattern shape. A developing treatment was performed by using a developer described in Table 1, and thus a patterned resist film was formed (see FIG. 2).

The composition ratio of the composition for forming a resist film, which was used in the above description was as follows.

(Composition Ratio of Composition for Forming Resist Film)

Acid-decomposable resin (resin represented by the following formula (weight average molecular weight (Mw) of 7500): numerical value described in each repetitive unit means mol %): 100 mass parts

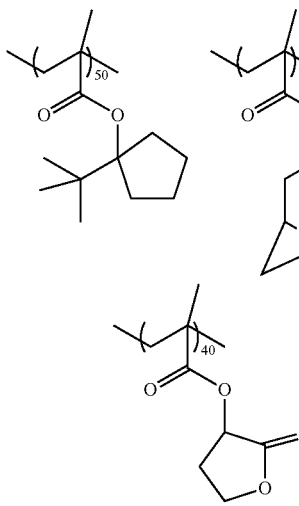

Photoacid generator represented as follows: 8 mass parts

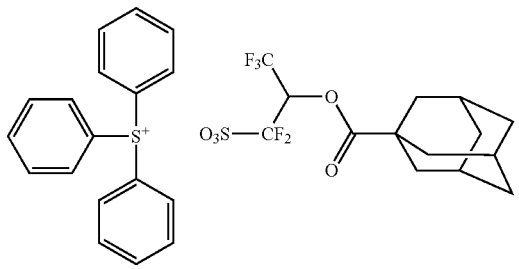

Quencher represented as follows: 5 mass parts (mass ratio was set to be 0.1:0.3:0.3:0.2 in an order from the left). Among the following quenchers, a polymer type has a weight average molecular weight (Mw) of 5000. A numerical value described in each repetitive unit means a molar ratio.

Hydrophobic resin represented as follows: 4 mass parts (mass ratio was set to be 0.5:0.5 in an order from the left)

Among the following hydrophobic resins, a hydrophobic resin on the left side has a weight average molecular weight (Mw) of 7000, and a hydrophobic resin on the right side has a weight average molecular weight (Mw) of 8000. In each of the hydrophobic resins, a numerical value described in each repetitive unit means a molar ratio.

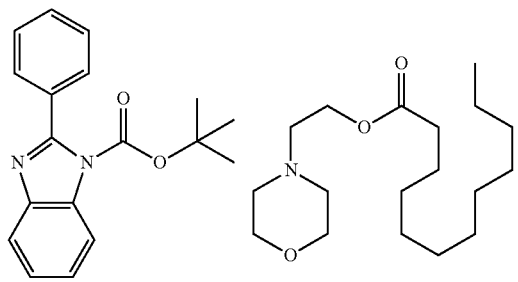

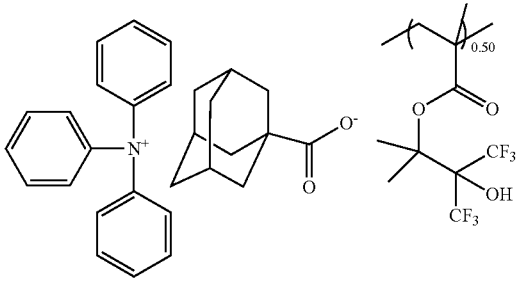

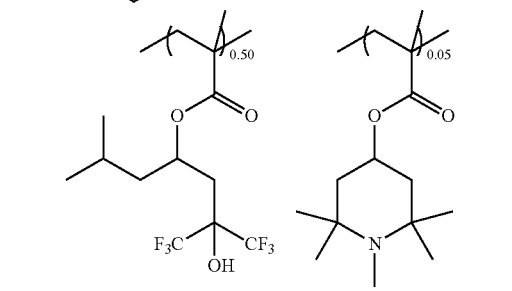

Hydrophobic resin represented as follows: 4 mass parts (mass ratio was set to be 0.5:0.5 in an order from the left)

Among the following hydrophobic resins, a hydrophobic resin on the left side has a weight average molecular weight (Mw) of 7000, and a hydrophobic resin on the right side has a weight average molecular weight (Mw) of 8000. In each of the hydrophobic resins, a numerical value described in each repetitive unit means a molar ratio.

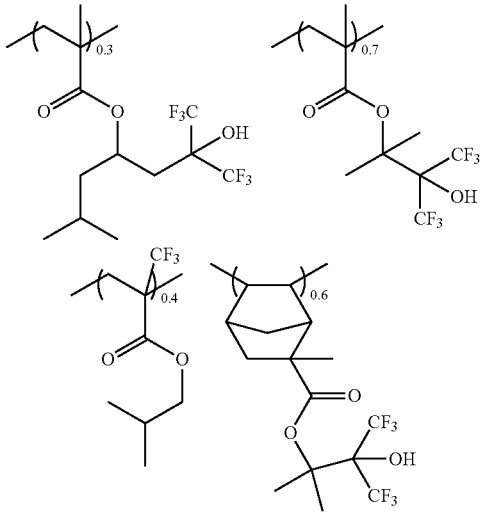

Solvent:
PGMEA (propylene glycol monomethyl ether acetate): 3 mass parts
Cyclohexanone: 600 mass parts
γ-BL (γ-butyrolactone): 100 mass parts
The total concentration of the concentration of a Fe atom, the concentration of a Cr atom, the concentration of a Ni atom, and the concentration of a Pb atom in the solvent was greater than 100 mass ppt.

An etching treatment of the insulating layer was performed by using the obtained patterned resist film as a mask (see FIG. 3). The etching treatment was performed by plasma etching with an etching gas which included a nitrogen gas and a halogen gas.

Then, the patterned resist film was removed by oxygen ashing. Then, a washing treatment of removing unnecessary residues formed by the etching treatment was performed by using a treatment liquid (washing liquid X) including a hydroxylamine compound.

Then, a metal film which included a film (corresponding to a barrier film) formed from Ti and a film formed from Co was sequentially formed on the obtained insulating layer having an opening portion, by a chemical vapor deposition method, and thereby the opening portion was filled (see FIG. 5B).

Regarding a base material having the obtained metal film, an unnecessary part of the metal film was removed by chemical-mechanical polishing. Then, a flattening treatment was performed, and thereby an insulating layer in which a metal interconnection was embedded was formed (see FIG. 6A). At this time, chemical-mechanical polishing was performed in stages by using two kinds of polishing liquids. Specifically, polishing was performed by using a solution obtained by diluting CSL9044C (manufactured by FFPS Corporation) 10 times, as a polishing liquid, until the film formed from Ti was exposed (see FIG. 6B). Then, polishing was performed by using a solution obtained by diluting BSL8178C (manufactured by FFPS Corporation) two times, as a polishing liquid, until flattening was ended (see FIG. 6C).

CSL9044C was a solution including glycine. BSL8178C was a solution including polyvalent carboxylic acid other than amino acid.

After polishing, the obtained insulating layer in which a metal interconnection was embedded was washed by using Clean-100 (manufactured by Wako Pure Chemical Industries, Ltd.). Further, a washing treatment with water and a washing treatment with isopropanol was sequentially performed.

Citric acid was included in Clean-100.

While a forming position of a metal interconnection, the type of metal, and the like were changed, the above procedures were performed 15 times, and thereby a semiconductor chip was produced (see FIG. 7). A metal interconnection embedded in the first to fifth insulating layers was configured from Co. A metal interconnection embedded in the sixth to fifteenth insulating layers was configured from Cu.

<Defect Evaluation>

The number of defects on a pattern of a wafer on which the patterned resist film was formed was measured by using a pattern defect apparatus (manufactured by Hitachi High-Technologies Corporation, multipurpose SEM (scanning electron microscope) "Inspago" RS6000 series). Results were evaluated based on criteria as follows.

—Evaluation Criteria—

"A": the number of defects was equal to or smaller than 30.

"B": the number of defects was greater than 30 and equal to or smaller than 50.

"C": the number of defects was greater than 50 and equal to or smaller than 100.

"D": the number of defects was greater than 100 and equal to or smaller than 150.

"E": the number of defects was greater than 150.

<Productivity Evaluation>

Five tests based on the following Japan Electronics and Information Technology Industries Association (JEITA) which relates to each semiconductor chip were performed by using 100 semiconductor chips which had been produced by the above procedures. Regarding the standard of a pass rate, in a case where a characteristic change rate after a resistance test, with respect to an initial state was within 5%, it was determined that there was no problem.

(1) "EIAJ ED-4701/101"
(2) "EIAJ ED-4701/102"
(3) "EIAJ ED-4701/201"
(4) "EIAJ ED-4701/202"
(5) "EIAJ ED-4701/103"

The test was performed, and the number of semiconductor chips which passed all tests was counted. Evaluation was performed based on the following criteria.

"A": no problem in all semiconductor chips.
"B": no problem in 98 to 99 semiconductor chips.
"C": no problem in 95 to 97 semiconductor chips.
"D": no problem in 90 to 94 semiconductor chips.
"E": there was a problem in 11 semiconductor chips or greater.

Examples 2 to 22 and 40 to 57 and Comparative Examples 1 to 2

As shown in Table 1, a semiconductor chip was manufactured by procedures similar to those in Example 1 except that the types of the pre-wet liquid and the developer were changed. Then, various evaluations were performed. Table 1 collectively shows results.

Regarding Example 8, after the developing treatment was performed by using a developer described in Table 1, the washing treatment was performed by using a rinse liquid (MIBC: 4-methyl-2-pentanol) described in Table 1. Thereby, a patterned resist film was formed, and a semiconductor chip was manufactured.

MIBC included organic impurities, moisture, metal atoms and coarse particles, as follows.

Amount of organic impurities: 1250 mass ppm
Moisture: 0.5 mass %
Fe atom: 5 mass ppt
Cr atom: 1 mass ppt
Ni atom: 2 mass ppt
Pb atom: 1 mass ppt
Other metal: 21 mass ppt
Number of coarse particles: 15 pieces/mL "Others" in the field of "metal atom (ppt)" in Table 1 indicates the amount of other metal atoms except for a Fe atom, a Cr atom, a Ni atom, and a Pb atom.

"Total (1)" in the field of "metal atom (ppt)" in Table 1 indicates the total content of the Fe atom, the Cr atom, the Ni atom, and the Pb atom. "Total (2)" indicates the total content of the Fe atom, the Cr atom, the Ni atom, the Pb atom, and other metal atoms.

In Table 1, the content of an organic solvent corresponded to "the remainder" obtained by subtracting the content of organic impurities, the content of water, and the content of metal impurities from the total mass of the chemical liquid. In all of the examples and the comparative examples, the content of the organic solvent was equal to or smaller than 98 mass %.

In Table 1, ">0.001" means being less than 0.001 mass ppt.

In Table 1, there was a form in which "6000 mass ppm" of organic impurities was included. However, in this form, two kinds or more of organic impurities were included.

In Table 1, "ER" indicates ethylene rubber. "EN" indicates an addition polymer of 5-ethylidene-2-norbornene. "EP" indicates ethylene propylene rubber.

TABLE 1

| | Pre-wet liquid | | | | | | | | | | |
|---|---|---|---|---|---|---|---|---|---|---|---|
| | Organic impurity | | | | | | | | | | Number (pieces/mL) |
| | | Content | | Moisture | | Metal atom (mass ppt) | | | | | |
| | Type | (mass ppt) | Type | (mass %) | Fe | Cr | Ni | Pb | Total (1) | Others | Total (2) | of coarse particles |
| Example 1 | PGME | 650 | DOP | 0.10% | 2 | 1 | 3 | 1 | 7 | 15 | 22 | 8 |
| Example 2 | PGEE | 490 | DOP | 0.10% | 3 | 2 | 3 | 3 | 11 | 18 | 29 | 7 |
| Example 3 | PGPE | 730 | DOP | 0.10% | 4 | 1 | 4 | 1 | 10 | 16 | 26 | 8 |
| Example 4 | EL | 200 | DOP | 0.10% | 2 | 2 | 3 | 2 | 9 | 17 | 26 | 7 |
| Example 5 | CyPe | 580 | DOP | 0.10% | 1 | 1 | 4 | 2 | 8 | 19 | 27 | 6 |
| Example 6 | CyHe | 100 | DOP | 0.10% | 2 | 1 | 2 | 1 | 6 | 16 | 22 | 6 |
| Example 7 | PGMEA | 380 | DOP | 0.10% | 3 | 1 | 2 | 1 | 7 | 15 | 22 | 9 |
| Example 8 | CyPe | 580 | DOP | 0.10% | 1 | 1 | 4 | 2 | 8 | 19 | 27 | 6 |
| Example 9 | | | DOP | | | | | | | | | |
| Example 10 | CyHe | 5 | DOP | 0.10% | 1 | 1 | 1 | 1 | 4 | 12 | 16 | 5 |
| Example 11 | CyHe | 1000 | DOP | 0.10% | 2 | 3 | 3 | 2 | 10 | 16 | 26 | 5 |
| Example 12 | CyHe | 3000 | DOP | 0.10% | 5 | 5 | 6 | 2 | 18 | 28 | 46 | 10 |
| Example 13 | CyHe | 6000 | DOP | 0.10% | 8 | 7 | 9 | 5 | 29 | 45 | 74 | 12 |
| Example 14 | CyHe | >0.1 | DOP | 0.10% | 1 | 1 | 1 | 1 | 4 | 5 | 9 | 5 |
| Example 15 | CyHe | 100 | DOP | 0.10% | 2 | 1 | 2 | 1 | 6 | 16 | 22 | 5 |
| Example 16 | CyHe | 100 | DOP | 0.10% | 2 | 1 | 2 | 1 | 6 | 16 | 22 | 5 |
| Example 17 | CyHe | 100 | DOP | 0.10% | 2 | 1 | 2 | 1 | 6 | 16 | 22 | 10 |
| Example 18 | CyHe | 100 | DOP | 0.10% | 2 | 1 | 2 | 1 | 6 | 16 | 22 | 12 |
| Example 19 | CyHe | 100 | DOP | 0.10% | 2 | 1 | 2 | 1 | 6 | 16 | 22 | 5 |
| Example 20 | CyHe | 100 | DOP | 0.10% | 2 | 1 | 2 | 1 | 6 | 16 | 22 | 6 |
| Example 21 | CyHe | 100 | DOP | 0.10% | 2 | 1 | 2 | 1 | 6 | 16 | 22 | 6 |
| Example 22 | CyHe | 1500 | DOP | 0.10% | 15 | 14 | 13 | 12 | 54 | 40 | 94 | 112 |
| Example 40 | CyHe | 100 | DOP | 0.10% | 2 | 1 | 2 | 1 | 6 | 16 | 22 | 6 |
| Example 41 | CyHe | 100 | DOP | 0.10% | 30 | 24 | 22 | 30 | 106 | 130 | 236 | 19 |
| Example 42 | CyHe | 100 | DOP | 0.10% | 30 | 24 | 22 | 30 | 106 | 130 | 236 | 5 |
| Example 43 | CyHe | 100 | DOP | 0.10% | 2 | 1 | 2 | 1 | 6 | 16 | 22 | 5 |
| Example 44 | CyHe | 100 | DIOP | 0.10% | 3 | 1 | 2 | 1 | 7 | 35 | 42 | 6 |
| Example 45 | CyHe | 150 | DIDP | 0.10% | 1 | 1 | 2 | 1 | 5 | 40 | 45 | 5 |
| Example 46 | CyHe | 200 | DOA | 0.10% | 3 | 1 | 1 | 1 | 6 | 25 | 31 | 7 |
| Example 47 | CyHe | 150 | DBP | 0.10% | 4 | 1 | 2 | 1 | 8 | 35 | 43 | 6 |
| Example 48 | CyHe | 100 | ER | 0.10% | 1 | 1 | 2 | 1 | 5 | 41 | 46 | 5 |
| Example 49 | CyHe | 150 | EN | 0.10% | 1 | 1 | 1 | 1 | 4 | 28 | 32 | 4 |
| Example 50 | CyHe | 100 | EP | 0.10% | 2 | 1 | 3 | 1 | 7 | 35 | 42 | 8 |
| Example 51 | CyHe | 100 | DIOP | 0.10% | 2 | 1 | 1 | 1 | 5 | 29 | 34 | 5 |
| Example 52 | CyHe | 150 | DIDP | 0.10% | 1 | 1 | 1 | 1 | 4 | 41 | 45 | 7 |
| Example 53 | CyHe | 200 | DOA | 0.10% | 1 | 1 | 2 | 1 | 5 | 32 | 37 | 6 |
| Example 54 | CyHe | 150 | DBP | 0.10% | 3 | 1 | 1 | 1 | 6 | 35 | 41 | 7 |
| Example 55 | CyHe | 100 | ER | 0.10% | 1 | 1 | 2 | 1 | 5 | 24 | 29 | 4 |

TABLE 1-continued

| | | | | | | | | | | | | |
|---|---|---|---|---|---|---|---|---|---|---|---|---|
| Example 56 | CyHe | 150 | EN | 0.10% | 3 | 1 | 1 | 1 | 6 | 38 | 44 | 6 |
| Example 57 | CyHe | 100 | EP | 0.10% | 2 | 1 | 2 | 1 | 6 | 42 | 48 | 5 |
| Comparative Example 1 | CyHe | 100 | DOP | 0.10% | 30 | 24 | 22 | 30 | 106 | 130 | 236 | 19 |
| Comparative Example 2 | CyHe | 50 | DOP | 0.10% | >0.001 | >0.001 | >0.001 | >0.001 | >0.001 | >0.001 | >0.001 | 3 |

| | Developer | | | | | | | | | | | Evaluation | |
|---|---|---|---|---|---|---|---|---|---|---|---|---|---|
| | Organic impurity | | Moisture | | Metal atom (mass ppt) | | | | | | Number (pieces/mL) of coarse particles | Rinse liquid | Defect performance | Productivity evaluation |
| | Type | Content (mass ppt) | Type | (mass %) | Fe | Cr | Ni | Pb | Total (1) | Others | Total (2) | | | |
| Example 1 | nBA | 200 | DOP | 0.10% | 5 | 3 | 4 | 3 | 15 | 19 | 34 | 8 | | B | B |
| Example 2 | nBA | 200 | DOP | 0.10% | 5 | 3 | 4 | 3 | 15 | 19 | 34 | 7 | | B | B |
| Example 3 | nBA | 200 | DOP | 0.10% | 5 | 3 | 4 | 3 | 15 | 19 | 34 | 8 | | B | B |
| Example 4 | nBA | 200 | DOP | 0.10% | 5 | 3 | 4 | 3 | 15 | 19 | 34 | 7 | | B | B |
| Example 5 | nBA | 200 | DOP | 0.10% | 5 | 3 | 4 | 3 | 15 | 19 | 34 | 6 | | B | B |
| Example 6 | nBA | 200 | DOP | 0.10% | 5 | 3 | 4 | 3 | 15 | 19 | 34 | 8 | | A | A |
| Example 7 | nBA | 200 | DOP | 0.10% | 5 | 3 | 4 | 3 | 15 | 19 | 34 | 9 | | A | A |
| Example 8 | nBA | 200 | DOP | 0.10% | 5 | 3 | 4 | 3 | 15 | 19 | 34 | 6 | MIBC | A | A |
| Example 9 | nBA | 10 | DOP | 0.10% | 2 | 1 | 1 | 1 | 5 | 10 | 15 | 8 | | B | B |
| Example 10 | nBA | 200 | DOP | 0.10% | 5 | 3 | 4 | 3 | 15 | 19 | 34 | 9 | | A | A |
| Example 11 | nBA | 200 | DOP | 0.10% | 5 | 3 | 4 | 3 | 15 | 19 | 34 | 9 | | B | B |
| Example 12 | nBA | 200 | DOP | 0.10% | 5 | 3 | 4 | 3 | 15 | 19 | 34 | 9 | | C | C |
| Example 13 | nBA | 200 | DOP | 0.10% | 5 | 3 | 4 | 3 | 15 | 19 | 34 | 9 | | D | D |
| Example 14 | nBA | 200 | DOP | 0.10% | 5 | 3 | 4 | 3 | 15 | 19 | 34 | 9 | | D | D |
| Example 15 | nBA | 5 | DOP | 0.10% | 1 | 1 | 1 | 1 | 4 | 8 | 12 | 7 | | A | A |
| Example 16 | nBA | 1000 | DOP | 0.10% | 5 | 3 | 4 | 3 | 15 | 19 | 34 | 8 | | B | B |
| Example 17 | nBA | 3000 | DOP | 0.10% | 8 | 6 | 9 | 10 | 33 | 19 | 52 | 8 | | C | C |
| Example 18 | nBA | 6000 | DOP | 0.10% | 12 | 11 | 15 | 14 | 52 | 19 | 71 | 8 | | D | D |
| Example 19 | nBA | >0.1 | DOP | 0.10% | 1 | 1 | 1 | 1 | 4 | 6 | 10 | 5 | | D | D |
| Example 20 | nBA | 200 | DOP | 0.50% | 5 | 3 | 4 | 3 | 15 | 19 | 34 | 7 | | C | C |
| Example 21 | nBA | 200 | DOP | 1.50% | 5 | 3 | 4 | 3 | 15 | 19 | 34 | 8 | | D | D |
| Example 22 | nBA | 1300 | DOP | 0.10% | 15 | 13 | 12 | 14 | 54 | 41 | 95 | 108 | | D | D |
| Example 40 | nBA | 200 | DOP | 0.10% | 5 | 3 | 4 | 3 | 15 | 19 | 34 | 8 | MIBC | A | A |
| Example 41 | nBA | 200 | DOP | 0.10% | 32 | 22 | 30 | 28 | 112 | 178 | 290 | 8 | MIBC | B | C |
| Example 42 | nBA | 5 | DOP | 0.10% | 1 | 1 | 1 | 1 | 4 | 8 | 12 | 7 | | B | B |
| Example 43 | nBA | 5 | DOP | 0.10% | 32 | 22 | 30 | 28 | 112 | 178 | 290 | 7 | | C | C |
| Example 44 | nBA | 5 | DIOP | 0.10% | 2 | 1 | 1 | 1 | 5 | 11 | 16 | 5 | | A | A |
| Example 45 | nBA | 10 | DIDP | 0.10% | 3 | 2 | 2 | 3 | 10 | 15 | 25 | 6 | | A | A |
| Example 46 | nBA | 5 | DOA | 0.10% | 1 | 1 | 1 | 2 | 5 | 12 | 17 | 8 | | A | A |
| Example 47 | nBA | 15 | DBP | 0.10% | 2 | 1 | 1 | 2 | 6 | 10 | 16 | 5 | | A | A |
| Example 48 | nBA | 2 | ER | 0.10% | 3 | 1 | 3 | 1 | 8 | 12 | 20 | 4 | | A | A |
| Example 49 | nBA | 20 | EN | 0.10% | 1 | 2 | 1 | 2 | 6 | 11 | 17 | 7 | | A | A |
| Example 50 | nBA | 10 | EP | 0.10% | 2 | 1 | 2 | 1 | 6 | 8 | 14 | 6 | | A | A |
| Example 51 | nBA | 5 | DOP | 0.10% | 1 | 1 | 2 | 1 | 5 | 9 | 14 | 8 | | A | A |
| Example 52 | nBA | 10 | DOP | 0.10% | 2 | 1 | 1 | 3 | 7 | 12 | 19 | 5 | | A | A |
| Example 53 | nBA | 5 | DOP | 0.10% | 2 | 2 | 2 | 1 | 7 | 15 | 22 | 6 | | A | A |
| Example 54 | nBA | 15 | DOP | 0.10% | 1 | 1 | 1 | 3 | 6 | 14 | 20 | 8 | | A | A |
| Example 55 | nBA | 5 | DOP | 0.10% | 3 | 1 | 2 | 2 | 8 | 13 | 21 | 5 | | A | A |
| Example 56 | nBA | 20 | DOP | 0.10% | 2 | 1 | 1 | 1 | 5 | 12 | 17 | 6 | | A | A |
| Example 57 | nBA | 10 | DOP | 0.10% | 1 | 2 | 3 | 3 | 9 | 13 | 22 | 7 | | A | A |
| Comparative Example 1 | nBA | 200 | DOP | 0.10% | 32 | 22 | 30 | 28 | 112 | 178 | 290 | 8 | | B | B |
| Comparative Example 2 | nBA | 200 | DOP | 0.10% | >0.001 | >0.001 | >0.001 | >0.001 | >0.001 | >0.001 | >0.001 | 2 | | B | B |

The reference marks described in the field of "type" of the pre-wet liquid, the field of "type" of the developer, and the field of "rinse liquid" in Table 1 mean the following organic solvents.

PGME: propylene glycol monomethyl ether
PGEE: propylene glycol monoethyl ether
PGPE: propylene glycol monopropyl ether
EL: ethyl lactate
CyPe: cyclopentanone
CyHe: cyclohexanone IPA in Table 2 means isopropanol.

"Others" in the field of "metal atom (ppt)" in Table 2 indicates the amount of other metal atoms except for a Fe atom, a Cr atom, a Ni atom, and a Pb atom.

In Table 2, the content of an organic solvent corresponded to "the remainder" obtained by subtracting the content of organic impurities, the content of water, and the content of metal impurities from the total mass of the chemical liquid. In all of the examples and the comparative examples, the content of the organic solvent was equal to or smaller than 98 mass %.

TABLE 2

| | Rinse liquid | | | | | | | | | | | |
|---|---|---|---|---|---|---|---|---|---|---|---|---|
| | | Organic impurity | | Metal atom (mass ppt) | | | | | | Number (pieces/ml) | Evaluation | |
| | Type | (mass ppm) | Moisture (mass %) | Fe | Cr | Ni | Pb | Total (1) | Others | Total (2) | of coarse particles | Defect performance | Productivity evaluation |
| Example 23 | IPA | 150 | 0.10% | 2 | 1 | 3 | 1 | 7 | 16 | 23 | 8 | A | A |
| Example 24 | IPA | 800 | 0.10% | 15 | 9 | 14 | 6 | 44 | 21 | 65 | 8 | C | C |
| Example 25 | IPA | 3000 | 0.10% | 18 | 13 | 16 | 10 | 57 | 24 | 81 | 8 | C | D |
| Example 26 | IPA | 150 | 0.50% | 2 | 1 | 4 | 1 | 8 | 23 | 31 | 7 | C | C |
| Example 27 | IPA | 150 | 1.50% | 2 | 1 | 4 | 1 | 8 | 23 | 31 | 8 | C | D |
| Comparative Example 3 | IPA | 500 | 0.10% | 46 | 28 | 42 | 52 | 168 | 130 | 298 | 65 | F | E |

PGMEA: propylene glycol monomethyl ether acetate
nBA: butyl acetate
MIBC: 4-methyl-2-pentanol As shown in Table 1, according to the manufacturing method of a semiconductor chip in the present invention, the desired advantage was obtained.

It was confirmed that the more excellent advantage was obtained by performing a rinse process, from the comparison between Example 5 and Example 8.

It was confirmed that the more excellent advantage was obtained in a case where the content of organic impurities was 0.1 to 5000 mass ppm (preferably 1 to 2000 mass ppm, and more preferably 1 to 500 mass ppm), from the comparison between Examples 10 to 14 (or the comparison between Examples 15 to 19).

It was confirmed that the more excellent advantage was obtained in a case where the content of water was 0.01 to 1.0 mass % (preferably equal to or greater than 0.01 mass % and smaller than 0.5 mass %), from the comparison between Examples 6, 20, and 21.

It was confirmed that the more excellent advantage was obtained in a case where the number of counting targets which were counted by a light scattering type in-liquid particle counter and had a size of 0.1 μm or greater was equal to or smaller than 100 pieces/mL, from the comparison between Examples 6 and 22.

Examples 23 to 27 and Comparative Example 3

A semiconductor chip was manufactured by procedures similar to those in Example 8 except that cyclohexanone was used as a pre-wet liquid, butyl acetate was used as a developer, and a chemical liquid described in Table 2 was used as a rinse liquid. Then, various evaluations were performed. In cyclohexanone and butyl acetate, the total content of a specific metal atom was out of a range of 0.001 to 100 mass ppt. Table 2 collectively shows results.

As shown in Table 2, according to the manufacturing method of a semiconductor chip in the present invention, the desired advantage was obtained.

It was confirmed that the more excellent advantage was obtained in a case where the content of organic impurities was 1 to 2000 mass ppm (preferably 1 to 500 mass ppm), from the comparison between Examples 23 to 25.

It was confirmed that the more excellent advantage was obtained in a case where the content of water was 0.01 to 1.0 mass % (preferably equal to or greater than 0.01 mass % and smaller than 0.5 mass %), from the comparison between Examples 23, 26, and 27.

Examples 28 to 31

A semiconductor chip was manufactured by procedures similar to those in Example 8 except that the washing liquid X, CSL9044C, BSL8178C, and Clean-100 which had been used in Example 8 were changed as shown in Table 3. Then, various evaluations were performed. Table 3 collectively shows results.

In Table 3, the field of "PER (post etch residues)" represents the type of a washing liquid in a case where etching residues are removed. The field of "Cu-CMP" represents the type of a polishing liquid in a case where copper is subjected to chemical-mechanical polishing. The field of "Ba-CMP" represents the type of a polishing liquid in a case where Ti is subjected to chemical-mechanical polishing. The field of "p-CMP" represents the type of a washing liquid used after polishing.

In Table 3, "dHF" represents that 47% HF manufactured by FFEM Corporation is diluted to be 0.5%. "HS-H700" represented that the product was manufactured by Hitachi Chemical Co., Ltd. and did not include amino acid. "HS-T915" represented that the product was manufactured by Hitachi Chemical Co., Ltd. and was not an alkali solution including organic acid. "dNH3" represented that 29% ammonia water manufactured by KANTO KAGAKU was diluted to be 1% and the substance did not include polyvalent carboxylic acid.

TABLE 3

| | PER | Cu-CMP | Ba-CMP | p-CMP | Productivity evaluation |
|---|---|---|---|---|---|
| Example 8 | Washing liquid X | CSL9044C | BSL8178C | Clean-100 | A |
| Example 28 | dHF | CSL9044C | BSL8178C | Clean-100 | C |
| Example 29 | Washing liquid X | HS-H700 | BSL8178C | Clean-100 | D |
| Example 30 | Washing liquid X | CSL9044C | HS-T915 | Clean-100 | C |
| Example 31 | Washing liquid X | CSL9044C | BSL8178C | dNH3 | D |

As show n Table 3, it was confirmed that the more excellent advantage was obtained in a case where a treatment liquid used in a treatment of removing impurities formed by etching included a hydroxylamine compound, from the comparison between Examples 8 and 28.

It was confirmed that the more excellent advantage was obtained in a case where a process of performing chemical-mechanical polishing with a polishing liquid including amino acid was provided, from the comparison between Examples 8 and 29.

It was confirmed that the more excellent advantage was obtained in a case where a process of performing chemical-mechanical polishing with a polishing liquid which included organic acid and showed alkalinity was provided, from the comparison between Examples 8 and 30.

It was confirmed that the more excellent advantage was obtained in a case where a process of performing a washing treatment with a washing liquid including polyvalent carboxylic acid was provided after chemical-mechanical polishing, from the comparison between Examples 8 and 31.

Examples 32 to 35

A semiconductor chip was manufactured by procedures similar to those in Examples 8 and 28 to 31 except for the followings. That is, in each of Examples 8 and 28 to 31, a metal hard mask formed from titanium nitride was used instead of the patterned resist film obtained by using a composition for forming a resist film, and an etching stopper layer formed from aluminum oxide was provided on a base material. Then, an insulating layer was formed on the etching stopper layer, and then the subsequent operation was performed. Then, various evaluations were performed.

Table 4 collectively shows results.

TABLE 4

| | PER | Cu-CMP | Ba-CMP | p-CMP | Productivity evaluation |
|---|---|---|---|---|---|
| Example 8 | Washing liquid X | CSL9044C | BSL8178C | Clean-100 | A |
| Example 32 | dHF | CSL9044C | BSL8178C | Clean-100 | B |
| Example 33 | Washing liquid X | HS-H700 | BSL8178C | Clean-100 | C |
| Example 34 | Washing liquid X | CSL9044C | HS-T915 | Clean-100 | B |
| Example 35 | Washing liquid X | CSL9044C | BSL8178C | dNH3 | C |

It was confirmed that the more excellent advantage was obtained in a case where a metal hard mask and an etching stopper layer were used, from results in Table 3 and Table 4.

A composition 1-X for forming a resist film was produced in a similar manner except that 3 mass parts of an organic solvent PGMEA (propylene glycol monomethyl ether acetate), 600 mass parts of cyclohexanone, and 100 mass parts of γ-BL (γ-butyrolactone) which were used in the composition for forming a resist film in Example 1 were changed to 3 mass parts of PGMEA which was the chemical liquid used in Example 7 and 700 mass parts of cyclohexanone which was the chemical liquid used in Example 6. A patterned resist film was formed. If evaluation was performed, defect performance and productivity evaluation ranked A.

The most half of the composition for forming a resist film was occupied by the organic solvent. Thus, it is considered that, in a case where the chemical liquid used in Examples 6 and 7 is used, the amount of impurity components (organic impurities, moisture, metal particles, and coarse particle) in the composition for forming a resist film is very small.

Regarding the composition 1-X for forming a resist film, the total content of a Fe atom, a Cr atom, a Ni atom, and a Pb atom included in the composition for forming a resist film was equal to or smaller than 100 mass ppt and the number of coarse particles was equal to or smaller than 10 pieces/mL.

The method in the present invention can be suitably applied to forming of an insulating layer in which a metal interconnection is embedded at the portion of the bottom layer, which is a portion at which a defect is most easily caused in the multilayer interconnection structure body, because the occurrence of defects is small. It is supposed that the method in the present invention can be suitably applied to manufacturing of a multilayer interconnection structure body in which the half pitch of an interconnection pitch on the bottom layer is equal to or smaller than 25 nm.

Example 50

<Resin (A) and Like>

Synthesis Example 1

Synthesis of Resin (A-1)

600 g of cyclohexanone was put into a 2 L flask, and substitution with nitrogen was performed at a flow rate of 100 mL/min for a predetermined period. Then, 4.60 g (0.02 mol) of a polymerization initiator V-601 (manufactured by Wako Pure Chemical Corporation) was added, and the temperature was increased until the inner temperature reached 80° C. Then, the following monomer and 4.60 g (0.02 mol) of the polymerization initiator V-601 (manufactured by Wako Pure Chemical Corporation) were dissolved in 200 g of cyclohexanone, and thereby a monomer solution was prepared. The monomer solution was added dropwise in the flask heated to 80° C., for 6 hours. After the dropwise addition ended, the resultant was caused to react at 80° C. for 2 hours.

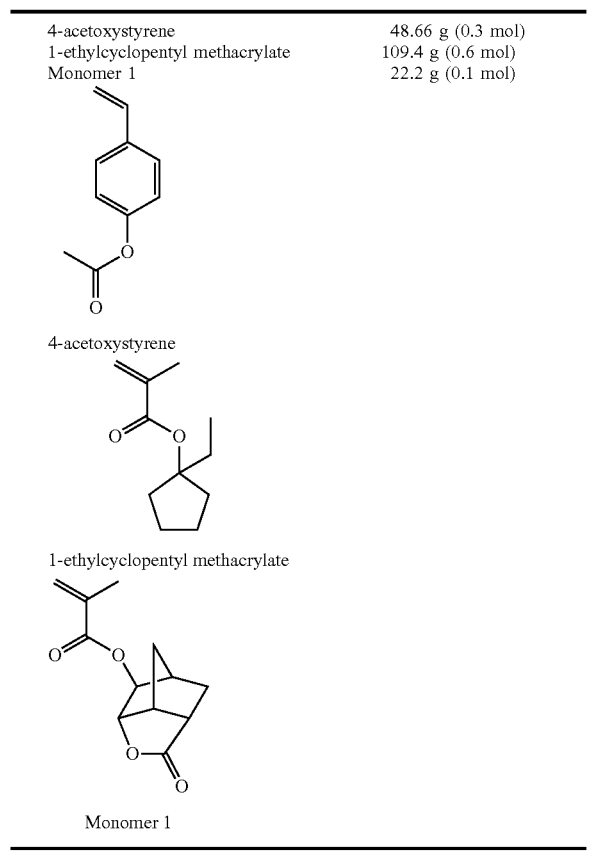

A reaction solution was cooled up to room temperature. Then, the reaction solution was added dropwise in 3 L of hexane, and thereby a polymer was deposited. A solid obtained by filtering was dissolved in 500 mL of acetone and then was added dropwise in 3 L of hexane again. A solid obtained by filtering was dried under reduced pressure, and thereby 160 g of a 4-acetoxystyrene/1-ethylcyclopentyl methacrylate/Monomer 1 copolymer (A-1a) was obtained.

10 g of the copolymer (A-1a) obtained in the above manner, 40 mL of methanol, 200 mL of 1-methoxy-2-propanol, and 1.5 mL of concentrated hydrochloric acid were added into a reaction vessel, heated to 80° C., and stirred for 5 hours. The reaction solution was cooled to room temperature by staying. Then, the reaction solution was added dropwise in 3 L of distilled water. A solid obtained by filtering was dissolved in 200 mL of acetone, and the resultant was added dropwise in 3 L of distilled water again. A solid obtained by filtering was dried under reduced pressure, and thereby Resin (A-1) (8.5 g) was obtained. The weight average molecular weight (Mw) in terms of standard polystyrene by gel permeation chromatography (GPC) (solvent: THF (tetrahydrofuran)) was 11200, and molecular weight dispersity (Mw/Mn) was 1.45.

Resins (A-2) to (A-19) having structures shown in Tables 5 to 7 were synthesized by a method similar to that in Synthesis Example 1 except that a monomer to be used was changed.

In Tables 5 to 7, the composition ratio (molar ratio) of the resin was calculated by $^1$H-NMR (nuclear magnetic resonance) measurement. The weight average molecular weight (Mw: terms of polystyrene) and the dispersity (Mw/Mn) of the resin were calculated by GPC (solvent: THF) measurement. Regarding other resins described in the examples, the weight average molecular weight and the dispersity were measured by similar methods.

TABLE 5

| | Structure | Composition ratio (molar ratio) from left | Mw | Mw/Mn |
|---|---|---|---|---|
| Resin A-1 | 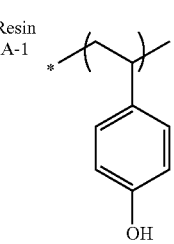 | 30/60/10 | 11,200 | 1.45 |

TABLE 5-continued

| | Structure | Composition ratio (molar ratio) from left | Mw | Mw/Mn |
|---|---|---|---|---|
| Resin A-2 | | 30/60/10 | 12,300 | 1.51 |
| Resin A-3 | | 40/20/40 | 9,200 | 1.68 |
| Resin A-4 | | 30/60/10 | 12,300 | 1.51 |
| Resin A-5 | | 20/80 | 12,500 | 1.52 |
| Resin A-6 | | 50/50 | 13,000 | 1.56 |

TABLE 5-continued

| | Structure | Composition ratio (molar ratio) from left | Mw | Mw/Mn |
|---|---|---|---|---|
| Resin A-7 | | 70/30 | 12,500 | 1.43 |

TABLE 6

| | Structure | Composition ratio (molar ratio) from left | Mw | Mw/Mn |
|---|---|---|---|---|
| Resin A-8 | | 20/80 | 18,000 | 1.12 |
| Resin A-9 | | 5/15/30/50 | 11,000 | 1.56 |
| Resin A-10 | | 50/50 | 11,000 | 1.45 |

TABLE 6-continued
| | Structure | Composition ratio molar ratio) from left | Mw | Mw/Mn |
|---|---|---|---|---|
| Resin A-11 | 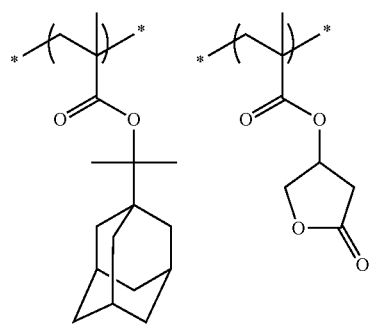 | 35/65 | 12,300 | 1.51 |
| Resin A-12 | 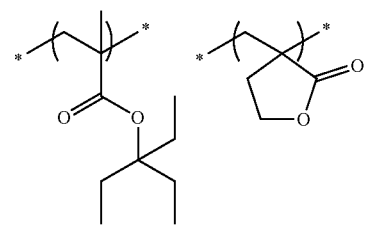 | 60/40 | 12,500 | 1.68 |
| Resin A-13 | 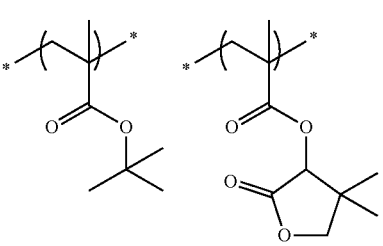 | 70/30 | 13,000 | 1.51 |
| Resin A-14 | 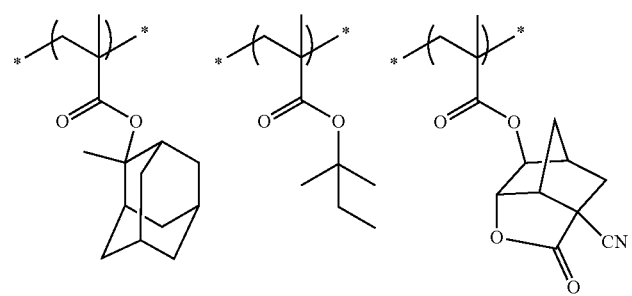 | 20/40/40 | 11,000 | 1.45 |
| Resin A-15 | 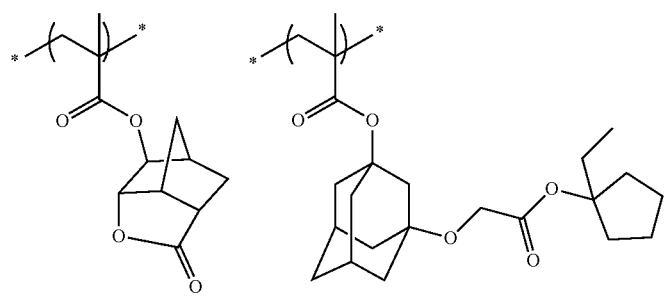 | 30/70 | 12,300 | 1.51 |

TABLE 7

| | Structure | Composition ratio (molar ratio) from left | Mw | Mw/Mn |
|---|---|---|---|---|
| Resin A-16 | | 50/20/30 | 14,500 | 1.68 |
| Resin A-17 | | 30/50/10/10 | 12,100 | 1.53 |
| Resin A-18 | | 50/35/15 | 11,100 | 1.61 |
| Resin A-19 | | 30/45/15/10 | 11,500 | 1.49 |

<Hydrophobic Resin (A')>
The followings were used as the hydrophobic resin.
TABLE 8
|  | Composition ratio (molar ratio) | | | | Mw | Mw/Mn |
|---|---|---|---|---|---|---|
| Resin (1b) | 50 | 45 | 5 | — | 7000 | 1.30 |
| Resin (2b) | 40 | 40 | 20 | — | 18600 | 1.57 |
| Resin (3b) | 50 | 50 | — | — | 25400 | 1.63 |
| Resin (4b) | 30 | 65 | 5 | — | 28000 | 1.70 |
| Resin (5b) | 10 | 10 | 30 | 50 | 12500 | 1.65 |
Specific structural formulae of Hydrophobic resins (1b) to (5b) described in Table 8 are shown as follows.
(1b)
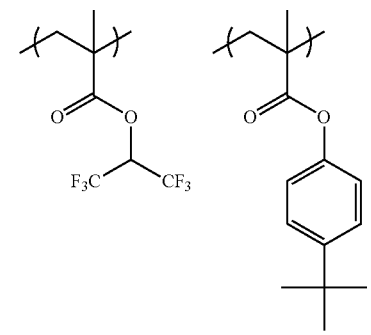
(2b)
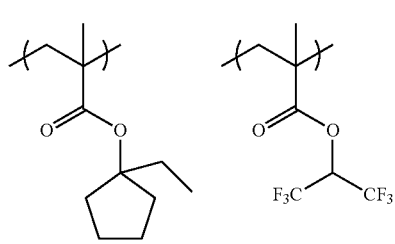
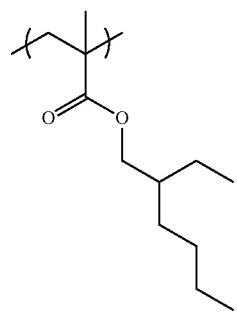
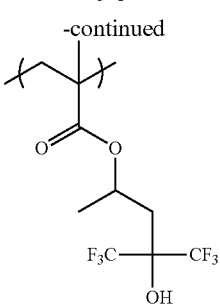
(3b)
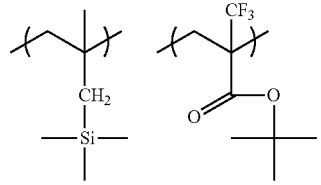
(4b)
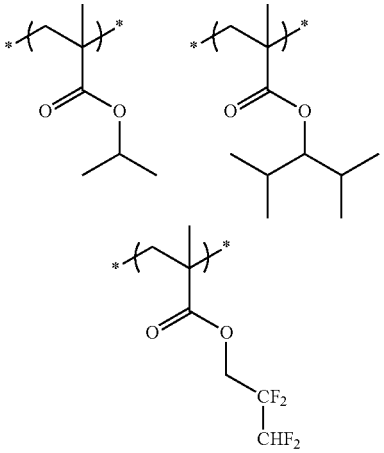
(5b)
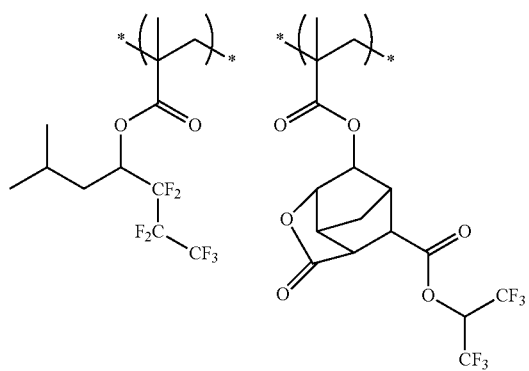

<Photoacid Generator (B)>
The followings were used as the photoacid generator.
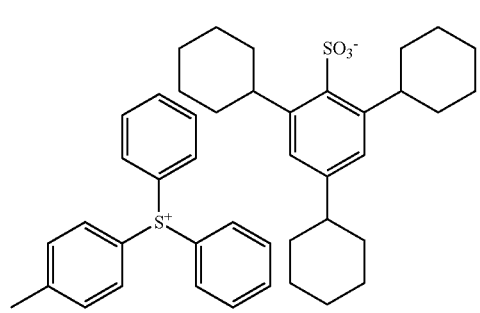 (B-1)
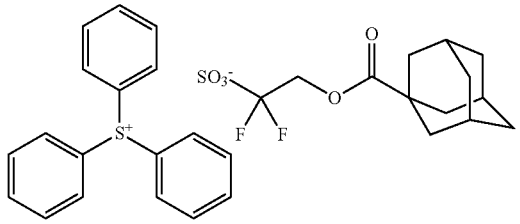 (B-2)
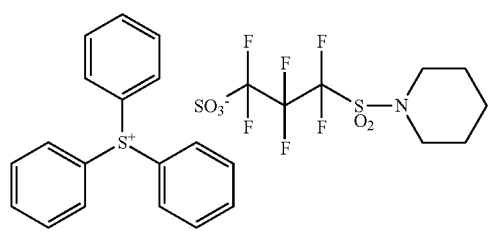 (B-3)
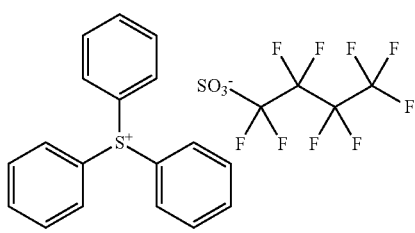 (B-4)
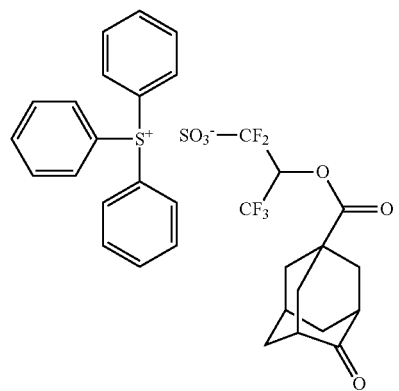 (B-5)
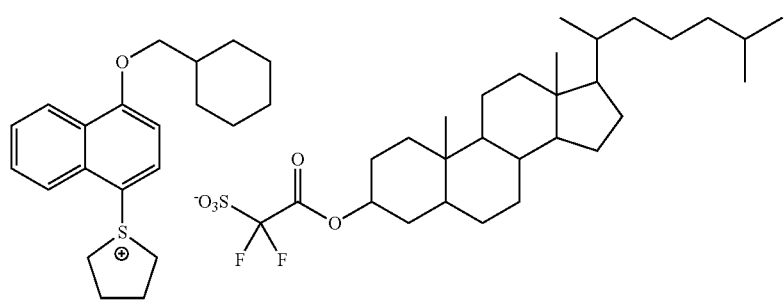 (B-6)
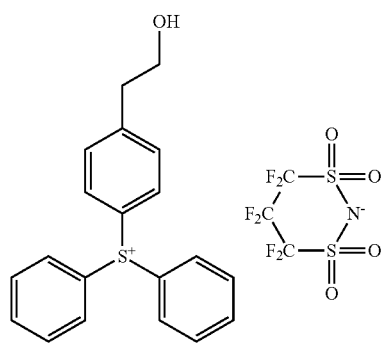 (B-7)
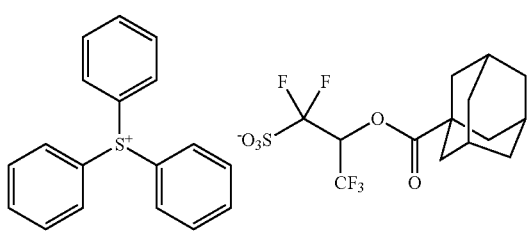 (B-8)

(B-9)
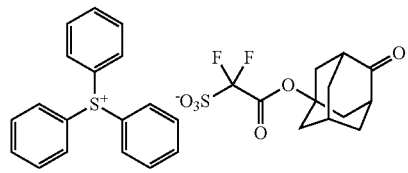
(B-10)
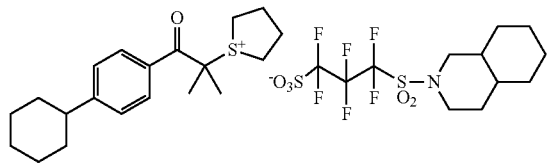
<Basic Compound (E)>
The followings were used as the basic compound.
(E-1)
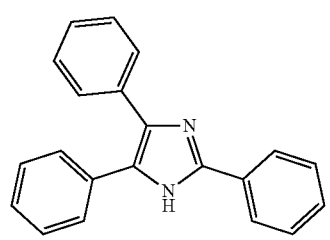
(E-2)
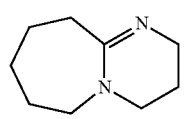
(E-3)
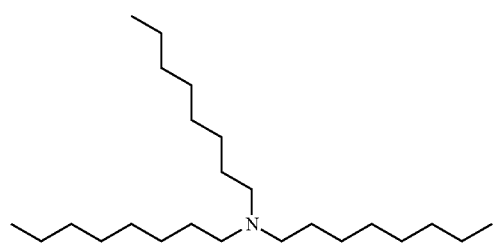
(E-4)
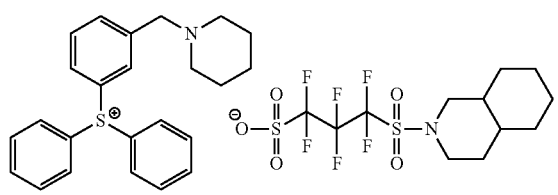
(E-5)
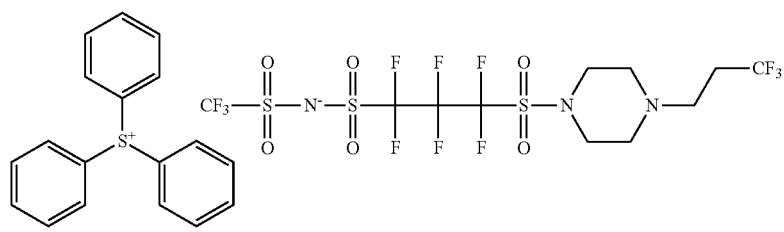
(E-6)
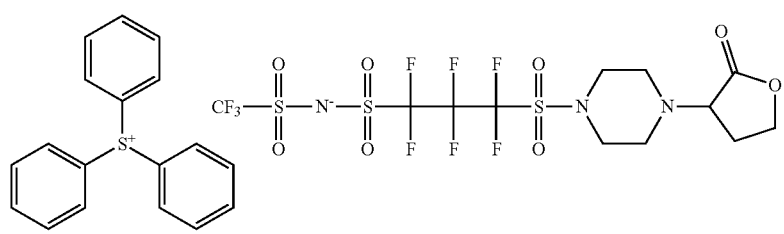
(E-7)
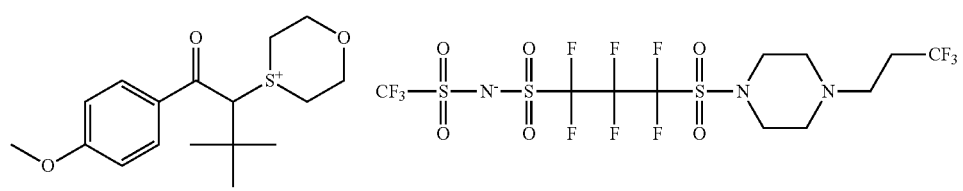

-continued

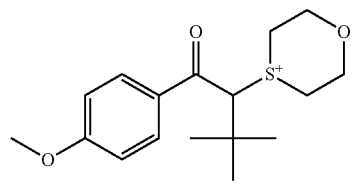 (E-8)

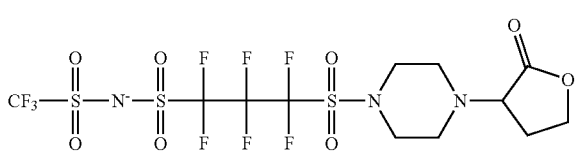

(E-9) (E-10)

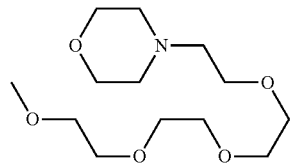 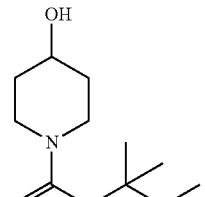

(E-11) (E-12)

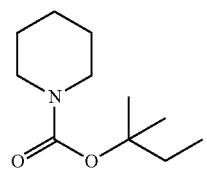 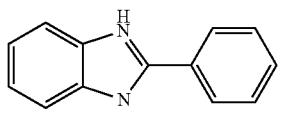

(E-13) (E-14)

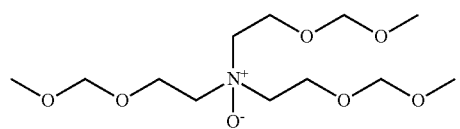

<Solvent (C)>
The followings were used as the resist solvent.
C-1: propylene glycol monomethyl ether acetate
C-2: propylene glycol monomethyl ether
C-3: ethyl lactate
C-4: cyclohexanone <Resist Composition (Composition for Forming Resist Film)>

Components shown in Table 9 were dissolved in solvents shown in Table 9. The resultant of the dissolving was filtered by using a polyethylene filter having a pore size of 0.03 μm, and thereby a resist composition was obtained.

TABLE 9

|  | Resin (A) | Acid generator (B) | Basic compound (E) | Solvent (C) | | Hydrophobic resin (A') |
|---|---|---|---|---|---|---|
| Resist Composition 1 | A-1 0.77 g | B-1 0.2 g | E-3 0.03 g | C-1 67.5 g | C-3 7.5 g | — | — |
| Resist Composition 2 | A-2 0.79 g | B-2 0.18 g | E-1 0.03 g | C-1 45 g | C-2 30 g | — | — |
| Resist Composition 3 | A-3 0.79 g | B-2 0.18 g | E-1 0.03 g | C-1 45 g | C-2 30 g | — | — |
| Resist Composition 4 | A-4 0.79 g | B-2 0.18 g | E-1 0.03 g | C-1 60 g | C-3 15 g | — | — |
| Resist Composition 5 | A-5 0.78 g | B-3 0.19 g | E-3 0.03 g | C-1 67.5 g | C-3 7.5 g | — | — |
| Resist Composition 6 | A-6 0.79 g | B-2 0.18 g | E-1 0.03 g | C-1 67.5 g | C-3 7.5 g | — | — |
| Resist Composition 7 | A-6/A-7 0.395 g/0.395 g | B-4 0.2 g | E-4 0.01 g | C-1 45 g | C-4 30 g | — | — |
| Resist Composition 8 | A-8 0.79 g | B-1 0.18 g | E-1 0.03 g | C-1 45 g | C-2 30 g | — | — |
| Resist Composition 9 | A-1/A-2 0.395 g/0.395 g | B-2 0.18 g | E-1/E-5 0.015 g/0.015 g | C-1 45g | C-2 30 g | — | — |
| Resist Composition 10 | A-2 0.79 g | B-2 0.18 g | E-6 0.03 g | C-1 45 g | C-2 30 g | — | — |
| Resist Composition 11 | A-2 0.79 g | B-2 0.18 g | E-7 0.03 g | C-1 45 g | C-2 30 g | — | — |

TABLE 9-continued

| | Resin (A) | Acid generator (B) | Basic compound (E) | Solvent (C) | | | Hydrophobic resin (A') |
|---|---|---|---|---|---|---|---|
| Resist Composition 12 | A-2 0.79 g | B-2 0.18 g | E-8 0.03 g | C-1 45 g | C-2 30 g | — | — |
| Resist Composition 13 | A-9 0.76 g | B-5 0.18 g | E-9 0.03 g | C-1 45 g | C-2 1.5 g | C-4 15 g | 5b 0.03 g |
| Resist Composition 14 | A-7 0.787 g | B-5 0.18 g | E-9 0.03 g | C-1 45 g | C-2 15 g | C-4 15 g | 4b 0.003 g |
| Resist Composition 15 | A-6 0.785 g | B-4 0.18 g | E-10 0.03 g | C-1 45 g | C-2 15 g | C-4 15 g | 3b 0.005 g |
| Resist Composition 16 | A-10 0.78 g | B-3 0.18 g | E-11 0.03 g | C-1 45 g | C-2 15 g | C-4 15 g | 2b 0.01 g |
| Resist Composition 17 | A-11 0.72 g | B-6/B-2 0.15 g/0.09 g | E-12 0.03 g | C-1 45 g | C-2 15 g | C-4 15 g | 1b 0.01 g |
| Resist Composition 18 | A-12 0.76 g | B-7 0.18 g | E-13 0.03 g | C-1 45 g | C-2 30 g | — | 5b 0.03 g |
| Resist Composition 19 | A-13 0.787 g | B-8 0.18 g | E-14 0.03 g | C-1 30 g | C-2 45 g | — | 4b 0.003 g |
| Resist Composition 20 | A-14 0.785 g | B-9 0.18 g | E-2 0.03 g | C-1 45 g | C-4 30 g | — | 3b 0.005 g |
| Resist Composition 21 | A-15 0.78 g | B-10/B-2 0.09 g/0.09 g | E-13 0.03 g | C-1 30 g | C-4 45 g | — | 2b 0.01 g |
| Resist Composition 22 | A-16 0.71 g | B-6 0.25 g | E-14 0.03 g | C-1 50 g | C-2 10 g | — | 1b 0.01 g |
| Resist Composition 23 | A-17 0.79 g | B-2 0.18 g | E-1 0.03 g | C-1 60 g | C-3 15 g | — | — |
| Resist Compsition 24 | A-18 0.79 g | B-2 0.18 g | E-1 0.03 g | C-1 60 g | C-3 15 g | — | — |
| Resist Composition 25 | A-19 0.79 g | B-2 0.18 g | E-1 0.03 g | C-1 60 g | C-3 15 g | — | — |

In a case where a semiconductor chip was manufactured in accordance with procedures similar to those in Example 1 except that Resist Compositions 1 to 25 were used as the composition for forming a resist film, and EUV light was used for exposing, results similar to those in Example 1 were obtained.

Examples 51 to 54

A semiconductor chip was manufactured in accordance with procedures similar to those in Example 1 except that the solvent in the composition for forming a resist film in Example 1 was changed to PEGMA having high purity, and a pre-wet liquid, a developer, and a rinse liquid as shown in Table 10 were used. Then, various evaluations were performed. Table 10 shows results.

In the PEGMA having high purity, the concentration of organic impurities DOP is 100 mass ppm, the concentration of a Fe atom is 3 mass ppt, the concentration of a Cr atom is 1 mass ppt, the concentration of a Ni atom is 2 mass ppt, and the concentration of a Pb atom is 1 mass ppt.

A rinse liquid (MIBC) was similar to that used in Example 8.

Organic impurities in the pre-wet liquid and the developer correspond to DOP.

TABLE 10

| | Pre-wet liquid | | | | | | | | | |
|---|---|---|---|---|---|---|---|---|---|---|
| | Type | Organic impurities (mass ppm) | Moisture (mass %) | Metal atom (mass ppt) | | | | | | Number (pieces/mL) of coarse particles |
| | | | | Fe | Cr | Ni | Pb | Total (1) | Others | Total (2) | |
| Example 51 | CyHe | 100 | 0.10% | 2 | 1 | 2 | 1 | 6 | 16 | 22 | 6 |
| Example 52 | CyHe | 100 | 0.10% | 30 | 24 | 22 | 30 | 106 | 130 | 236 | 19 |
| Example 53 | CyHe | 100 | 0.10% | 30 | 24 | 22 | 30 | 106 | 130 | 236 | 5 |
| Example 54 | CyHe | 100 | 0.10% | 2 | 1 | 2 | 1 | 6 | 16 | 22 | 5 |

| | Developer | | | | | | | | | | | Evaluation | |
|---|---|---|---|---|---|---|---|---|---|---|---|---|---|
| | Type | Organic impurities (mass ppm) | Moisture (mass %) | Metal atom (mass ppt) | | | | | | Number (pieces/mL) of coarse particles | Rinse liquid | Defect performance | Productivity evaluation |
| | | | | Fe | Cr | Ni | Pb | Total (1) | Others | Total (2) | | | |
| Example 51 | nBA | 200 | 0.10% | 5 | 3 | 4 | 3 | 15 | 19 | 34 | 8 | MIBC | A | A |
| Example 52 | nBA | 200 | 0.10% | 32 | 22 | 30 | 28 | 112 | 178 | 290 | 8 | MIBC | A | A |
| Example 53 | nBA | 5 | 0.10% | 1 | 1 | 1 | 1 | 4 | 8 | 12 | 7 | | A | B |
| Example 54 | nBA | 5 | 0.10% | 32 | 22 | 30 | 28 | 112 | 178 | 290 | 7 | | B | B |

As shown in Table 10, with comparison of Example 43 and Example 54 in Table 1 to each other, it was confirmed that the effects were more improved in a case where the solvent in the composition for forming a resist was a solvent having high purity.

EXPLANATION OF REFERENCES 10 base material
12 insulating layer
14 patterned resist film
16 insulating layer having opening portion
18 metal film
18a first metal film
18b second metal film
20 metal interconnection
30 semiconductor chip

What is claimed is:

1. A manufacturing method of a semiconductor chip, the method comprising:
    Process 1 of forming an insulating layer on a base material;
    Process 2 of forming a patterned resist film on the insulating layer;
    Process 3 of forming the insulating layer having an opening portion by etching the insulating layer with the patterned resist film as a mask;
    Process 4 of removing the patterned resist film;
    Process 5 of filling the opening portion of the insulating layer with metal; and
    Process 6 of performing chemical-mechanical polishing on the insulating layer filled with metal,
    wherein, in at least one process of Process 1 to Process 6,
    a chemical liquid which includes an organic solvent and metal impurities including at least one metal atom selected from the group consisting of a Fe atom, a Cr atom, a Ni atom, and a Pb atom, and in which the total content of the metal atom is 0.001 to 100 mass ppt is used,
    wherein the chemical liquid includes organic impurities, and
    the total content of the organic impurities in the chemical liquid is 0.1 to 5000 mass ppm with respect to the total mass of the chemical liquid, and
    wherein the organic impurity is one kind or more selected from the group consisting of dioctyl phthalate, diisononyl phthalate, dioctyl adipate, dibutyl phthalate, ethylene rubber, ethylene propylene rubber, and an addition polymer of 5-ethylidene-2-norbornene.

2. The manufacturing method of a semiconductor chip according to claim 1,
    wherein the number of counting targets which are provided in the chemical liquid, have a size of 0.1 μm or greater, and are to be counted by a light scattering type in-liquid particle counter is equal to or smaller than 100 pieces/mL.

3. The manufacturing method of a semiconductor chip according to claim 1,
    wherein the chemical liquid includes water, and
    the content of the water in the chemical liquid is 0.01 to 1.0 mass % with respect to the total mass of the chemical liquid.

4. The manufacturing method of a semiconductor chip according to claim 1,
    wherein the organic solvent is selected from the group consisting of methanol, ethanol, 1-propanol, isopropanol, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol.

5. The manufacturing method of a semiconductor chip according to claim 1,
    wherein Process 2 includes
        Process 2-1 of coating the insulating layer with a pre-wet liquid,
        Process 2-2 of forming a coated film by applying a composition for forming a resist film onto the insulating layer coated with the pre-wet liquid, and
        Process 2-3 of forming the patterned resist film by exposing the coated film in a pattern shape and performing a developing treatment with a developer, and
    the chemical liquid is used as at least one of the pre-wet liquid or the developer.

6. The manufacturing method of a semiconductor chip according to claim 1,
    wherein Process 2 includes
        Process 2-1 of coating the insulating layer with a pre-wet liquid,
        Process 2-2 of forming a coated film by applying a composition for forming a resist film onto the insulating layer coated with the pre-wet liquid,
        Process 2-3 of forming the patterned resist film by exposing the coated film in a pattern shape and performing a developing treatment with a developer, and
        Process 2-4 of washing the patterned resist film by using a rinse liquid after Process 2-3, and
    the chemical liquid is used as the rinse liquid.

7. The manufacturing method of a semiconductor chip according to claim 5,
    wherein the exposing is performed by EUV light.

8. The manufacturing method of a semiconductor chip according to claim 1,
    wherein the patterned resist film is a metal hard mask.

9. The manufacturing method of a semiconductor chip according to claim 1,
    wherein, in Process 1, the insulating layer including a silicon atom is formed by using a physical vapor deposition method, a chemical vapor deposition method, or a spin coating method.

10. The manufacturing method of a semiconductor chip according to claim 1,
    wherein, in Process 3, etching of the insulating layer is performed by plasma etching with an etching gas which includes a nitrogen gas and a halogen gas.

11. The manufacturing method of a semiconductor chip according to claim 1,
    wherein, in Process 4, the patterned resist film is removed by a treatment with a treatment liquid which includes an alkaline component and an organic solvent, or by oxygen ashing.

12. The manufacturing method of a semiconductor chip according to claim 1,
    wherein, in Process 4, a treatment of removing impurities which have been generated by etching performed in Process 3 is performed.

13. The manufacturing method of a semiconductor chip according to claim 12,
    wherein the treatment of removing impurities is performed by a washing treatment with a treatment liquid including a hydroxylamine compound.

14. The manufacturing method of a semiconductor chip according to claim 1,
wherein, in Process 5, the opening portion of the insulating layer is filled with metal by any of a physical vapor deposition method, a chemical vapor deposition method, or a plating method.

15. The manufacturing method of a semiconductor chip according to claim 1,
wherein, in Process 5, the metal is Cu, Al, Co, W, Ta, TaN, Ti, TiN, Ru, Mn, or an alloy thereof.

16. The manufacturing method of a semiconductor chip according to claim 15,
wherein Process 5 includes
Process 5-1 of filling the opening portion of the insulating layer with first metal selected from the group consisting of Ta, TaN, Ti, TiN, Ru, Mn, and an alloy thereof, and
Process 5-2 of further filling the opening portion which has been filled with the first metal, with second metal selected from the group consisting of Cu, Al, Co, W, and an alloy thereof.

17. The manufacturing method of a semiconductor chip according to claim 16,
wherein Process 6 includes Process 6-1 of performing the chemical-mechanical polishing with a polishing liquid which includes amino acid.

18. The manufacturing method of a semiconductor chip according to claim 16,
wherein Process 6 includes Process 6-2 of performing the chemical-mechanical polishing with a polishing liquid which includes organic acid and exhibits alkalinity.

19. The manufacturing method of a semiconductor chip according to claim 1, further comprising:
a process of performing a washing treatment on the insulating layer subjected to the chemical-mechanical polishing, with a washing liquid which includes polyvalent carboxylic acid, after Process 6.

20. The manufacturing method of a semiconductor chip according to claim 1, further comprising:
a process of forming an etching stopper layer on the base material before Process 1.

21. The manufacturing method of a semiconductor chip according to claim 1,
wherein all or some of Process 1 to Process 6 are repeated after Process 1 to Process 6 are performed.

22. A manufacturing method of a semiconductor chip, the method comprising:
Process 1 of forming an insulating layer on a base material;
Process 2 of forming a patterned resist film on the insulating layer;
Process 3 of forming the insulating layer having an opening portion by etching the insulating layer with the patterned resist film as a mask;
Process 4 of removing the patterned resist film;
Process 5 of filling the opening portion of the insulating layer with metal; and
Process 6 of performing chemical-mechanical polishing on the insulating layer filled with metal,
wherein, in at least one process of Process 1 to Process 6, a chemical liquid which includes an organic solvent and metal impurities including at least one metal atom selected from the group consisting of a Fe atom, a Cr atom, a Ni atom, and a Pb atom, and in which the total content of the metal atom is 0.001 to 100 mass ppt is used, and
wherein Process 2 includes
Process 2-1 of coating the insulating layer with a pre-wet liquid,
Process 2-2 of forming a coated film by applying a composition for forming a resist film onto the insulating layer coated with the pre-wet liquid,
Process 2-3 of forming the patterned resist film by exposing the coated film in a pattern shape and performing a developing treatment with a developer, and
Process 2-4 of washing the patterned resist film by using a rinse liquid after Process 2-3, and
the chemical liquid is used as the rinse liquid.

23. A manufacturing method of a semiconductor chip, the method comprising:
Process 1 of forming an insulating layer on a base material;
Process 2 of forming a patterned resist film on the insulating layer;
Process 3 of forming the insulating layer having an opening portion by etching the insulating layer with the patterned resist film as a mask;
Process 4 of removing the patterned resist film;
Process 5 of filling the opening portion of the insulating layer with metal; and
Process 6 of performing chemical-mechanical polishing on the insulating layer filled with metal,
wherein, in at least one process of Process 1 to Process 6, a chemical liquid which includes an organic solvent and metal impurities including at least one metal atom selected from the group consisting of a Fe atom, a Cr atom, a Ni atom, and a Pb atom, and in which the total content of the metal atom is 0.001 to 100 mass ppt is used, and
the content of the Pb atom in the chemical liquid is 0.001 to 50 mass ppt.

* * * * *